United States Patent
Yeh

(10) Patent No.: US 10,718,979 B2
(45) Date of Patent: Jul. 21, 2020

(54) IN-CELL TOUCH DISPLAY PANEL

(71) Applicants: HannStar Display (Nanjing) Corporation, Nanjing (CN); HannStar Display Corporation, Taipei (TW)

(72) Inventor: Cheng-Yen Yeh, Taichung (TW)

(73) Assignees: HannStar Display (Nanjing) Corporation, Nanjing (CN); HannStar Display Corporation, Taipei (TW)

( * ) Notice: Subject to any disclaimer, the term of this patent is extended or adjusted under 35 U.S.C. 154(b) by 0 days.

(21) Appl. No.: 16/593,978

(22) Filed: Oct. 5, 2019

(65) Prior Publication Data
US 2020/0033651 A1 Jan. 30, 2020

Related U.S. Application Data

(62) Division of application No. 15/808,867, filed on Nov. 9, 2017, now Pat. No. 10,495,928.

(30) Foreign Application Priority Data

Dec. 29, 2016 (CN) .......................... 2016 1 1243632

(51) Int. Cl.
G02F 1/1333 (2006.01)
G02F 1/1339 (2006.01)
G02F 1/1337 (2006.01)
H01L 27/12 (2006.01)
G02F 1/1343 (2006.01)
G02F 1/1362 (2006.01)
G06F 3/041 (2006.01)
G06F 3/044 (2006.01)

(52) U.S. Cl.
CPC .......... *G02F 1/1339* (2013.01); *G02F 1/1337* (2013.01); *G02F 1/13394* (2013.01); *H01L 27/124* (2013.01); *G02F 1/13338* (2013.01); *G02F 1/134309* (2013.01); *G02F 1/136286* (2013.01); *G02F 2001/13396* (2013.01); *G02F 2201/121* (2013.01); *G06F 3/044* (2013.01); *G06F 3/0412* (2013.01)

(58) Field of Classification Search
CPC .................................................. G02F 1/13338
See application file for complete search history.

(56) References Cited

U.S. PATENT DOCUMENTS

| 2012/0140158 | A1 | 6/2012 | Nakahara et al. |
| 2012/0249444 | A1 | 10/2012 | Lee et al. |
| 2017/0017328 | A1 | 1/2017 | Tsai et al. |
| 2017/0192573 | A1* | 7/2017 | Kim ...................... G06F 3/0416 |
| 2018/0059855 | A1* | 3/2018 | Gwon .................. H01L 27/323 |
| 2018/0260058 | A1 | 9/2018 | Zhan et al. |

* cited by examiner

Primary Examiner — Edmond C Lau
(74) Attorney, Agent, or Firm — CKC & Partners Co., LLC

(57) ABSTRACT

The in-cell touch display panel has a display area and a non-display area. Display IC bounding pads and touch pads are disposed in the non-display area. A touch electrode corresponds to more than one pixel structures. A touch sensing line is electrically connected to the touch electrode and one of the touch pads. A data line is electrically connected to a thin film transistor and one of the display pads. At least one of the display pads is disposed between two of the touch pads, and at least one of the touch pads is disposed between two of the display pads.

6 Claims, 45 Drawing Sheets

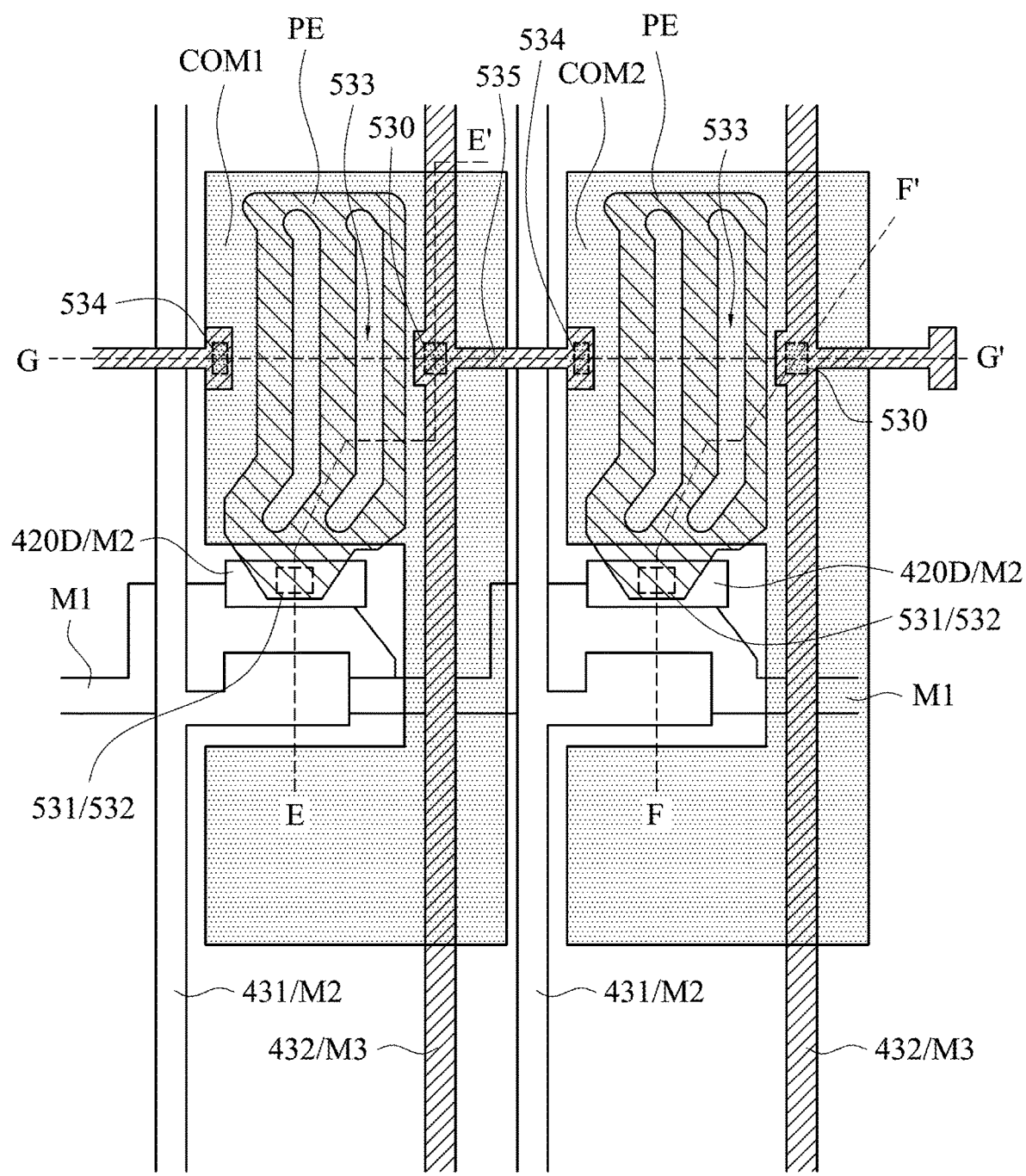
FIG. 5B_1

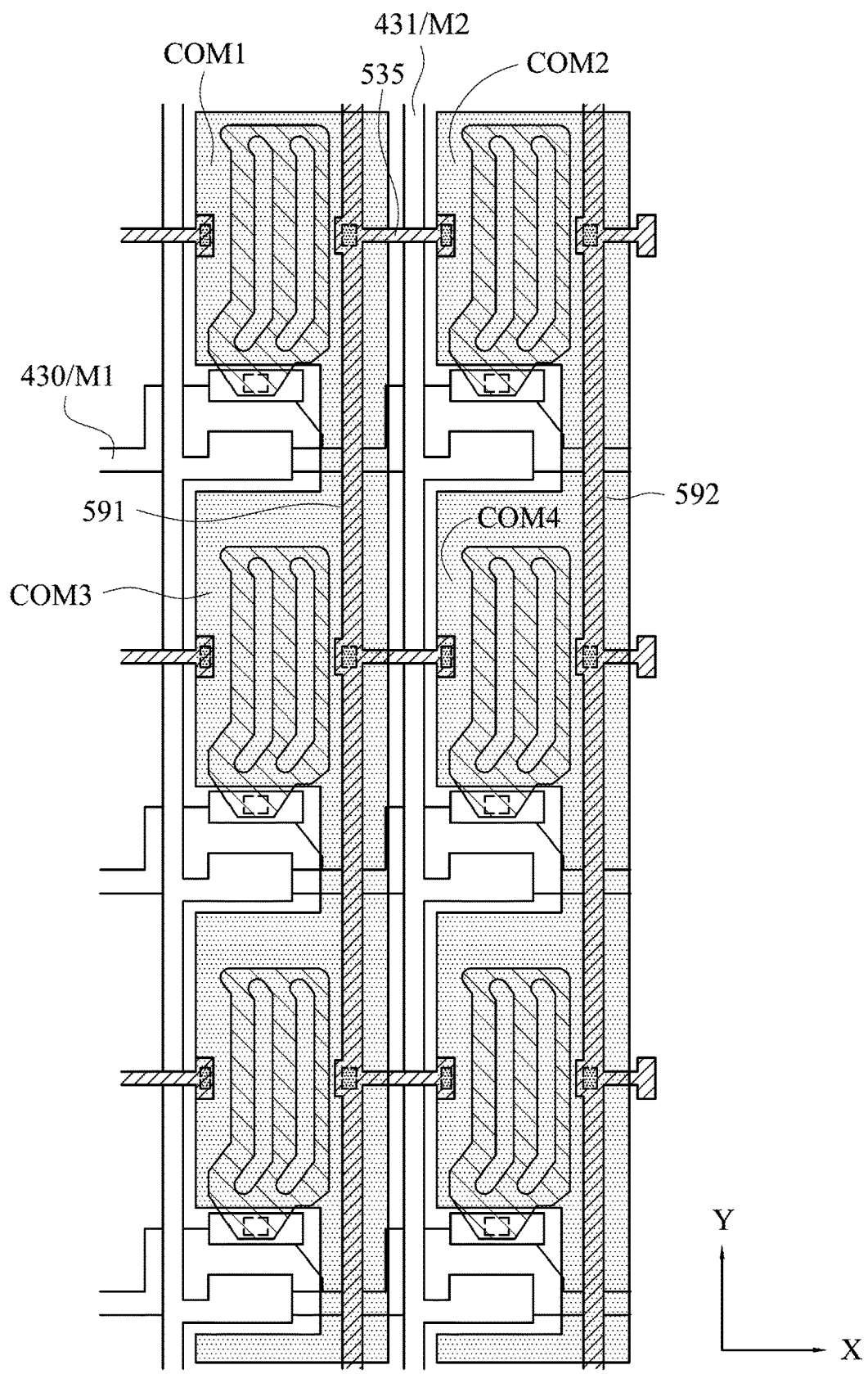
FIG. 5B_2

IN-CELL TOUCH DISPLAY PANEL

RELATED APPLICATIONS

The present application is a Divisional Application of the U.S. application Ser. No. 15/808,867, filed Nov. 9, 2017, which claims priority to China Application Serial Number 201611243632.6 filed Dec. 29, 2016, all of which are herein incorporated by reference.

BACKGROUND

Field of Invention

The present invention relates to a touch display panel. More particularly, the present invention relates to an in-cell touch display panel with a Touch with Display Driver Integrated (TDDI) single chip.

Description of Related Art

The TDDI single chip is configured to connect all of data lines and touch sensing lines which are connected to touch electrodes, thereby enabling the single chip to control both functions of touch and display. However, the data lines and the touch sensing lines would concentrate toward the chip area in a non-display area, and thus are overlapped with each other. The signals transmitted on the data lines and the touch sensing lines may be interfered by each other, and therefore the functions of display and touch are both affected. It is an issue in the art that how to address the problems of overlapped trace routes and the interference between the data lines and the touch sensing lines in the non-display area.

SUMMARY

A perspective of the invention is to provide an in-cell touch display panel, in which traces of conductive lines in the non-display area would not overlap with each other, and thus to reduce the difficulty for disposing touch sensing lines and data lines in the non-display area.

Embodiments of the invention provide an in-cell touch display panel having a display area and a non-display area, and the in-cell touch display panel includes following units. Multiple data lines are disposed on a first substrate along a first direction. Multiple gate lines are disposed along a second direction. An angle is formed between the first direction and the second direction. Multiple touch sensing lines are disposed on the first substrate and are electrically insulated from the data lines and the gate lines. Multiple pixel regions are formed in the display area, and each of the pixel regions is surrounded by one of the gate lines and one of the data lines intersecting with each other. Each of the pixel regions includes a pixel structure, and each of the pixel structures includes a pixel electrode. A common electrode is formed in the display area and includes multiple touch electrodes. Each of the touch electrodes corresponds to more than one of the pixel electrodes, and each of the pixel electrodes corresponds to a sub-common electrode which is a part of the touch electrode. Multiple thin film transistors (TFTs) are formed in the pixel structure, in which each of the thin film transistors includes a gate, a source, a drain and a semiconductor layer. A liquid crystal layer is formed between the first substrate and the second substrate. Multiple display pads and multiple touch sensing pads are disposed in the non-display area. Each of the touch electrodes is electrically connected to at least one of the touch sensing lines, and each of the touch sensing lines is electrically connected to one of the touch pads. Each of the sources is electrically connected to one of the data lines, and each of the data lines is electrically connected to one of the display pads. At least one of the display pads is disposed between two of the touch pads, and at least one of the touch pads is disposed between two of the display pads.

In some embodiments, the data lines are parallel to the touch sensing lines in the display area, and the data lines are not overlapped with the touch sensing lines in the non-display area.

In some embodiments, the data lines are partially overlapped with the touch sensing lines along a normal vector of the first substrate in the display area. The data lines and the touch sensing lines are formed in different metal layers in the display area.

In some embodiments, the data lines are parallel to the touch sensing lines in the display area. The data lines and the touch sensing lines are formed in the same metal layer in the display area.

In some embodiments, at least two of the touch sensing lines are electrically connected with each other and electrically connected to one of the touch pads through a conductive line.

In some embodiments, the number of the touch pads is less than the number of the display pads, the display pads and the touch pads are arranged as multiple rows, and one of the rows includes at least part of the touch pads.

In some embodiments, the display pads are disposed between the touch pads and the display area.

In some embodiments, the touch pads are disposed between the display pads and the display area.

In some embodiments, the number of the touch pads is less than the number of the display pads, and the display pads and the touch pads are arranged as multiple rows. A first row of these rows only includes a portion of the display pads, and a second row of these rows includes a portion of the display pads and a portion of the touch pads.

In some embodiments, the first row is disposed between the display area and the second row.

In some embodiments, the second row is disposed between the display area and the first row.

In some embodiments, the in-cell touch display panel further includes a driving circuit disposed in the non-display area and electrically connected to the display pads and the touch pads. In a display period, the driving circuit transmits pixel data to the pixel electrodes through the data lines and the TFTs. In a touch period, the driving circuit generates a touch sensing signal according to a voltage variation from one of the touch electrodes.

In some embodiments, the in-cell touch display panel further includes: a first metal layer formed on the first substrate, in which the first metal layer includes the gates; a first insulation layer formed on the first metal layer; the semiconductor layer formed on the first insulation layer; a second metal layer formed on the semiconductor layer, in which the second metal layer includes the sources and the drains; a first transparent conductive layer formed on the first insulation layer, in which the first transparent conductive layer includes the pixel electrodes; a second insulation layer formed on the second metal layer and on the first transparent conductive layer; a third metal layer formed on the second insulation layer, in which the touch sensing lines are formed in the third metal layer in the display area; a third insulation layer formed on the third metal layer and having a contact hole to expose one of the touch sensing lines; and a second transparent conductive layer formed on the third insulation layer, in which the second transparent conductive layer includes the sub-common electrodes. In the display area, one of the sub-common electrodes is electrically connected to one of the touch sensing lines through the contact hole.

In some embodiments, the in-cell touch display panel further includes: a first metal layer formed on the first substrate, in which the first metal layer includes the gates; a first insulation layer formed on the first metal layer; the semiconductor layer formed on the first insulation layer; a second metal layer formed on the semiconductor layer, in which the second metal layer includes the sources and the drains; a first transparent conductive layer formed on the first insulation layer, in which the first transparent conductive layer includes the sub-common electrodes; a second insulation layer formed on the second metal layer and the first transparent conductive layer, and a contact hole is formed in the first transparent conductive layer; a third metal layer formed on the second insulation layer, in which the touch sensing lines are formed in the third metal layer in the display area, and one of the sub-common electrodes is electrically connected to one of the touch sensing lines through the contact hole; a third insulation layer formed on the second insulation layer and the third metal layer; and a second transparent conductive layer formed on the third insulation layer, in which the second transparent conductive layer includes the pixel electrodes.

In some embodiments, the in-cell touch display panel further includes: a first metal layer formed on the first substrate, in which the first metal layer includes the gates; a first insulation layer formed on the first metal layer; the semiconductor layer formed on the first insulation layer; a second metal layer formed on the semiconductor layer, in which the second metal layer includes the sources and the drains; a second insulation layer formed on the second metal layer, in which the second insulation layer has a first contact hole; a first transparent conductive layer formed on the second insulation layer, in which the first transparent conductive layer includes the sub-common electrodes; a third insulation layer formed on the first transparent conductive layer, and having a second contact hole and a third contact hole, in which the second contact hole is corresponding to the first contact hole; a third metal layer formed on the third insulation layer, in which the touch sensing lines are formed in the third metal layer in the display area, and one of the touch sensing lines is electrically connected to one of the sub-common electrodes through the third contact hole; and a second transparent conductive layer formed on the third insulation layer, in which the second transparent conductive layer includes the pixel electrodes, and one of the pixel electrodes is electrically connected to one of the drains through the second contact hole and the first contact hole. The second transparent conductive layer covers the touch sensing lines, and projections of one of the touch sensing lines and one of the data lines onto the first substrate at least partially overlap with each other.

In some embodiments, each of the pixel structures in the display area further includes: a first metal layer formed on the first substrate, in which the first metal layer includes the gates; a first insulation layer formed on the first metal layer; the semiconductor layer formed on the first insulation layer, in which the semiconductor layer is a metal oxide including Indium, gallium and zinc; a second insulation layer formed on the semiconductor layer, in which the second insulation layer has a first contact hole and a second contact hole; a first transparent conductive layer formed on the second insulation layer, in which the first transparent conductive layer includes one of the pixel electrodes; a second metal layer formed on the second insulation layer to form one of the sources, one of the drains and one of the touch sensing lines, in which the one of sources and the one of the drains are electrically connected to the semiconductor layer through the first contact hole and the second contact hole respectively, in which the one of the drains is electrically to the one of pixel electrodes; a third insulation layer formed on the second metal layer and having a third contact hole; and a second transparent conductive layer formed on the third insulation layer, in which the second transparent conductive layer includes one of the touch electrodes, and the one of the touch sensing lines is electrically connected to the one of touch electrodes through the third contact hole.

In some embodiments, each of the pixel structures in the display area further includes: the semiconductor layer formed on the first substrate, in which the semiconductor layer includes one of the sources, a first lightly doped region, a channel region of one of the TFTs, a second lightly doped region and one of the drains, in which the channel region is formed between the first lightly doped region and the second lightly doped region; a first insulation layer formed on the semiconductor layer, in which the first insulation layer has a first contact hole to expose the one of the sources, and a second contact hole to expose the one of the drains; a first metal layer formed on the first insulation layer, in which the first metal layer includes one of the gates; a second insulation layer formed on the first metal layer, in which the second insulation layer has a third contact hole corresponding to the first contact hole, and a fourth contact hole corresponding to the second contact hole; a first transparent conductive layer formed on the second insulation layer, in which the first transparent conductive layer includes one of the pixel electrodes; a second metal layer formed on the second insulation layer, in which the data lines and the touch sensing lines are formed in the second metal layer in the display area, one of the data lines is electrically connected to the one of the sources through the third contact hole and the first contact hole, in which the second metal layer includes a filling structure electrically connected to the one of pixel electrodes, and is electrically connected to the one of the drains through the fourth contact hole and the second contact hole; a third insulation layer formed on the second metal layer, in which the third insulation layer has a fifth contact hole to expose one of the touch sensing lines; and a second transparent conductive layer formed on the third insulation layer, in which the second transparent conductive layer includes the sub-common electrodes, and the second transparent conductive layer is electrically connected to the one of the touch sensing lines through the fifth contact hole.

In some embodiments, the in-cell touch display panel further includes: a first metal layer formed on the first substrate, in which the first metal layer includes the gates; a first insulation layer formed on the first metal layer; the semiconductor layer formed on the first insulation layer; a first transparent conductive layer formed on the first insulation layer, in which the first transparent conductive layer includes the pixel electrodes; a second metal layer formed on the semiconductor layer, in which the second metal layer includes the sources and the drains, the touch sensing lines and the data lines are formed in the second metal layer in the display area, and one the touch sensing lines is disposed between two of the data lines; a second insulation layer formed on the second metal layer and on the first transparent conductive layer, in which the second insulation layer includes a first contact hole to expose one of the touch sensing lines; a third insulation layer formed on the second insulation layer, and having a second contact hole corresponding to the first contact hole; and a second transparent conductive layer formed on the third insulation layer and is electrically connected to the one of the touch sensing lines through the second contact hole and the first contact hole, in which the second transparent conductive layer includes the sub-common electrodes.

In some embodiments, the non-display area includes a signal line transfer area and a fan-out area. The signal line transfer area is located between the display area and the fan-out area. The touch pads and the display pads are disposed in the fan-out area. One of the touch sensing lines includes a first part and a second part, the first part is formed in a first metal layer, and the second part is formed in a third metal layer. The in-cell touch display panel further includes a connection structure disposed in the signal line transfer area and coupled to the first part and the second part. The connection structure includes: the first part; the second part; multiple insulation layers, having multiple openings to expose the first part and the second part; and a transparent conductive layer, electrically connected to the first part and the second part through the openings.

In some embodiments, the first part is formed in a first metal layer, and the second part is formed in a second metal layer. The in-cell touch display panel further includes a connection structure disposed in the signal line transfer area and coupled to the first part and the second part. The connection structure includes: the first part; the second part; multiple insulation layers, having multiple openings to expose the first part and the second part; and a transparent conductive layer electrically connected to the first part and the second part through the openings.

Compared with prior art, the invention has advantages of: the touch sensing lines and the data lines in the non-display area would not overlap with each other, and thus the difficulty for disposing the touch sensing lines and the data lines in the non-display area is decreased.

BRIEF DESCRIPTION OF THE DRAWINGS

The invention can be more fully understood by reading the following detailed description of the embodiment, with reference made to the accompanying drawings as follows.

FIG. 5B_1 is a top view of pixel structure in accordance with another embodiment.

FIG. 5B_2 is a top view of multiple pixel structures in accordance with another embodiment.

DETAILED DESCRIPTION

The using of "first", "second", "third", etc. in the specification should be understood for identifying units or data described by the same terminology, but are not referred to particular order or sequence. In addition, the term "couple" used in the specification should be understood for electrically connecting two units directly or indirectly. In other words, when "a first object is coupled to a second object" is written in the specification, it means another object may be disposed between the first object and the second object.

Figure 1:
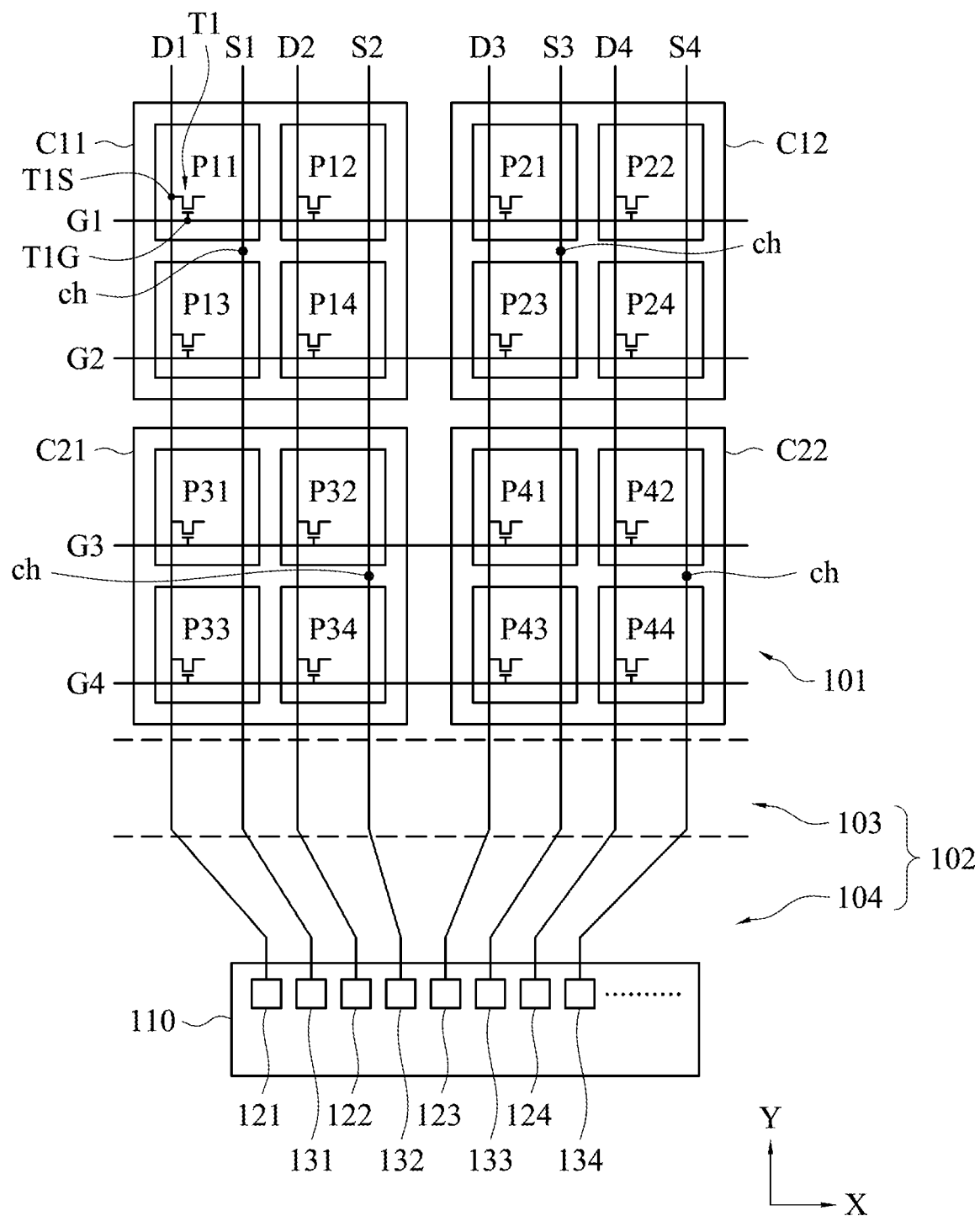
FIG. 1 is a schematic diagram illustrating connection of data lines and touch sensing lines in the in-cell touch display panel in accordance of an embodiment.

FIG. 1 is a schematic diagram illustrating connections of data lines and touch sensing lines in an in-cell touch display panel in accordance with an embodiment. Referring to FIG. 1, in an in-cell touch display panel 100, electrodes for detecting touch are disposed in pixel structures on a thin film transistor (TFT) substrate.

The in-cell touch display panel 100 has a display area 101 and a non-display area 102. The non-display area 102 includes a signal line transfer area 103 and a fan-out area 104. The display area 101 is described first. The display area 101 includes: pixel structures P11-P14, P21-P24, P31-P34 and P41-P44 (the regions where gate lines and data lines intersect and surround); gate lines G1-G4 extending along an X direction (also referred to a first direction); data lines D1-D4 extending along a Y direction (also referred to a second direction), and touch sensing lines S1-S4 extending along the Y direction. A common electrode is formed in the display area and patterned to form multiple touch electrodes. Each touch electrode corresponds to more than one pixel structure, and each pixel structure includes a pixel electrode corresponding to a sub-common electrode. Each pixel structure includes a thin film transistor (TFT). Each of the data lines D1-D4 is electrically connected to the source of the TFT in the corresponding pixel structure, and each of the gate lines G1-G4 is electrically connected to the gate of the TFT in the corresponding pixel structure. For example, the pixel structure P11 includes a TFT T1 which has a gate T1G and a source T1S. The gate line G1 is electrically connected to the gate T1G, and the data line D1 is electrically connected to the source T1S. In addition, each touch electrode is electrically connected to one touch sensing line through a contact hole ch. For example, the pixel structures P11-P14 share a touch electrode C11 which is electrically connected to the touch sensing line S1; the pixel structures P21-P24 share a touch electrode C12 which is electrically connected to the touch sensing line S3; the pixel structures P31-P34 share a touch electrode C21 which is electrically connected to the touch sensing line S2; and the pixel structures P44-P44 share a touch electrode C22 which is electrically connected to the touch sensing line S4.

A period of a frame is at least divided into one or more display periods and one or more touch periods. During the display period, a common voltage is applied to the touch electrodes C11, C12, C21, and C22, and the voltage on the gate lines G1-G4 are configured to turn on the TFTs in the corresponding pixel structures sequentially, and the driving circuit 110 transmits pixel data to the pixel electrodes in the corresponding pixel structures through the data lines D1-D4 in order to set grey levels of pixels. During the touch period, the touch electrodes C11, C12, C21, and C22 are taken for detecting touch operations performed on the in-cell touch display panel 100, and the driving circuit 110 generates a touch sensing signal according to the voltage variation on the touch electrodes C11, C12, C21, and C22. In other words, the spatial resolution of the touch function depends on the number of the touch electrodes, the spatial resolution of the display function depends on the number of the pixels, and thus the resolution of the touch function is less than the resolution of the display function.

The signal line transfer area 103 is located between the display area 101 and the fan-out area 104. In the signal line transfer area 103, the data lines D1-D4 and the touch sensing lines S1-S4 may be transferred to other metal layers. For example, the touch sensing lines S1-S4 are in a third or second metal in the display area 101, but are transferred to a first metal layer in the fan-out area 104. Multiple connection structures are disposed in the signal line transfer area 103 for transferring the touch sensing lines S1-S4 from the third or second metal layer to the first metal layer. The embodiment of the connection structure would be described in detail below. In addition, a protection circuit and a transparent or opaque conductive layer may be disposed in the signal line transfer area 103 to prevent the in-cell touch display panel 100 from be damaged by static discharge. In some embodiments, the width of the signal line transfer area 103 is essentially equal to width of half pixel to one pixel, which is not limited in the invention.

A driving circuit 110 is disposed in the fan-out area 104 on the in-cell touch display panel 100. The driving circuit 110 may be disposed on a flexible circuit board such as tape carrier package (TCP) or chip on film (COF), or the driving circuit 110 may be disposed on the TFT substrate. The driving circuit 110 is electrically connected to display pads 121-124 and touch pads 131-134 which are disposed on the in-cell touch display panel 100. The display pads 121-124 are electrically connected to the data lines D1-D4 respectively, and the touch pads 131-134 are electrically connected to the touch sensing lines S1-S4 respectively. In particular, along the X direction, one of the display pads is disposed between two of the touch pads, and one of the touch pads is disposed between two of the display pads. For example, the display pad 122 is disposed between the touch pad 131 and the touch pad 132, and the touch pad 131 is disposed between the display pad 121 and the display pad 122. In the embodiment of FIG. 1, the display pads 121-124 and the touch pads 131-134 are disposed in an interleaved way. In prior art (not shown), the display pads and the touch pads are arranged in a same row, and the display pads are continuously disposed, and then the touch pads are continuously disposed next to the display pad. Thus, the data lines D1-D4 would be overlapped with the touch sensing lines S1-S4 in the non-display area 102. However, as shown in FIG. 1, the data lines D1-D4 are parallel with the touch sensing lines S1-S4 in the display area 101, and they do not overlap with each other in the non-display area 102 because the display pads 121-124 and the touch pads 131-134 are disposed in the interleaved way.

Figure 2:
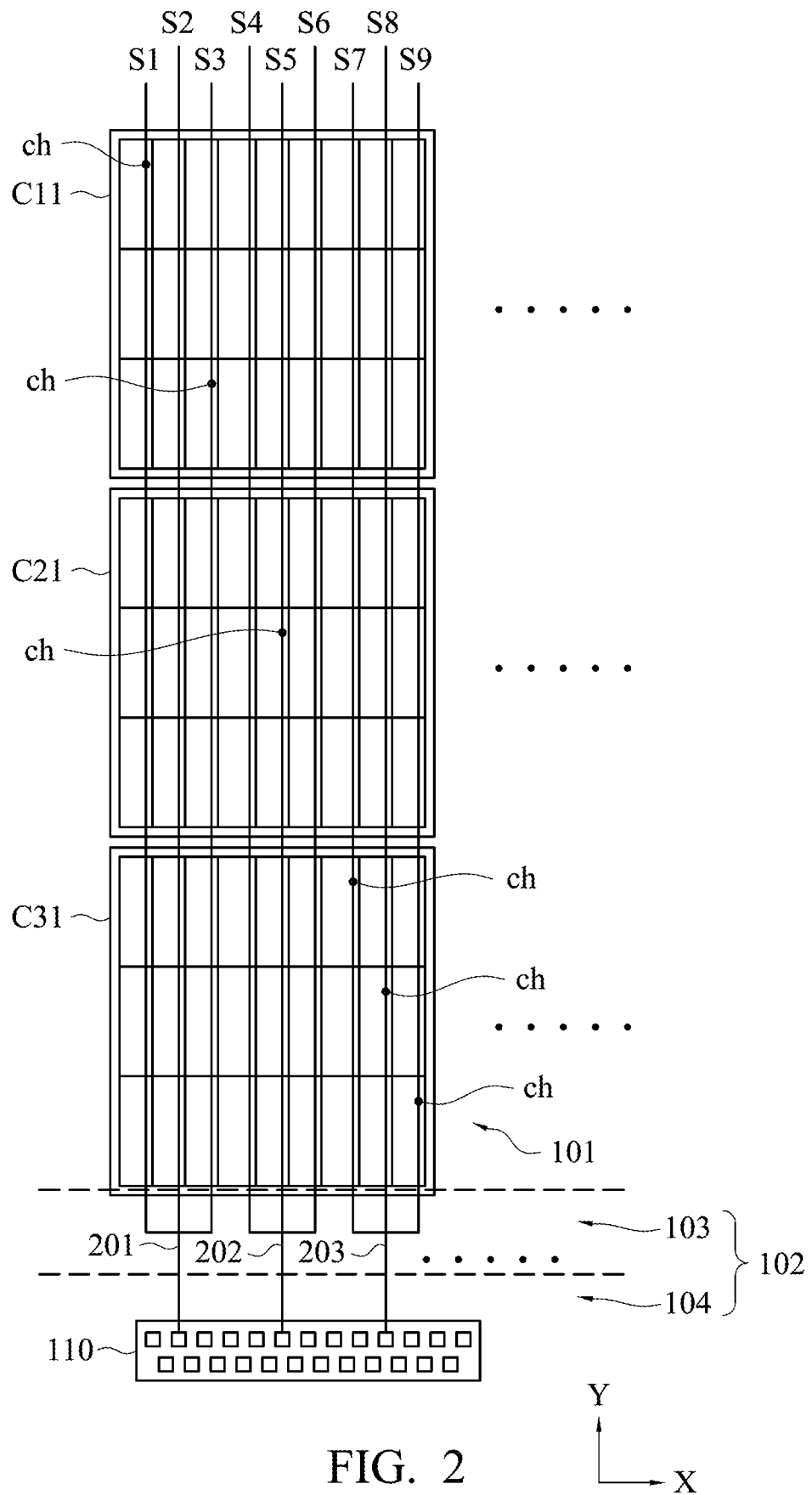
FIG. 2 is a schematic diagram illustrating connection between the touch sensing lines and a driving circuit in accordance with an embodiment.

Every four pixel structures share one touch electrode In FIG. 1, but more or less pixel structures may share one common electrode in other embodiments. In addition, the number of the data lines D1-D4 is equal to the number of the touch sensing lines S1-S4 in FIG. 1, but in practice, every pixel structure (also referred to sub-pixel) generally renders a single color, and a pixel is composed of three sub-pixels which are generally arranged along the X direction. Therefore, the resolution of the pixel structures along the X direction is greater than the resolution of that along the Y direction. In some embodiments, at least two of the touch sensing lines are connected to each other and then is electrically connected to one touch pad though a conductive line. For example, referring to FIG. 2, FIG. 2 is a schematic diagram illustrating connection between the touch sensing lines and the driving circuit in accordance with an embodiment. For simplification, conductive lines such as the data lines and the gate lines are not shown in FIG. 2. In the embodiment of FIG. 2, each of the touch electrodes C11, C21, and C31 includes 27 pixel structures arranged as 3 rows and 9 columns. At least one of the touch sensing lines S1-S3 is electrically connected to the touch electrode C11 through a contact hole ch, and the touch sensing lines S1-S3 are connected to each other in the signal line transfer area 103, and then is electrically connected to one touch pad through a conductive line 201. At least one of the touch sensing lines S4-S6 is electrically connected to the touch electrode C21 through the contact hole ch, and the touch sensing lines S4-S6 are connected to each other in the signal line transfer area 103, and then they are electrically connected to one touch pad through a conductive line 202. At least one of the touch sensing lines S7-S9 is electrically connected to the touch electrode C31 through the contact hole ch, and the touch sensing lines S7-S9 are connected to each other in the signal line transfer area 103, and then they are electrically connected to one touch pad through a conductive line 203. In the embodiment of FIG. 2, two of the touch sensing lines S1-S3 are electrically connected to the touch electrode C11 through two contact holes ch, one of the touch sensing lines S4-S6 is electrically connected to the touch electrode C21 through one contact hole ch, and three of the touch sensing lines S7-S9 are electrically connected to the touch electrode C31 through three contact holes ch. The number of touch sensing lines that each touch electrode is electrically connected to is not limited in the invention. For example, if there are five touch sensing lines passing through one touch electrode, then the touch electrode may be electrically connected to any number (ex. 1~5) of the five touch sensing lines.

In another embodiment, three touch sensing lines corresponding to the same touch electrode may be electrically connected to pixel strictures in different rows. For example, the touch sensing line S1 may be electrically connected to the pixel structure at the first row and the first column corresponding to the touch electrode C11; the touch sensing line S2 may be electrically connected to the pixel structure at the second row and the second column corresponding to the touch electrode C11; and the touch sensing line S3 may be electrically connected to the pixel structure at the third row and third column corresponding to the touch electrode C11. The touch sensing line S4 may be electrically connected to the pixel structure at the first row and the fourth column corresponding to the touch electrode C21; the touch sensing line S5 may be electrically connected to the pixel structure at the second row and the fifth column corresponding to the touch electrode C21; and the touch sensing line S6 may be electrically connected to the pixel structure at the third row and the sixth column corresponding to the touch electrode C21. The touch sensing line S7 may be electrically connected to the pixel structure at the first row and the seventh column corresponding to the touch electrode C31; the touch sensing line S8 may be electrically connected to the pixel structure at the second row and the eighth column corresponding to the touch electrode C31; and the touch sensing line S9 may be electrically connected to the pixel structure at the third row and the ninth column corresponding to the touch electrode C31.

In addition, each pixel structure has at least a data line, and each data line is connected to one display pad. In other words, the number of the display pads is more than the number of touch pads. In the embodiment of FIG. 2, one touch pad is disposed between every three display pads, and thus the touch sensing lines and the data lines are not overlapped with each other in the non-display area 102.

FIG. 3A to FIG. 3G is a schematic diagram illustrating disposition of display pads and touch pads in accordance with some embodiments. For simplification, the data lines and the touch sensing lines respectively connected to display pads DP and touch pads TP are not shown in FIG. 3A to FIG. 3G.

Figure 3A:
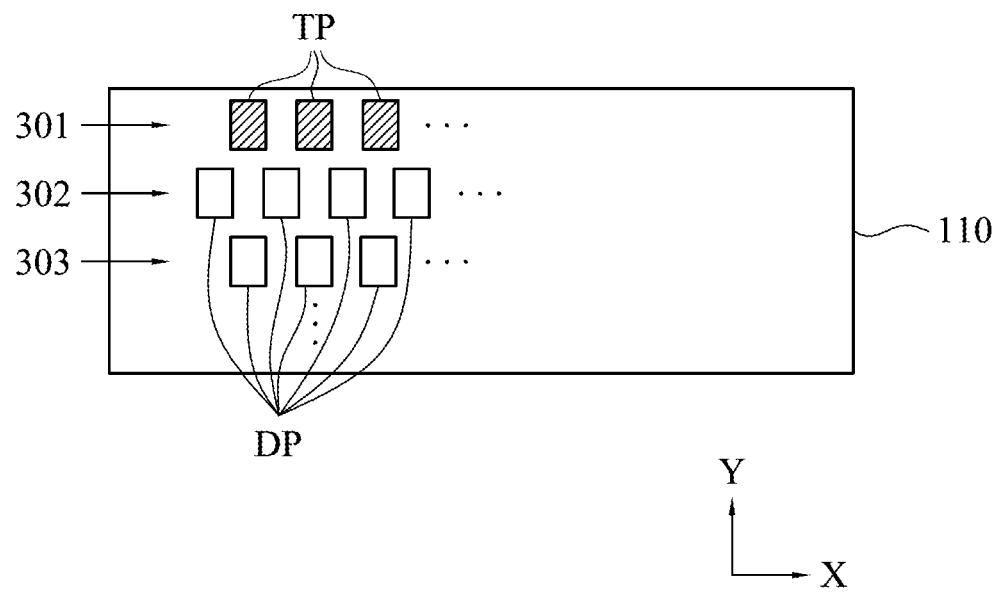
FIG. 3A to FIG. 3G is a schematic diagram illustrating disposition of display pads and touch pads in accordance with some embodiments.
Figure 3B:
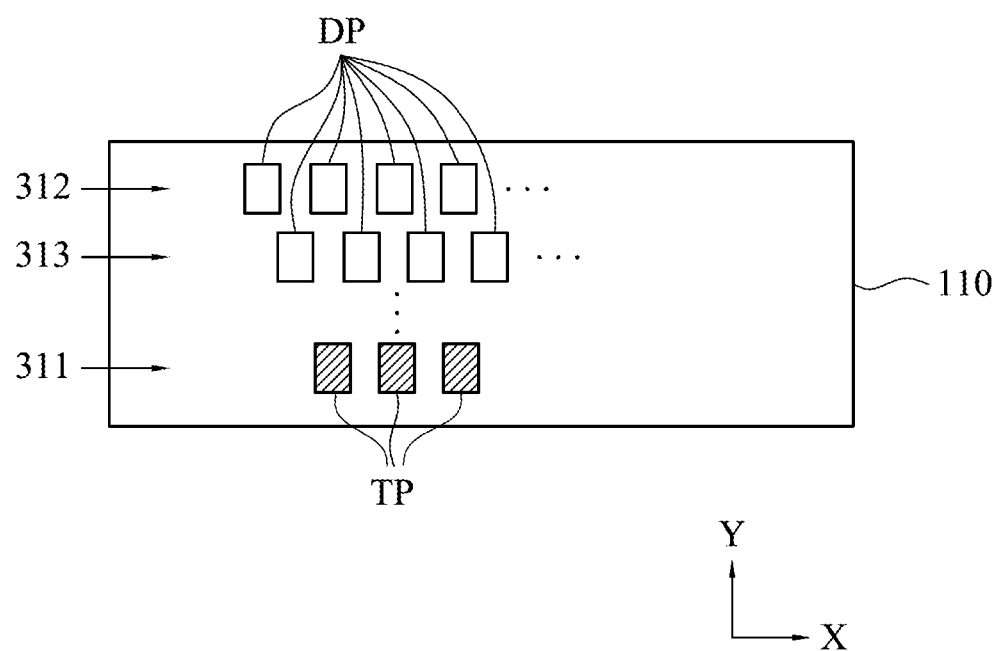

Referring to FIG. 3A, in some embodiments, the display pads and the touch pads are arranged, along the Y direction, as a first row 301, a second row 302, and a third row 303. The first row 301 only includes the touch pads TP, and the second row 302 and the third row 303 only include the display pads DP. In this embodiment, all touch pads are disposed in the first row 301, but all touch pads may be arranged as several rows in other embodiments. In addition, the touch pads TP are disposed on the top in FIG. 3A, that is, the touch pads TP are disposed between the display area and the display pads DP. FIG. 3B is similar to FIG. 3A, in which the display pads and the touch pads are arranged, along the Y direction, as a first row 311, a second row 312 and a third row 313. The second row 312 and the third row 313 only include the display pads DP, and the first row 311 only includes the touch pads TP. However, the touch pads TP are disposed on the bottom in FIG. 3B, that is, the display pads DP are disposed between the display area and the touch pads.

Figure 3C:
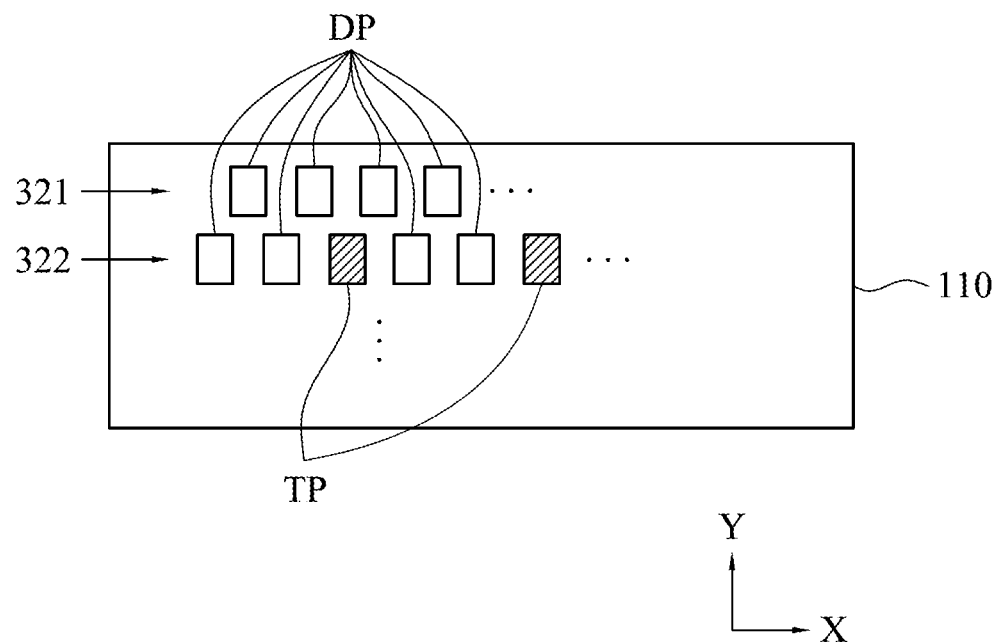
Figure 3D:
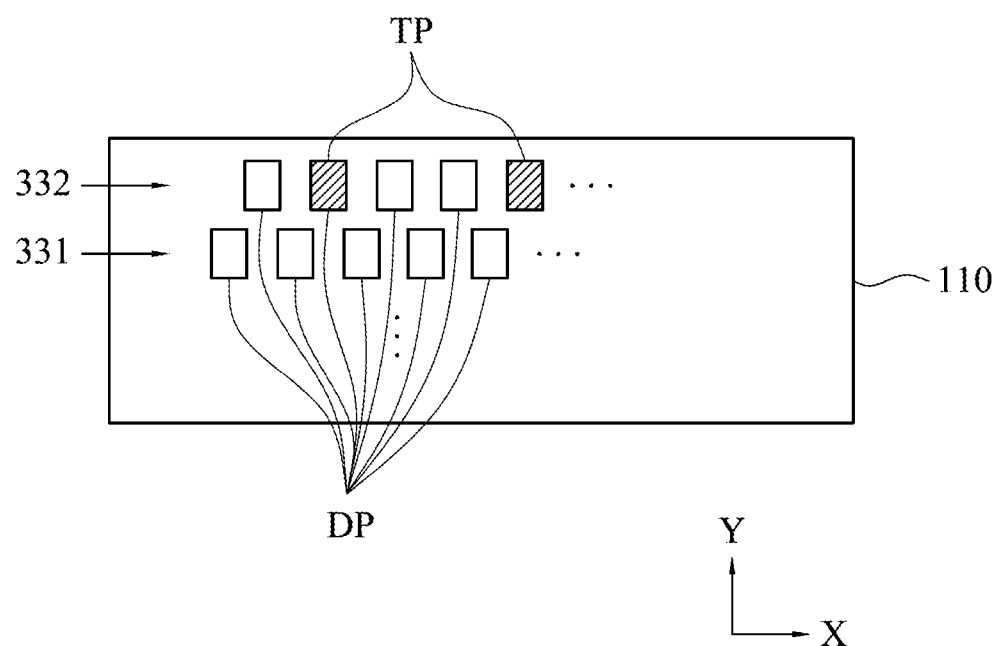

In FIG. 3C, the display pads and the touch pads are arranged, along the Y direction, as a first row 321 and a second row 322. The first row 321 only includes a portion of the display pads DP, and the second row 322 includes a portion of the display pad DP and the touch pads TP. The touch pads TP are inserted into the display pads DP of the second row 322 in FIG. 3C. The first row 321 is disposed on the top, that is, the first row 321 is disposed between the display area and the second row 322. FIG. 3D is similar to FIG. 3, but the difference between FIG. 3C and FIG. 3D is that the second row 332 having the touch pads TP and the display pads DP is disposed on the top, that is, the second row 332 is disposed between the display area and the first row 331. The touch pads TP are inserted into the display pads DP of the second row 332 as shown in FIG. 3D.

Figure 3E:
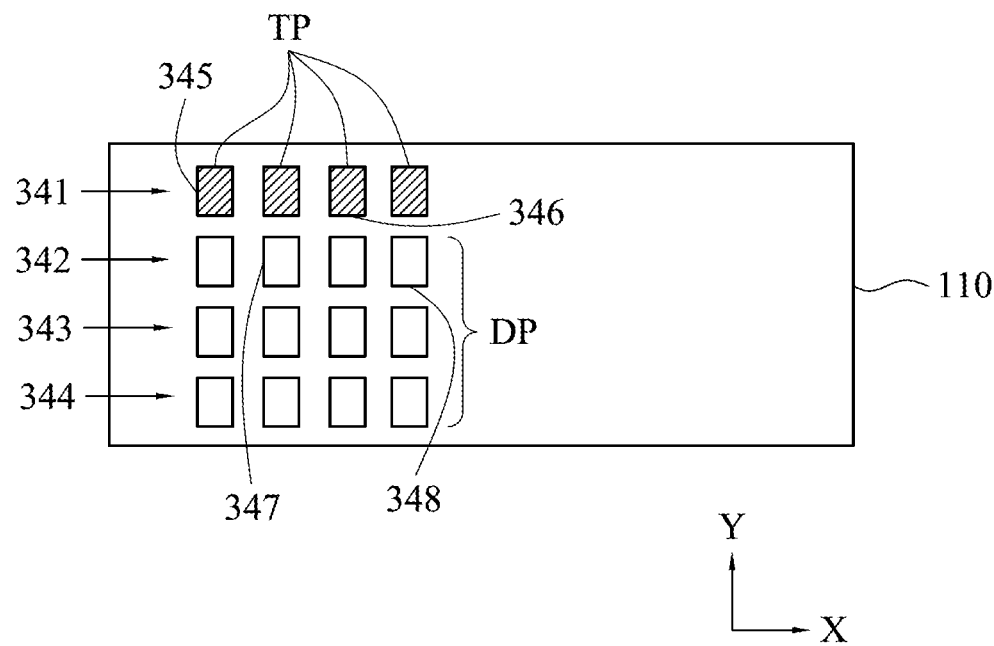

In FIG. 3E, the display pads and the touch pads are arranged, along Y direction, as a first row 341, a second row 342, a third row 343 and a fourth row 344. The first row 341 only includes touch pads TP; the second row 342, the third row 343 and the fourth row 344 only include display pads DP. Moreover, the touch pads TP are overlapped with the display pads DP along Y direction.

Figure 3F:
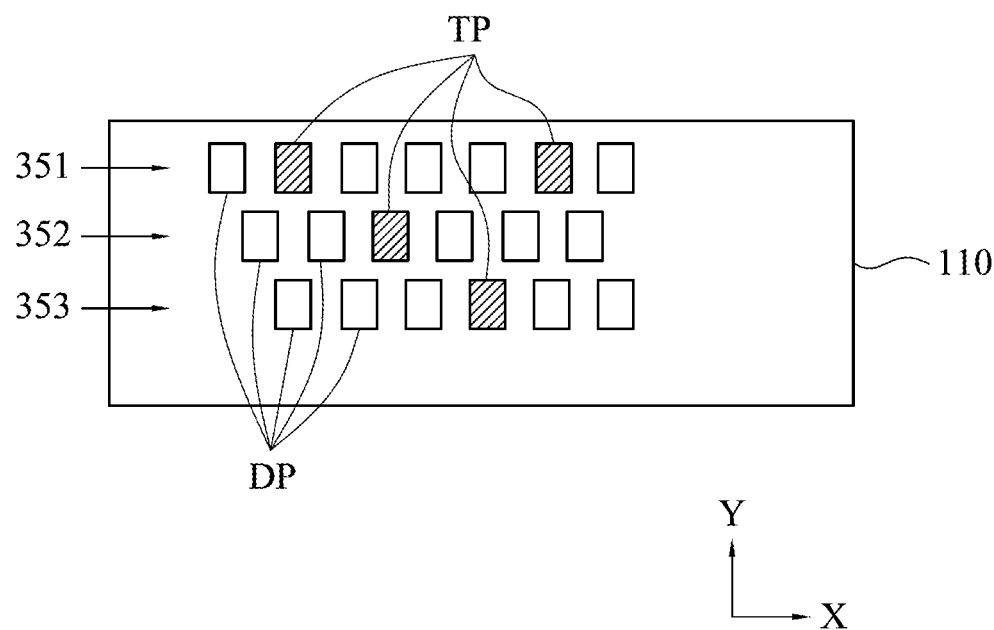

In FIG. 3F, the touch pads TP are evenly distributed in the first row 351, the second row 352 and the third row 353. In the same row, three display pads DP are disposed between two adjacent touch pads TP. In addition, the touch pads TP are overlapped with each other along Y direction.

Figure 3G:
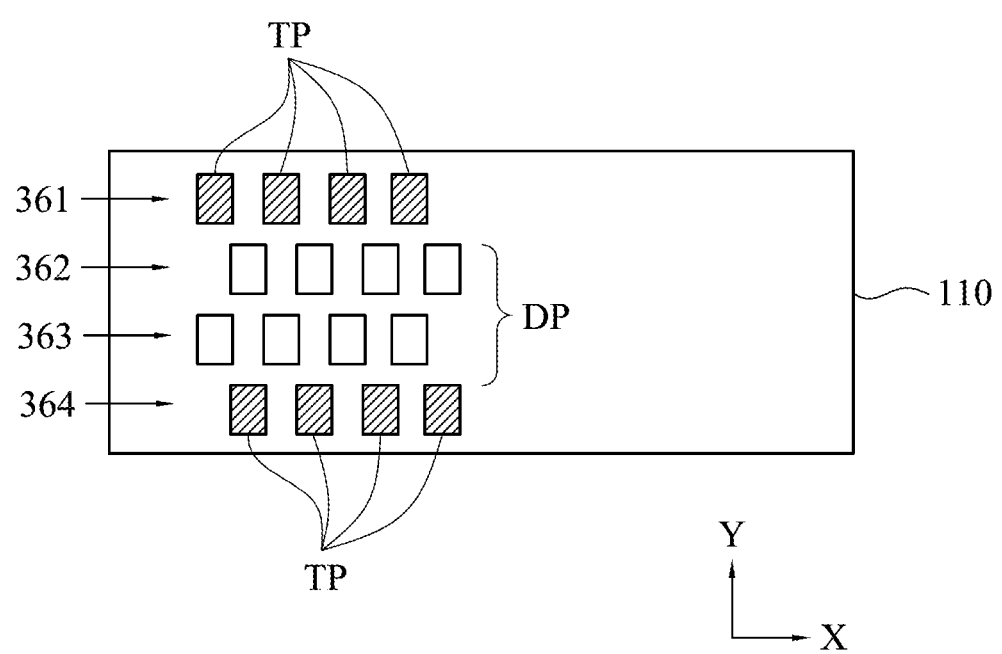

In FIG. 3G, a first row 361 only includes touch pads TP, a second row 362 and a third row 363 only include display pads DP, and a fourth row 364 only includes touch pads TP. Along Y direction, the touch pads TP in the first row 361 are overlapped with the touch pads TP in the fourth row 364, and the display pads DP in the second row 362 are overlapped with the display pads DP in the third row 363.

In the embodiments of FIG. 3A to FIG. 3G, the width of each touch pad TP along the X direction is equal to that of each display pad DP. However, in other embodiments, the width of each touch pad TP along the X direction may be wider than that of the display pad DP, which is not limited in the invention. Note that the description of "one display pad is disposed between two touch pads along X direction" may be interpreted as "the projection of one display pad onto X axis is disposed between the projections of two touch pads onto X axis", and thus it encompass the embodiments of FIG. 3A to FIG. 3G. For example, in FIG. 3E, the display pads 347 is disposed between the touch pads 345 and the touch pads 346 along X direction, and the touch pads 346 is disposed between the display pads 347 and the display pads 348. From another aspect, a projection of the display pads 347 onto X axis is located between two projections of the touch pads 345 and the touch pads 346 onto X axis. A projection of the touch pads 346 onto X axis is between two projections of the display pads 347 and the display pads 348 along X axis. The description may be applied to FIG. 3A to FIG. 3D, and FIG. 3F to FIG. 3G, and the description will not be repeated.

Figure 4A:
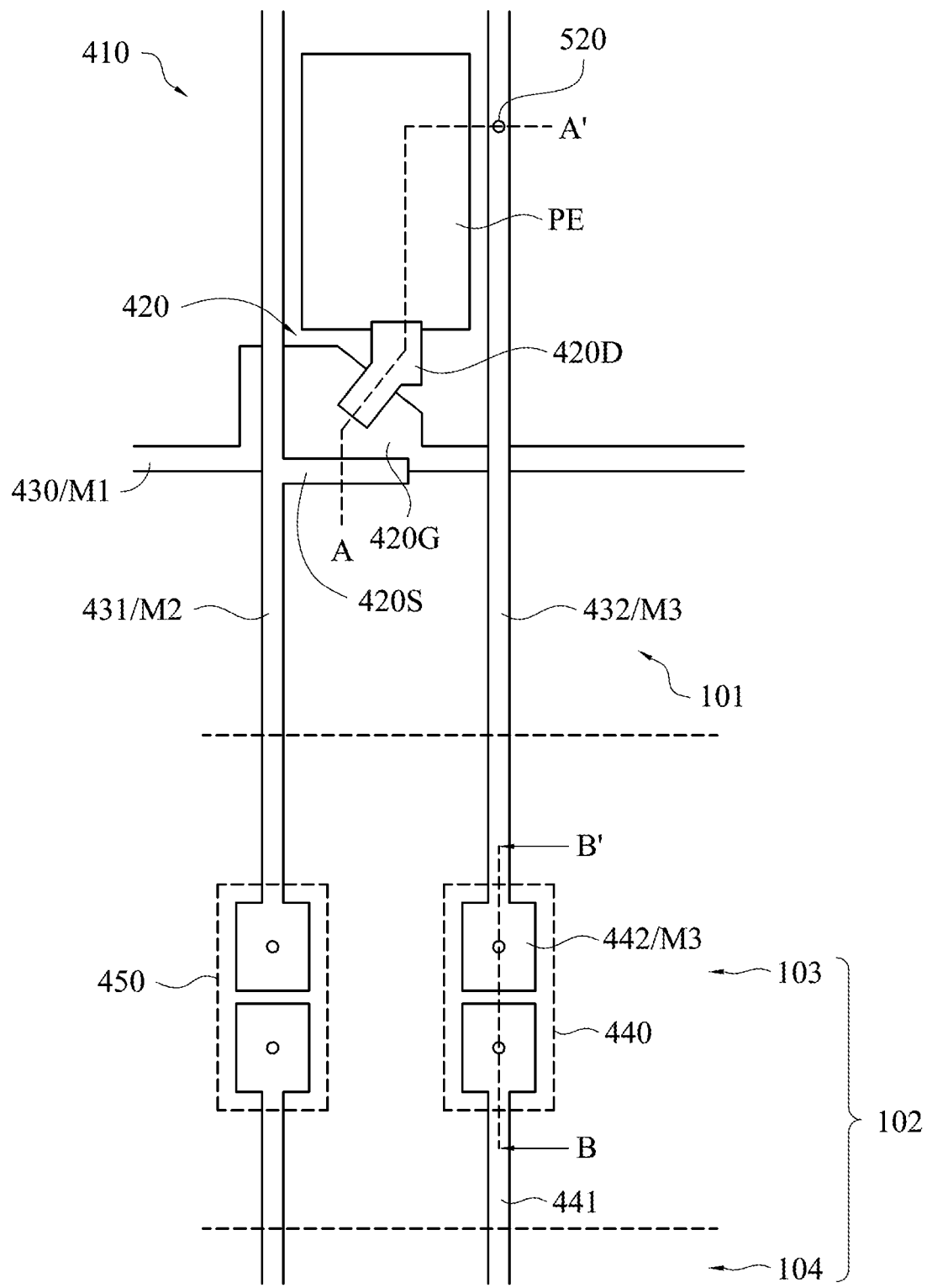
FIG. 4A is a top view of pixel structure in accordance with an embodiment.
Figure 5A:
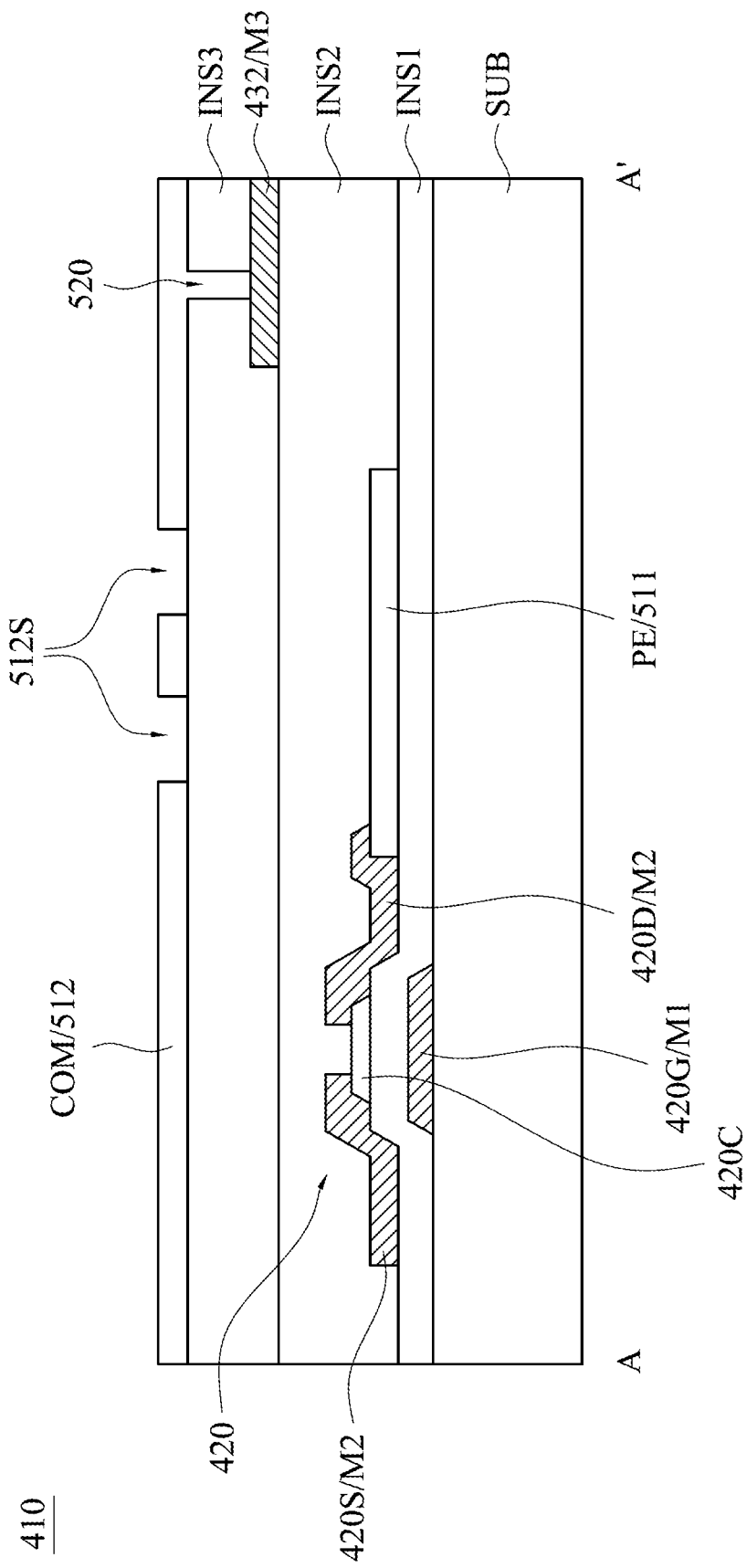
FIG. 5A is a cross-sectional view of pixel structure along a cross-sectional line AA' of FIG. 4A.

FIG. 4A is a top view of pixel structure in accordance with an embodiment. FIG. 5A is a cross-sectional view of pixel structure along a cross-sectional line AA' of FIG. 4A. Referring to FIG. 4A, a pixel structure 410 is taken as an example. The pixel structure 410 includes a TFT 420, a pixel electrode PE and a sub-common electrode COM (not shown in FIG. 4A). The TFT 420 includes a gate 420G, a source 420S and a drain 420D. A gate line 430 formed in a first metal layer M1 is connected to the gate 420G. A data line 431 formed in a second metal layer M2 is connected to the source 420S. A touch sensing line 432 formed in a third metal layer M3 is connected to the sub-common electrode COM. Referring to FIG. 4A and FIG. 5A, the first metal layer M1 is formed on a substrate SUB, and the first metal layer M1 includes the gate 420G. A first insulation layer INS1 (also referred to gate insulation layer) is formed on the first metal layer M1. A semiconductor layer 420C is formed on the first insulation layer INS1 as a channel of the TFT

420. A first transparent conductive layer 511 is formed on the first insulation layer INS1, and includes the pixel electrode PE. The second metal layer M2 is formed on the semiconductor layer 420C, and includes the source 420S and the drain 420D which is connected to the pixel electrode PE. A second insulation layer INS2 is formed on the second metal layer M2 and the first transparent conductive layer 511. A third metal layer M3 is formed on the second insulation layer INS2, and the touch sensing line 432 is formed in the third metal layer M3 in the display area 101. A third insulation layer INS3 is formed on the third metal layer M3, and includes a contact hole 520. A second transparent conductive layer 512 is formed on the third insulation layer INS3, and includes the sub-common electrode COM which has several slits 512S. In the display area 101, the touch sensing line 432 is electrically connected to the sub-common electrode COM through the contact hole 520. Consequently, the common voltage is applied to the sub-common electrode COM in the display period, and an electric field between the sub-common electrode COM and the pixel electrode PE is configured to control the orientation of the liquid crystal. In the touch period, the sub-common electrode COM serves as a portion of the touch electrode, and the voltage on which is transmitted to the driving circuit through the touch sensing line 432 to generate the touch sensing signal.

The sub-common electrode COM is disposed above the pixel electrode PE in the embodiment of FIG. 5A. However, in other embodiments, the sub-common electrode COM may be disposed below the pixel electrode PE. For example, referring to FIG. 5B_1 and FIG. 5C, FIG. 5B_1 illustrates two pixel structure in an area 540 of FIG. 5C. In order to distinguish two sub-common electrodes COM of FIG. 5C, the sub-common electrodes in two adjacent pixel structures of FIG. 5B_1 are labeled as a first sub-common electrode COM1 and a second sub-common electrode COM2. When the sub-common electrodes COM1, COM2 are disposed below the pixel electrode PE, the sub-common electrodes COM1, COM2 and the second metal layer M2 are formed directly on the same layer (the first insulation layer INS1), that is, the sub-common electrodes COM1, COM2 and the second metal layer M2 are in direct contact with the first insulation layer INS1. Consequently, the sub-common electrode COM1 cannot across the data lines 431 to electrically connect the sub-common electrode COM2. Therefore, multiple metal connection structures (e.g. metal connection structure 535) are disposed for electrically connecting the sub-common electrodes in two adjacent pixel structures. In addition, the metal connection structures are not formed in the second metal layer. In the embodiment of FIG. 5B_1, the metal connection structures are formed in the third metal layer M3.

Figure 5C:
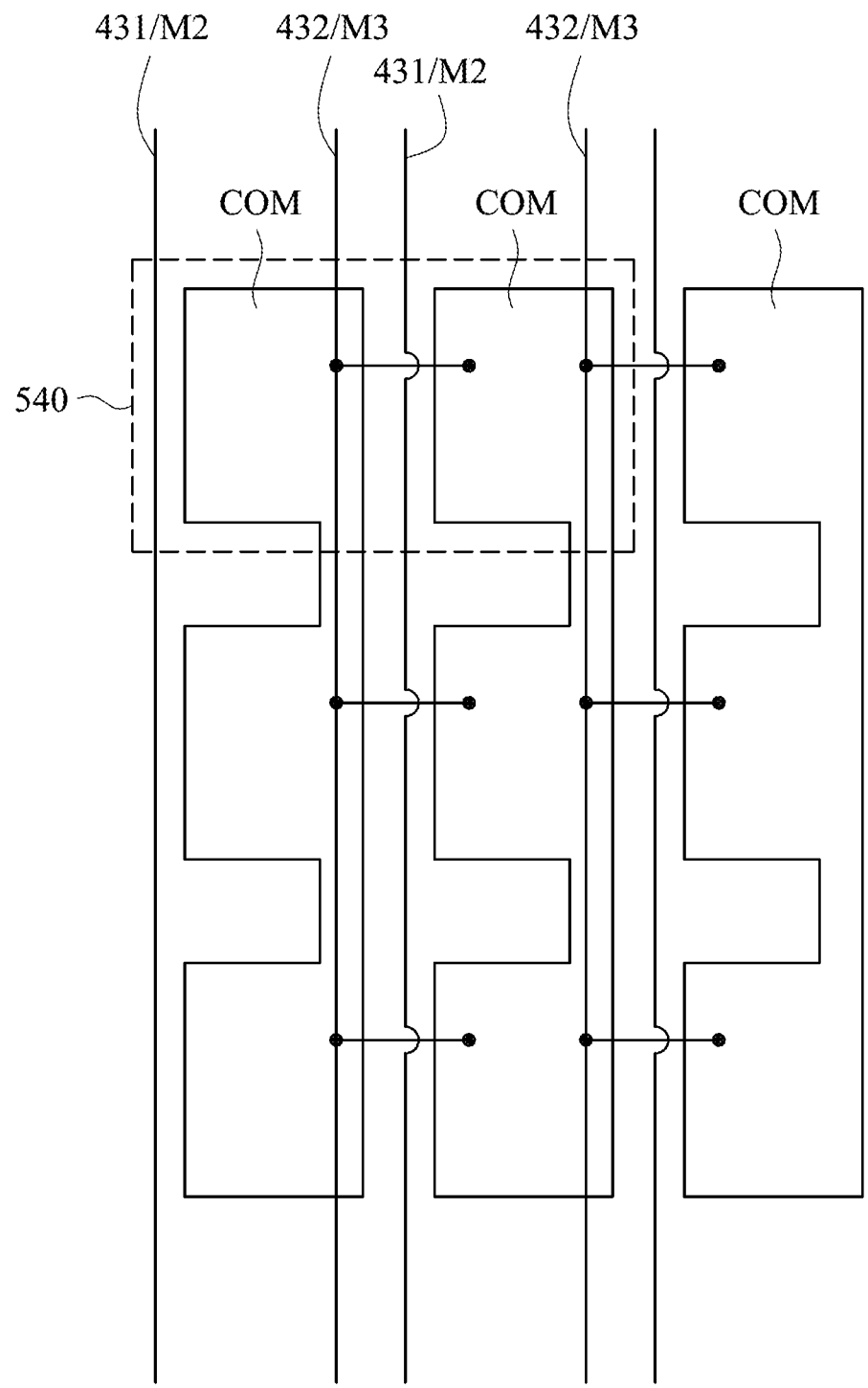
FIG. 5C is a circuit diagram of common electrodes of FIG. 5B_1.
Figure 5D:
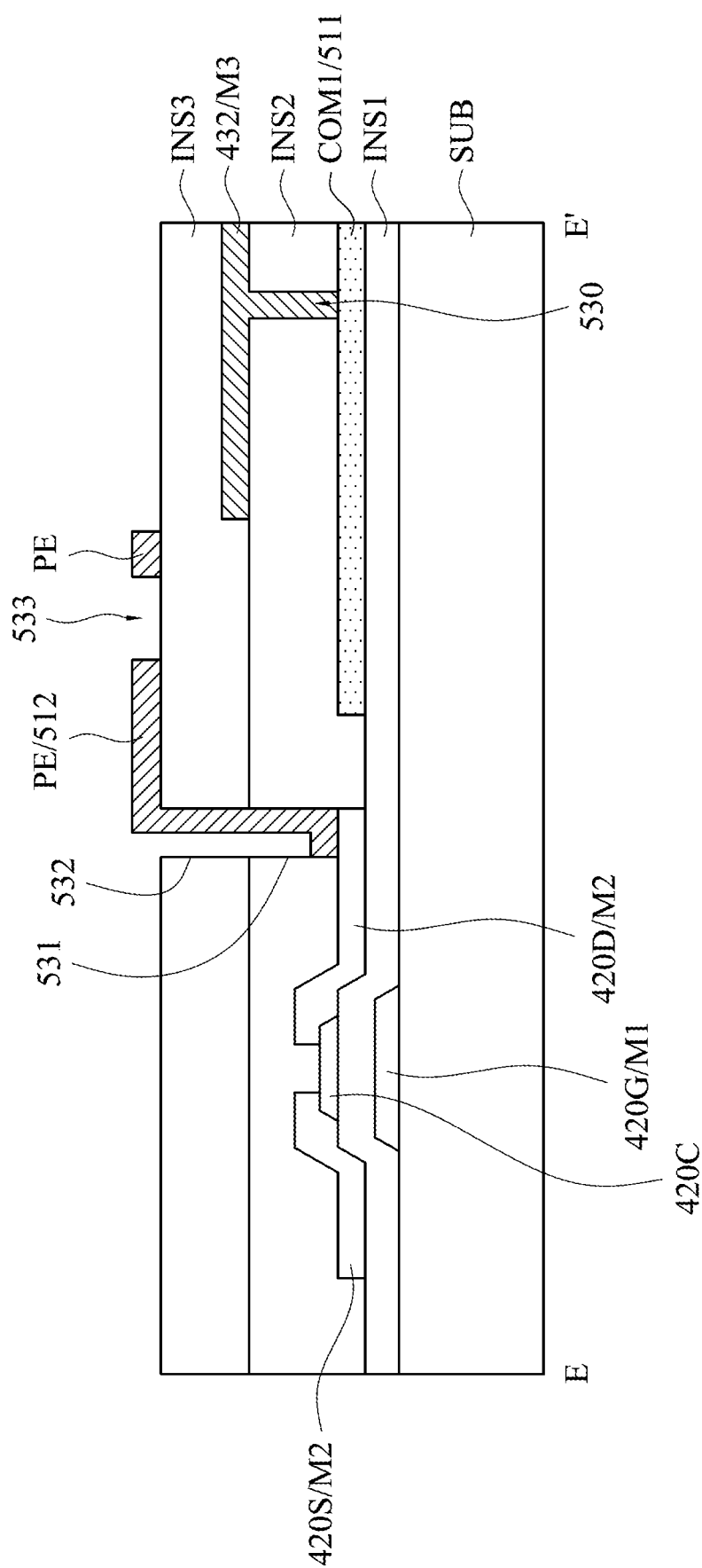
FIG. 5D is a cross-sectional view of pixel structure along a cross-sectional line EE' of FIG. 5B_1.
Figure 5E:
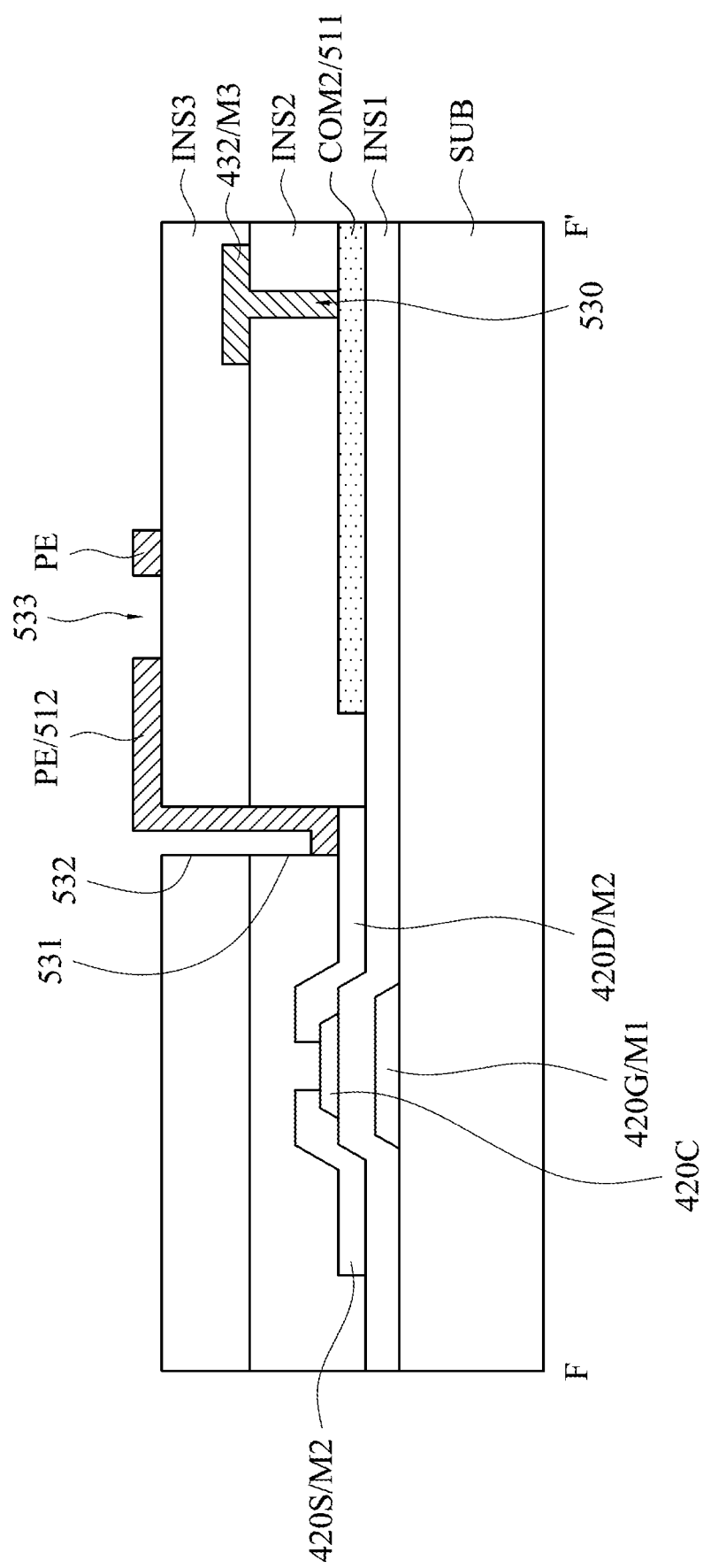
FIG. 5E is a cross-sectional view of pixel structure along a cross-sectional line FF' of FIG. 5B_1.
Figure 5F:
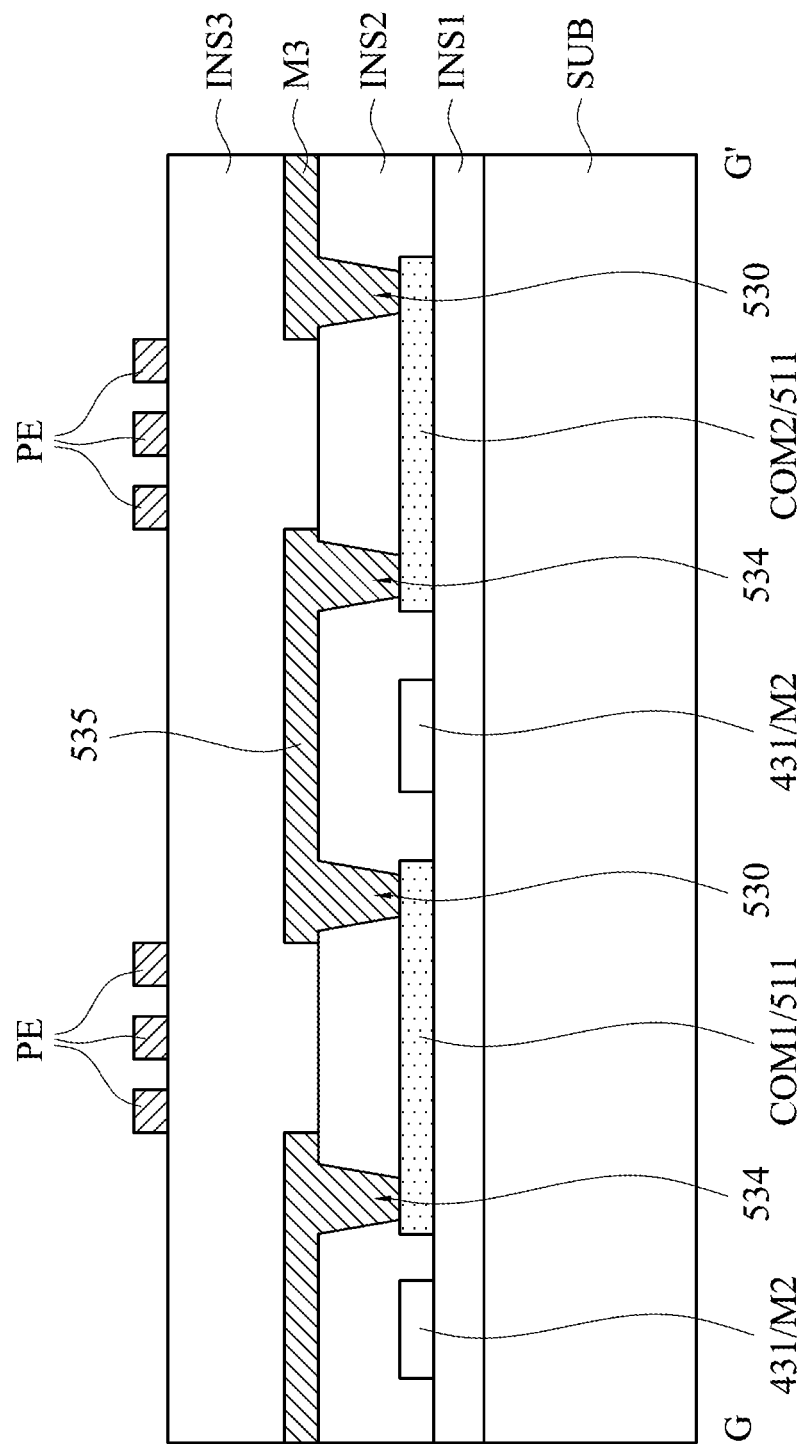
FIG. 5F is a cross-sectional view of pixel structure along across-sectional line GG' of FIG. 5B_1.

To be specific, referring to FIG. 5B_1, FIG. 5D, FIG. 5E and FIG. 5F, FIG. 5D is a cross-sectional view of pixel structure along a cross-sectional line EE' of FIG. 5B_1, FIG. 5E is a cross-sectional view of pixel structure along a cross-sectional line FF' of FIG. 5B_1, and FIG. 5F is a cross-sectional view of pixel structure along across-sectional line GG' of FIG. 5B_1. The units of FIG. 5D to FIG. 5F that are similar to that of FIG. 5A will not be described again. In FIG. 5D to FIG. 5F, the second metal layer M2 and the first transparent conductive layer 511 are both disposed on the first insulation layer INS1 and are in direct contact with the first insulation layer INS1. The first transparent conductive layer 511 includes the sub-common electrodes COM1, COM2. The second insulation layer INS2 is formed on the second metal layer M2 and the first transparent conductive layer 511. The second insulation layer INS2 includes a contact hole 530, a contact hole 531 and a contact hole 534. The contact hole 531 exposes the drain 420D. The contact holes 530, 534 in a single pixel structure are disposed at two sides of the sub-common electrode to expose the sub-common electrode of the pixel structure. For example, the contact holes 530, 534 are disposed at two sides of the sub-common electrode COM1, COM2. The third metal layer M3 is formed on the second insulation layer INS2. In the display area 101, the touch sensing lines 432 is formed in the third metal layer M3. The touch sensing lines 432 is electrically connected to the sub-common electrode COM1, COM2 through the contact hole 530. In addition, the third metal layer M3 also includes the metal connection structure 535 which is electrically connected to the touch sensing lines 432 (also electrically connected to the sub-common electrode COM1), and extend to the contact hole 534 in the adjacent pixel structure from the contact hole 530, and is electrically connected to the sub-common electrode COM2 through the contact hole 534. As a result, two adjacent sub-common electrodes COM1, COM2 are electrically connected to each other through the metal connection structure 535. Moreover, the third insulation layer INS3 is formed on the second insulation layer INS2 and the third metal layer M3, and the third insulation layer INS3 has a contact hole 532 corresponding to the contact hole 531. The second transparent conductive layer 512 is formed on the third insulation layer INS3, and has the pixel electrode PE. In some embodiments, the pixel electrode PE has several slits 533. In addition, the pixel electrode PE is electrically connected to the drain 420D through the contact holes 532, 531.

Figure 5G:
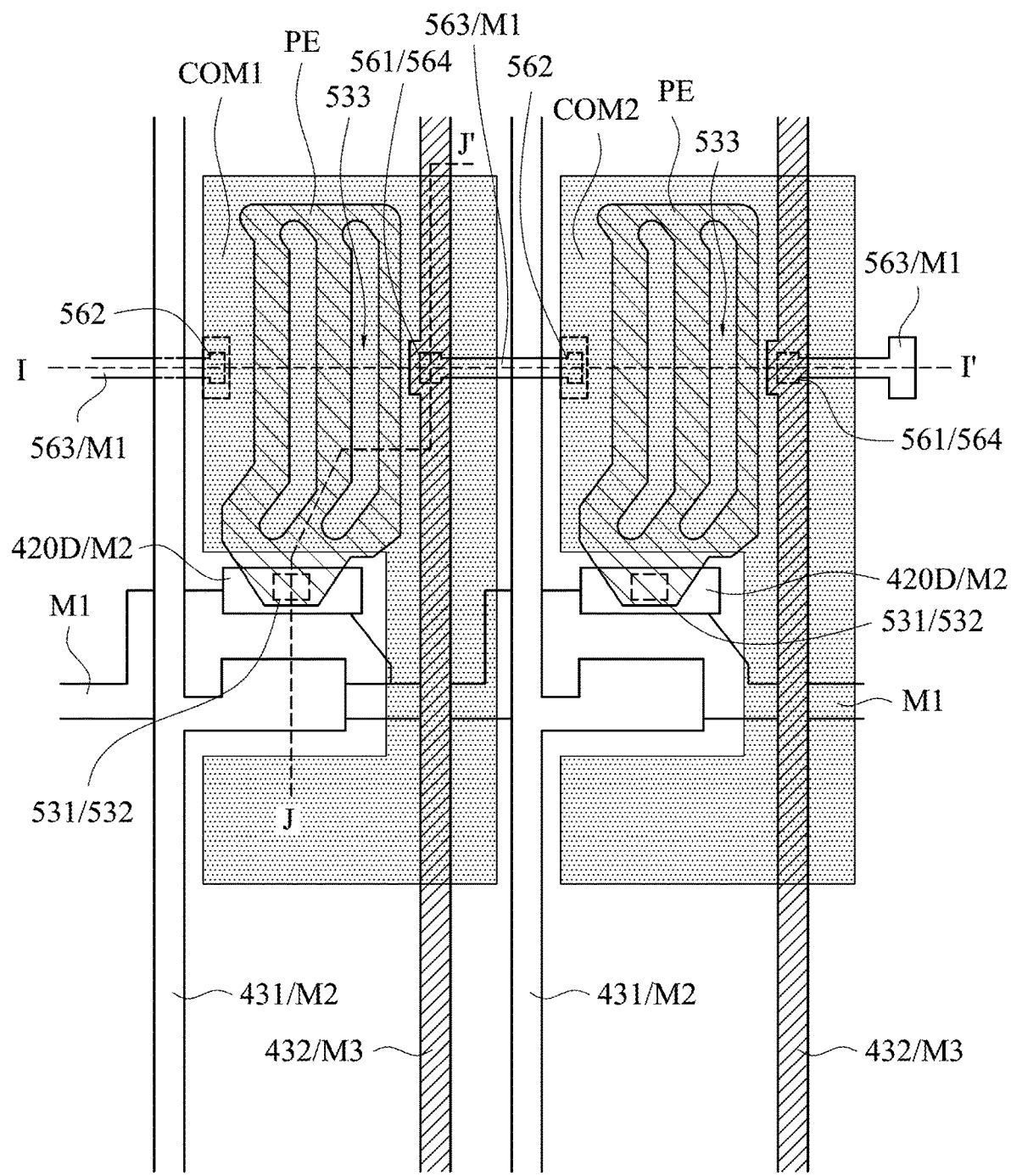
FIG. 5G is a top view of pixel structure in accordance with another embodiment.
Figure 5H:
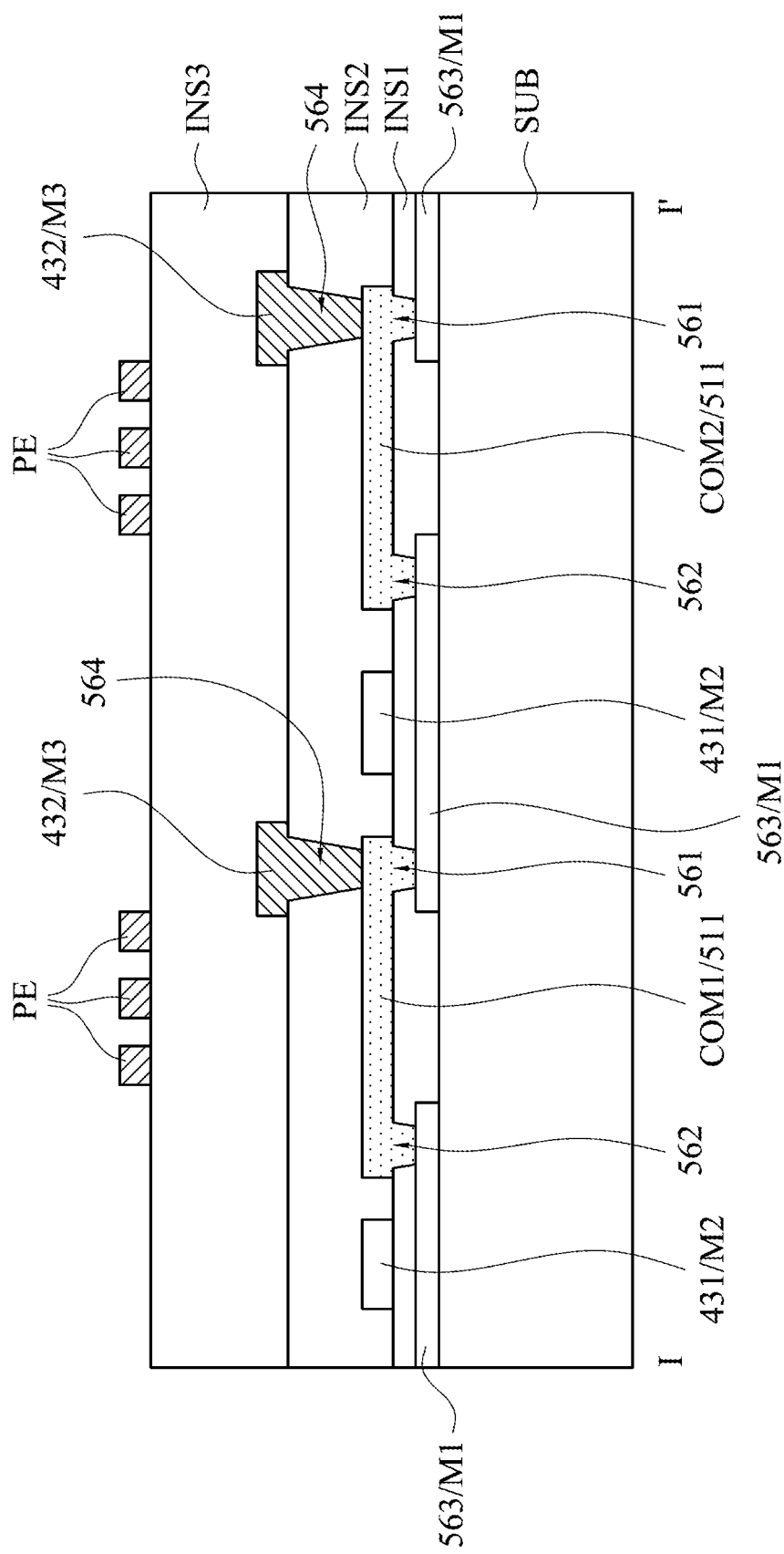
FIG. 5H is a cross-sectional view of pixel structure along a cross-sectional line II' of FIG. 5G.
Figure 5I:
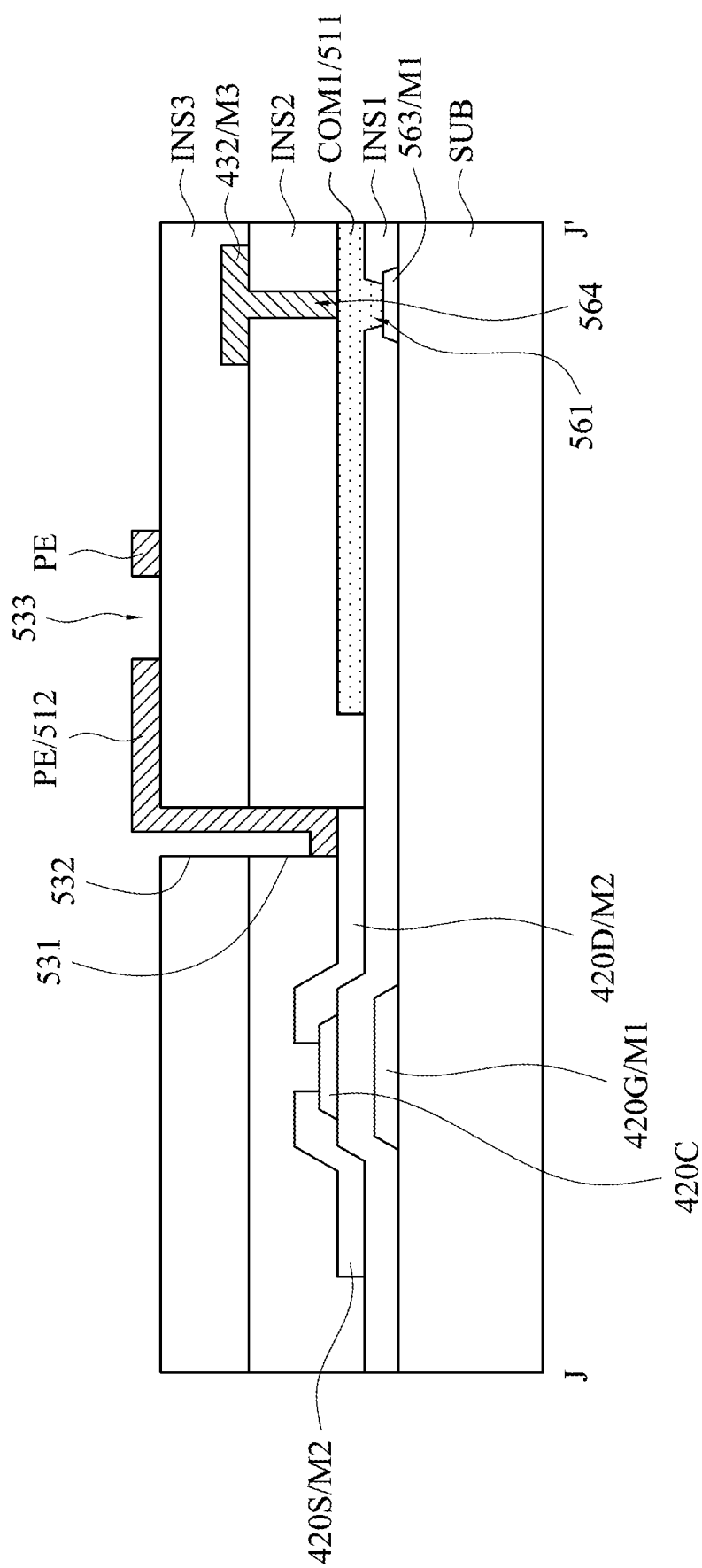
FIG. 5I is a cross-sectional view of pixel structure along a cross-sectional line JJ' of FIG. 5G.

In the embodiment of FIG. 5B_1, the metal connection structure 535 is formed in the third metal layer M3, but it may be formed in the first metal layer M1 in other embodiments. For example, referring to FIG. 5G, FIG. 5H and FIG. 5I. FIG. 5G is a top view of pixel structures in accordance with another embodiment. FIG. 5H is a cross-sectional view of pixel structure along a cross-sectional line II' of FIG. 5G. FIG. 5I is a cross-sectional view of pixel structure along a cross-sectional line JJ' of FIG. 5G. In the embodiment, the first metal layer M1 includes the gate 420G and a metal connection structure 563. The first insulation layer INS1 includes contact holes 561, 562 to expose the metal connection structure 563. The first transparent conductive layer 511 includes the sub-common electrodes COM1, COM2. The sub-common electrode COM1 is electrically connected to the metal connection structure 563 through the contact hole 561. The metal connection structure 563 is electrically connected to the sub-common electrode COM2 through the contact hole 562. As a result, the sub-common electrodes COM1, COM2 are electrically connected to each other. The second insulation layer INS2 is formed on the second metal layer M2 and the first transparent conductive layer 511, and has contact holes 564 to expose the sub-common electrodes COM1, COM2. The third metal layer M3 is formed on the second insulation layer INS2, and the touch sensing lines 432 formed in the third metal layer M3 is electrically connected to the sub-common electrodes COM1, COM2 through the contact holes 564.

On the other hand, referring to FIG. 5B_2 and FIG. 5C, the sub-common electrodes COM1, COM2 are electrically connected to each other through the metal connection structure 535 along X direction. However, along Y direction, the sub-common electrode would not across the second metal layer, which is in the same layer, and therefore two sub-common electrodes are electrically connected to each other through an extending part. In detail, the sub-common electrode COM1 and a sub-common electrode COM3, which are adjacent to each other along Y direction, are electrically connected to each other through an extending part 591; the sub-common electrode COM2 and a sub-common electrode COM4, which are adjacent to each other along Y direction, are electrically connected to each other through an extending part 592. The extending parts 591, 592 would across the gate lines 430, and the width of the extending part along X direction is less than that of the sub-common electrodes COM1, COM2, COM3, and COM4.

In the embodiments of FIG. 4A and FIG. 5A, the touch sensing line 432 is formed in the third metal layer M3, but the touch sensing line connected to the sub-common electrode COM may be formed in the second metal layer M2 in another embodiment. For example, referring to FIG. 4B, for clearly showing the relative locations of the touch sensing line and the data line, two data lines 431 and one touch sensing line 550 are shown in FIG. 5B. The two data lines 431 are respectively belong to two adjacent pixel structures. Both of the data lines 431 and the touch sensing line 550 are formed of the patterned second metal layer M2, and the touch sensing line 550 is disposed between the two data lines 431. In more detail, referring to FIG. 4B and FIG. 5J, and the description of the components in FIG. 5A that are similar to FIG. 5A will not be repeated. The data lines 431 and the touch sensing line 550 are formed on the first insulation layer INS1, and are formed in the second metal layer M2 in the display area. The second insulation layer INS2 is formed on the second metal layer M2 and the first transparent conductive layer 511, and includes a contact hole 551. The third insulation layer INS3 is formed on the second metal layer INS2, and includes a contact hole 552 corresponding to the contact hole 551. The transparent conductive layer 512 is formed on the third insulation layer INS3, and is electrically connected to the touch sensing line 550 through the contact hole 552 and the contact hole 551.

In the embodiments above, the channel region of TFT is amorphous silicon (a-si), but the channel region of TFT may be polysilicon or indium gallium zinc oxide (IGZO). For example, referring to FIG. 5K, the first metal layer M1 is disposed on the first substrate SUB. The first metal layer M1 includes the gate 420G of TFT. The first insulation layer INS1 is formed on the first metal layer M1. The semiconductor layer 420C is formed on the first insulation layer INS1, and the semiconductor layer 420C is metal oxide including Indium, gallium and zinc. The chemical formula of the semiconductor layer (IGZO) may be $In_{2-x}M_xO_3(Zn_{1-y}O)_F$, where M denotes boron(B), aluminum(Al), or gallium (Ga); $0 \leq x \leq 2$; $0 \leq y \leq 1$; and F=0-6. For example, when x=1, M=Ga, y=0, and F=1, the formula of the semiconductor layer is $InGaZnO_4$. The second insulation layer INS2 is formed on the semiconductor layer 420C, and has a first contact hole 5K_1h and a second contact hole 5K_2h to expose the semiconductor layer 420C. The first transparent conductive layer 511 is formed on the second insulation layer INS2, and includes the pixel electrode PE. The second metal layer M2 is also formed on the second insulation layer INS2, and includes the data line 431, the source 420S, the drain 420D, and the touch sensing line 550. The source 420S (data line 431) is electrically connected to the semiconductor layer 420C through the first contact hole 5K_1h. The drain 420D is electrically connected to the pixel electrode PE, and is electrically connected to the semiconductor layer 420C through the second contact hole 5K_2h. The third insulation layer INS3 is formed on the second metal layer M2, and includes a third contact hole 5K_3h to expose the touch sensing line 550. The second transparent conductive layer 512 is formed on the third insulation layer INS3 and includes the sub-common electrode COM which is electrically connected to the touch sensing line 550 through the third contact hole 5K_3h.

Figure 5J:
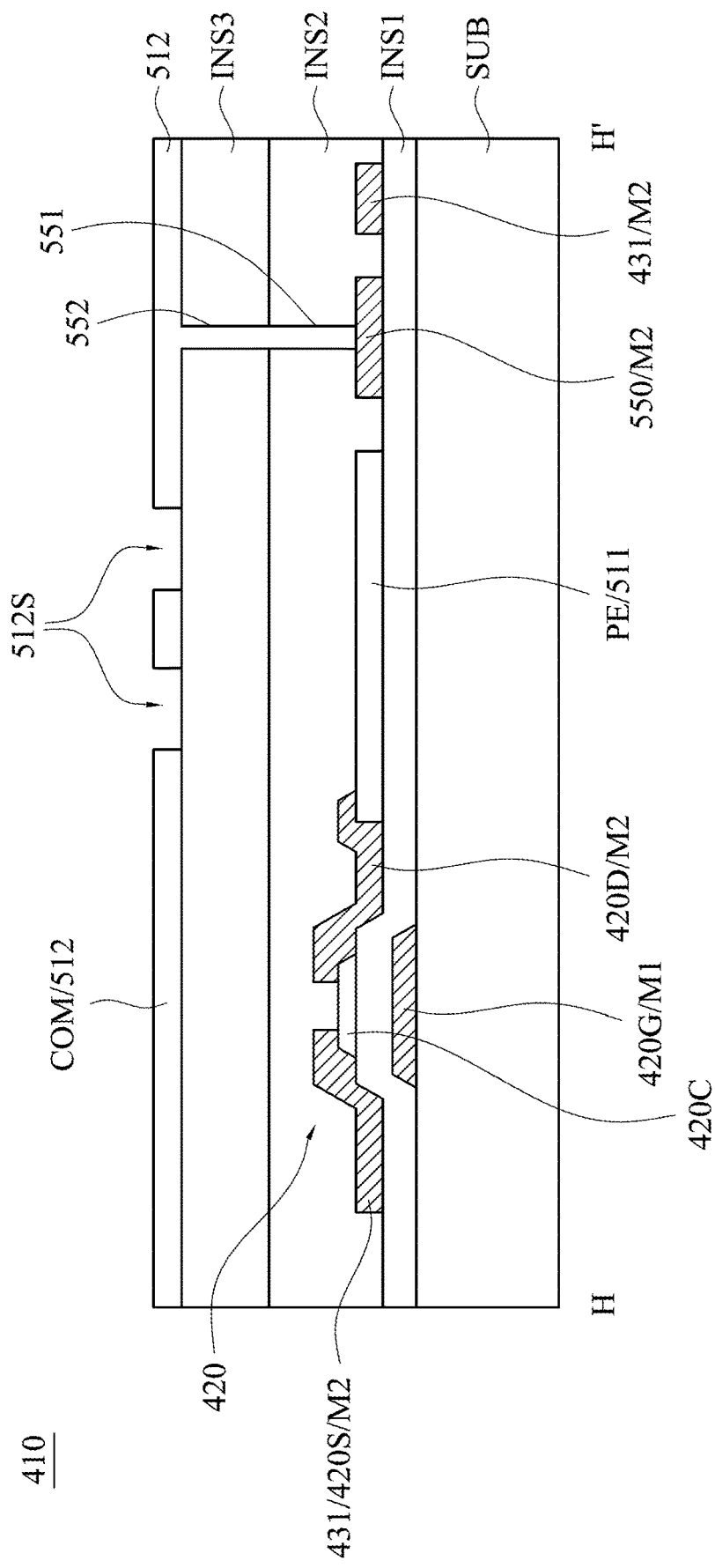
FIG. 5J is a cross-sectional view of pixel structure along a cross-sectional line HH' of FIG. 4B.
Figure 5K:
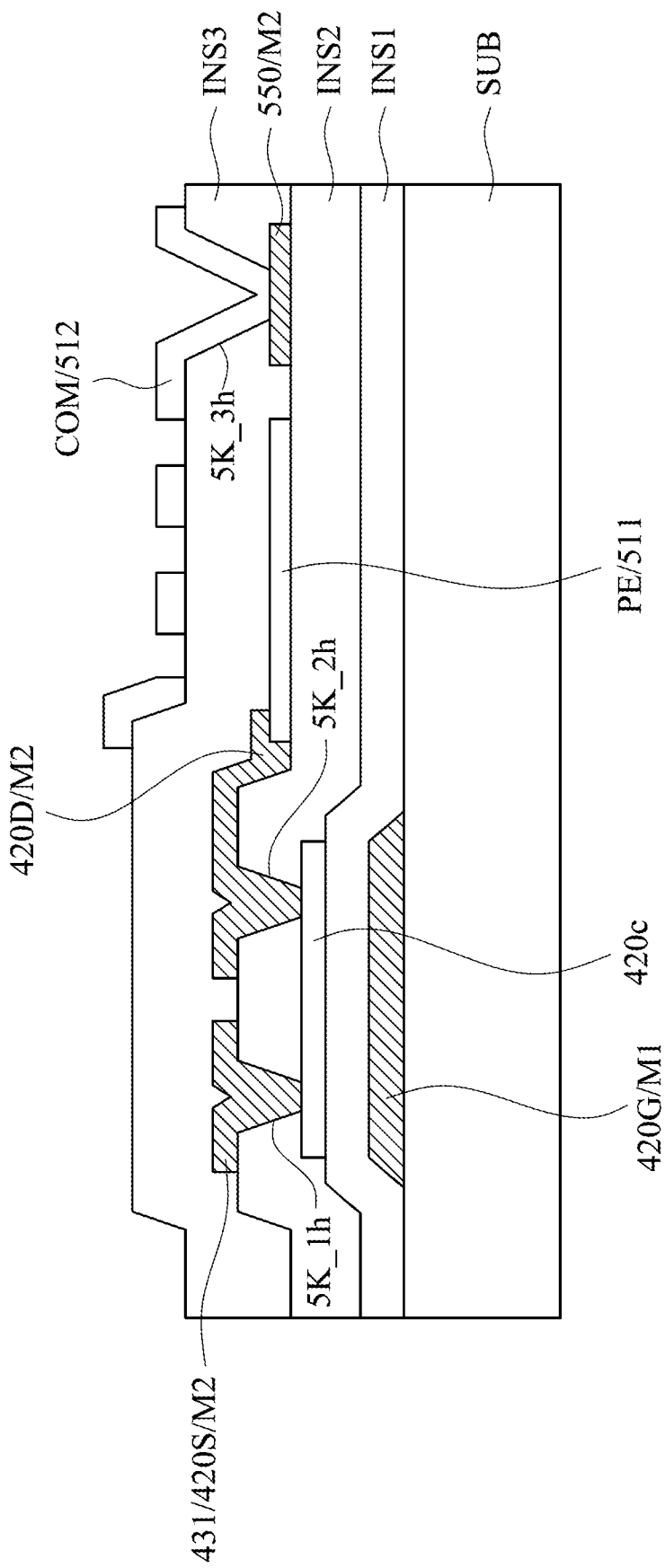
FIG. 5K is a cross-sectional view of pixel structure in accordance with an embodiment.
Figure 5L:
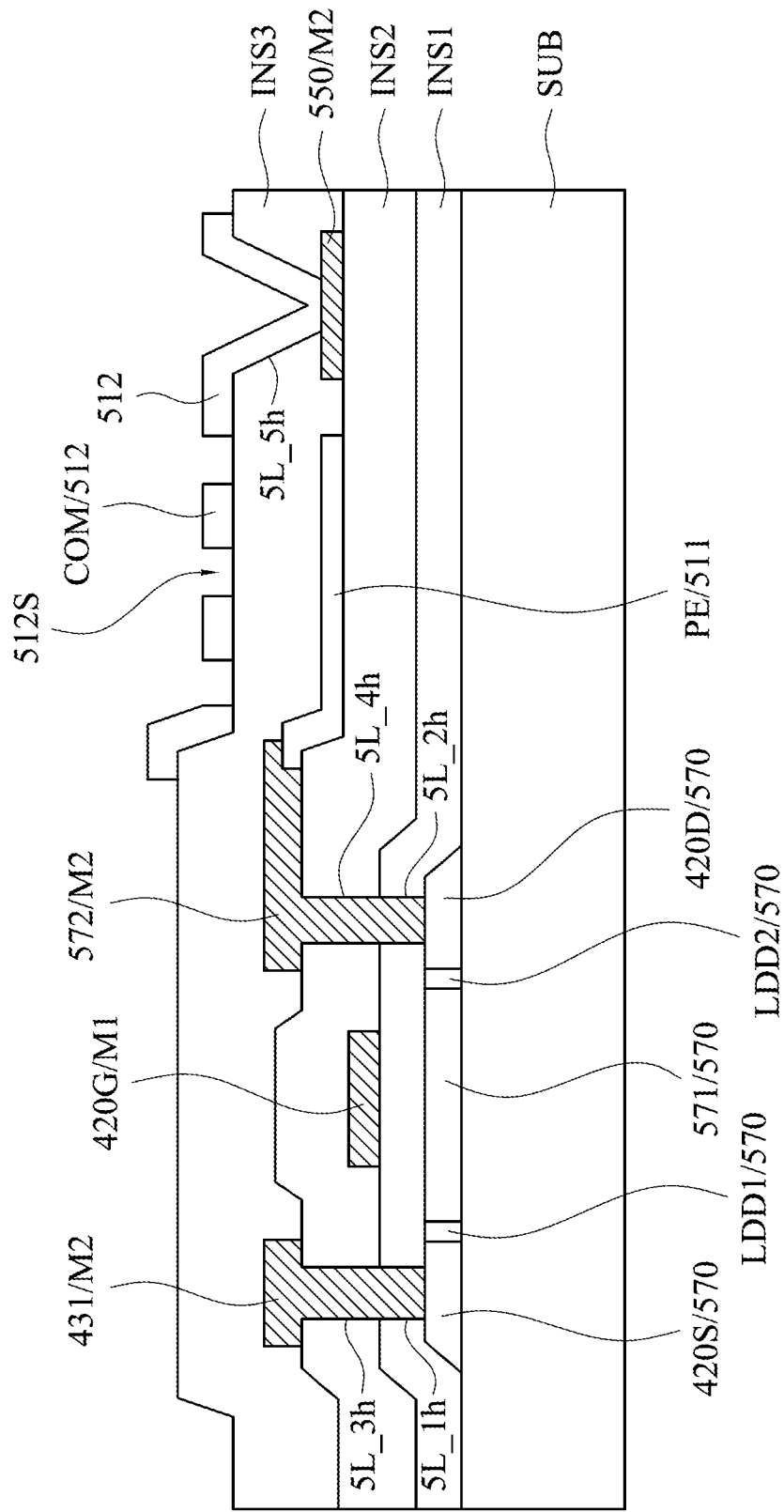
FIG. 5L is a cross-sectional view of pixel structure in accordance with an embodiment.

On the other hand, referring to FIG. 5L, the channel in FIG. 5L is Low Temperature Poly-silicon (LTPS). In detail, a semiconductor layer 570 is formed on the first substrate SUB. The semiconductor layer 570 includes the source 420S, a first lightly doped region LDD1, a second lightly doped region LDD2, a channel region 571 and the drain 420D. The channel region 571 is polysilicon which is formed by a low-temperature (usually lower than 600° C.) way. The source 420S and the drain 420D are heavily doped. The channel region 571 is formed between the first lightly doped region LDD1 and the second lightly doped region LDD2. The first lightly doped region LDD1 is formed between the source 420S and the channel region 571, and the second lightly doped region LDD2 is formed between the channel region 571 and the drain 420D. The first insulation layer INS1 is formed on the semiconductor layer 570, and includes a first contact hole 5L_1h and a second contact hole 5L_2h to respectively expose the source 420S and the drain 420D. The first metal layer M1 is formed on the first insulation layer INS1, and includes the gate 420G. The second insulation layer INS2 is formed on the first insulation layer INS1, and includes a third contact hole 5L_3h corresponding to the first contact hole 5L_1h, and has a fourth contact hole 5L_4h corresponding to the second contact hole 5L_2h. The gate 521G is formed between the third contact hole 5E_3h and the fourth contact hole 5E_4h. The first transparent conductive layer 511 is formed on the second insulation layer INS2, and includes the pixel electrode PE. The second metal layer M2 is formed on the second insulation layer INS2. The data line 431 and the touch sensing line 550 are formed in the second metal layer M2 in the display area. The data line 431 is electrically connected to the source 420S through the third contact hole 5L_3h and the first contact hole 5L_1h. The second metal layer M2 also includes a filling structure 572 which is electrically connected to the pixel electrode PE, and is electrically connected to the drain 420D through the fourth contact hole 5L_4h and the second contact hole 5L_2h. The third insulation layer INS3 is formed on the second metal layer M2, and includes a fifth contact hole 5L_5h to expose the touch sensing line 550. The second transparent conductive layer 512 is formed on the third insulation layer INS3, and is electrically connected to the touch sensing lines 550 through the fifth contact hole 5L_5h. The second transparent conductive layer 512 includes the sub-common electrode COM which has several slits 512S.

Figure 4B:
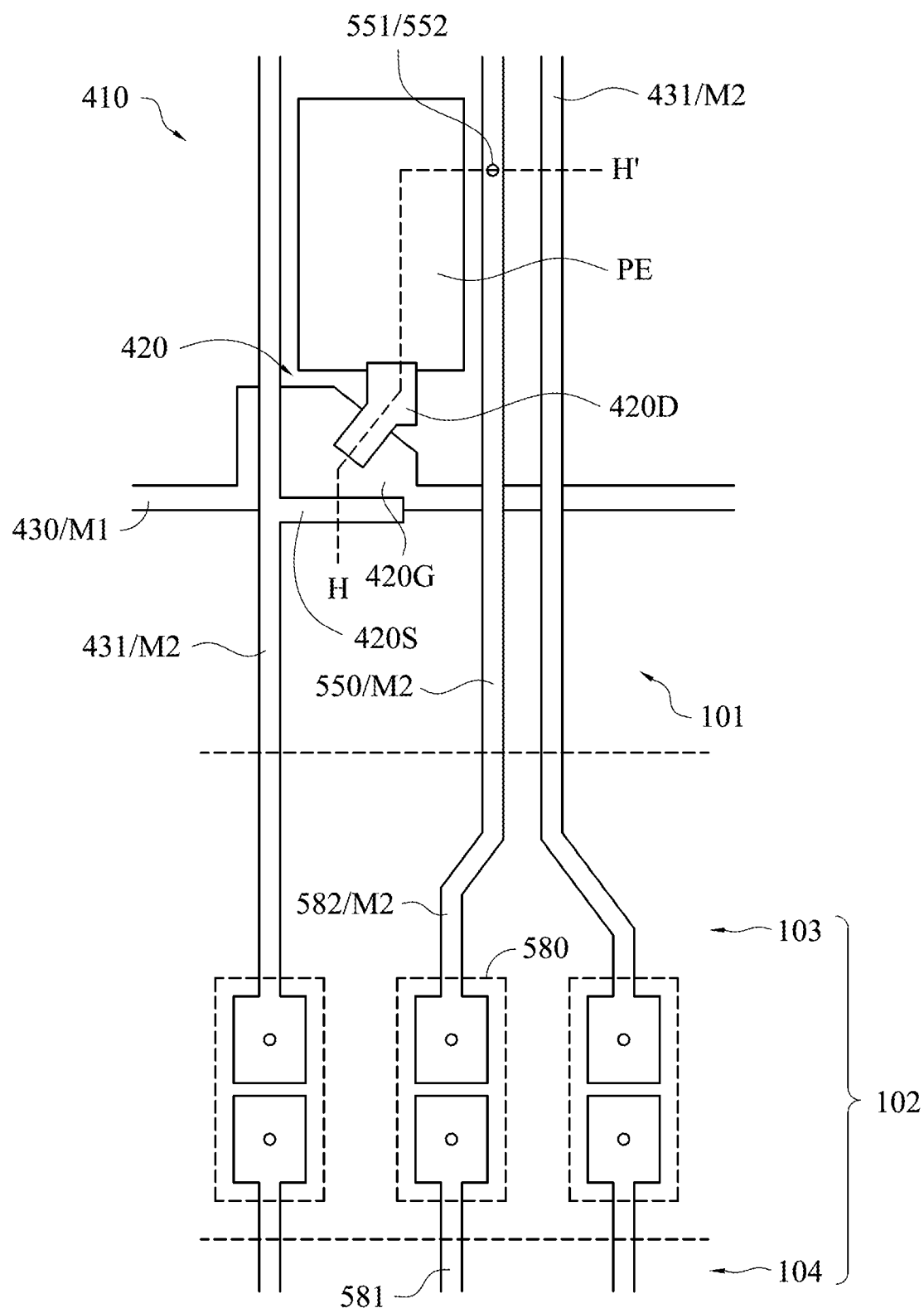
FIG. 4B is a top view of pixel structure in accordance with another embodiment.

When comparing FIG. 4A with FIG. 4B, because the touch sensing line 550 and the data line 431 are both formed in the second metal layer M2 in FIG. 4B, they are parallel to each other and cannot overlap with each part, and thus an aperture ratio of the pixel structure is decreased in order to dispose the lines, however, the process cost is reduced. In FIG. 4A, because the touch sensing line 432 and the data line 431 are formed in different metal layers, the lines can overlap with each other, and consequently increase the aperture ratio of the pixel structure. However, whether the touch sensing line is formed in the second metal layer or the third metal layer is not limited in the invention.

Figure 6:
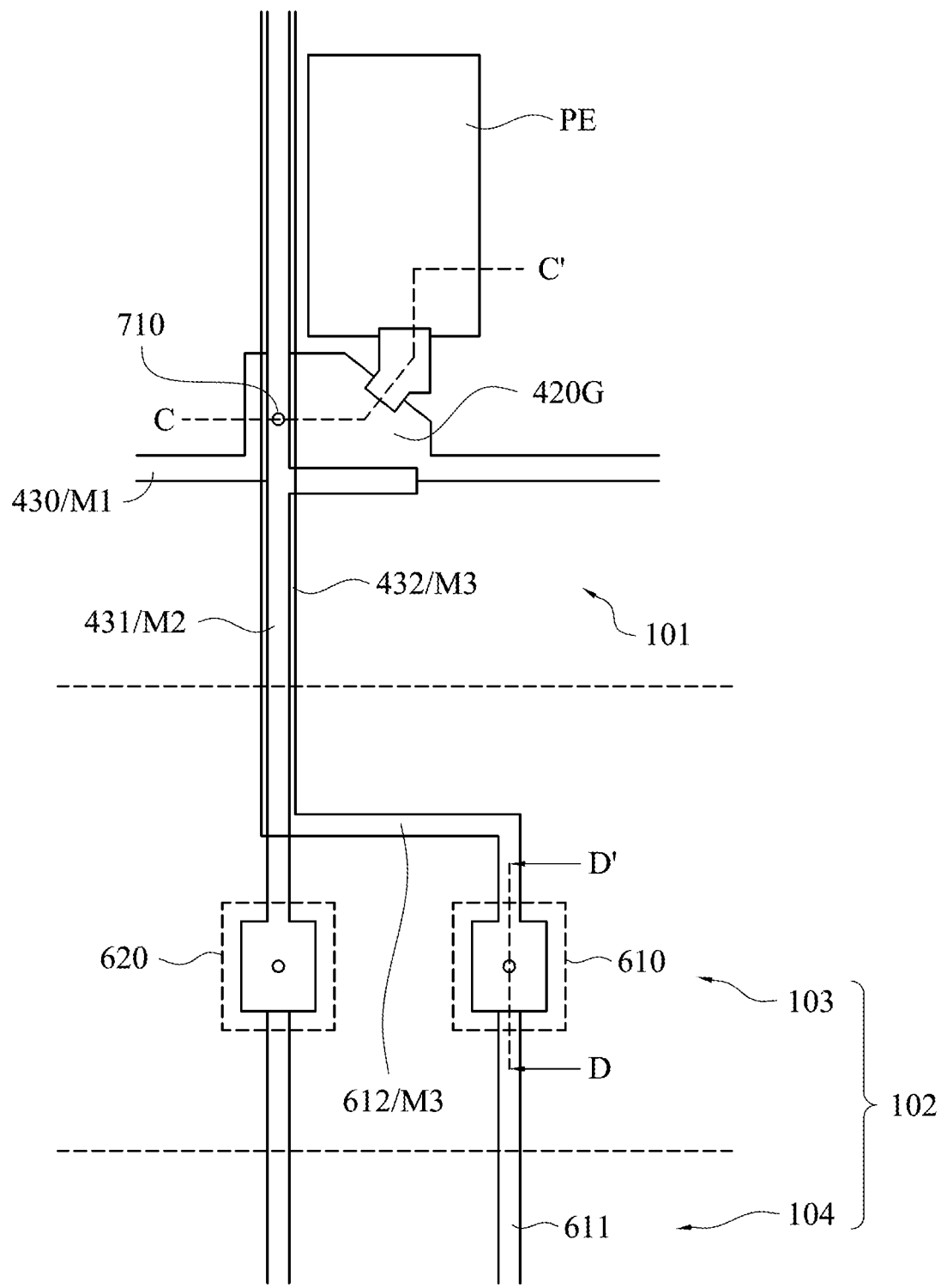
FIG. 6 is a top view of pixel structure in accordance with another embodiment.
Figure 7A:
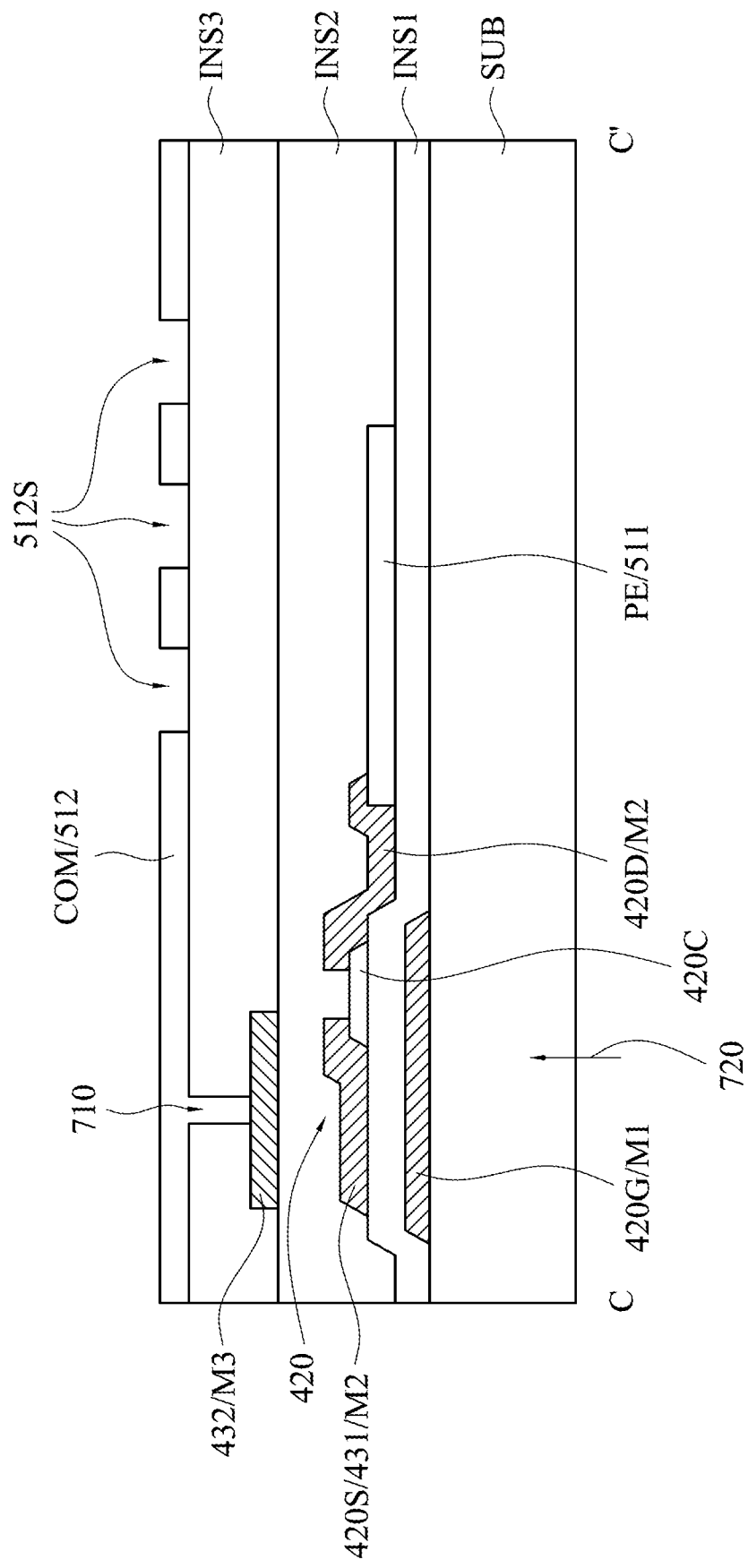
FIG. 7A is a cross-sectional view of pixel structure along a cross-sectional line CC' of FIG. 6.

In the embodiment of FIG. 4A, the data line 431 and the touch sensing line 432 are not overlapped with each other along a normal vector of the in-cell touch display panel, but the touch sensing line 432 is made of metal that would decrease the aperture ratio of the pixel structure. In some embodiments, the data line 431 and the touch sensing line 432 are partially overlapped with each other along the normal vector of the in-cell touch display panel, and the data line 431 and the touch sensing line 432 are formed in different metal layers in the display area. For example, referring to FIG. 6 and FIG. 7A, FIG. 6 is a diagram illustrating a top view of pixel structure according to another embodiment, and FIG. 7A is a diagram illustrating a cross-sectional view of the pixel structure along a cross-sectional line CC' of FIG. 6. The first metal layer M1 is formed on the substrate SUB, and the first metal layer M1 includes the gate 420G. The first insulation layer INS1 is formed on the first metal layer M1. The semiconductor layer 420C is formed on the first insulation layer INS1 as the channel of the TFT 420. The first transparent conductive layer 511 is formed on the first insulation layer INS1, and includes the pixel electrode PE. The second metal layer M2 is formed on the semiconductor layer 420C, and includes the source 420S and the drain 420D which is electrically connected to the pixel electrode PE. The second insulation layer INS2 is formed on the second metal layer M2 and the first transparent conductive layer 511. The third metal layer M3 is formed on the second insulation layer INS2, and the touch sensing line 432 are formed in the third metal layer M3 in the display area 101. The third insulation layer INS3 is formed on the third metal layer M3, and includes a contact hole 710. The second transparent conductive layer 512 is formed on the third insulation layer INS3, and includes the sub-common electrode COM. The sub-common electrode COM has several slits 512S. In the display area 101, the touch sensing line 432 is electrically connected to the sub-common electrode COM through the contact hole 710. In particular, the touch sensing line 432 and the data line 431 are at least partially overlapped with each other along a normal vector 720 of the display panel.

Figure 7B:
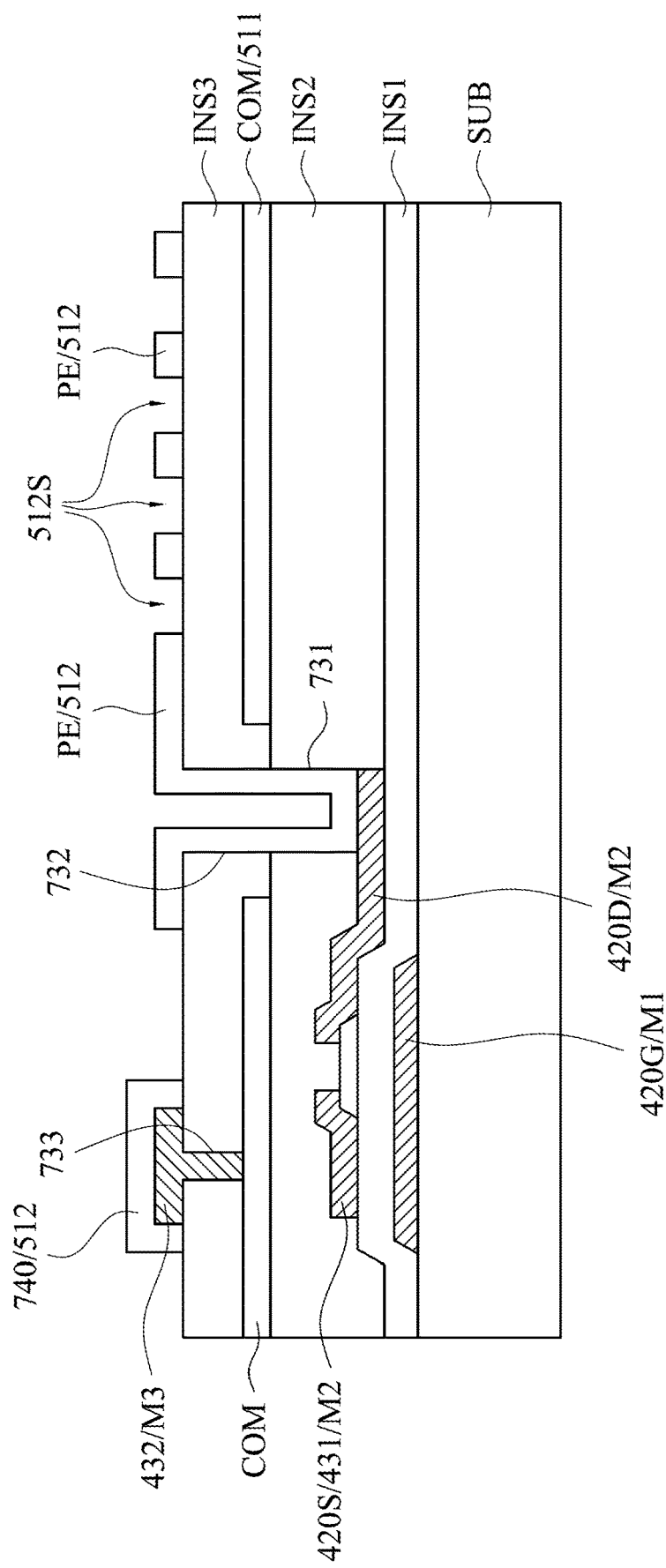
FIG. 7B is a cross-sectional view of pixel structure in accordance with an embodiment.

In the embodiment of FIG. 7A, the sub-common electrode COM is formed above the pixel electrode PE, but in other embodiments, the sub-common electrode COM may be formed below the pixel electrode PE. For example, referring to FIG. 7B which is similar to FIG. 7A, and therefore the description of the similar components will not be repeated. In the embodiment of FIG. 7B, the second insulation layer INS2 includes a contact hole 731 to expose the drain 420D. The first transparent conductive layer 511 is formed on the second insulation layer INS2, and the first transparent conductive layer 511 includes the sub-common electrode COM. The third insulation layer INS3 is formed on the first transparent conductive layer 511, and includes a contact hole 732 and a contact hole 733. The contact hole 732 is corresponding to the contact hole 731. The third metal layer M3 is formed on the third insulation layer INS3, and includes the touch sensing line 432 which is electrically connected to the sub-common electrode COM through the contact hole 733. The second transparent conductive layer 512 is formed on the third insulation layer INS3 and the third metal layer M3, and includes the pixel electrode PE and a touch sensing line protection layer 740. The pixel electrode PE includes several slits 512S, and is electrically connected to the drain 420D through the contact hole 732 and the contact hole 731. The touch sensing line protection layer 740 covers the touch sensing line 432. Note that the touch sensing line protection layer 740 is electrically insulated from the pixel electrode PE, and the touch sensing line protection layer 740 is used for protecting the touch sensing line 432 from the erosion of subsequent processes.

Referring to FIG. 4A again, the touch sensing line 432 includes a first part 441 and a second part 442. The second part 442 is formed in the third metal layer M3, but the first part 441 may be formed in the first metal layer, the second metal layer or the third metal layer. A connection structure 440 is disposed in the non-display area 102 for coupling the first part 441 to the second part 442. Multiple embodiments are provided below.

Figure 8A:
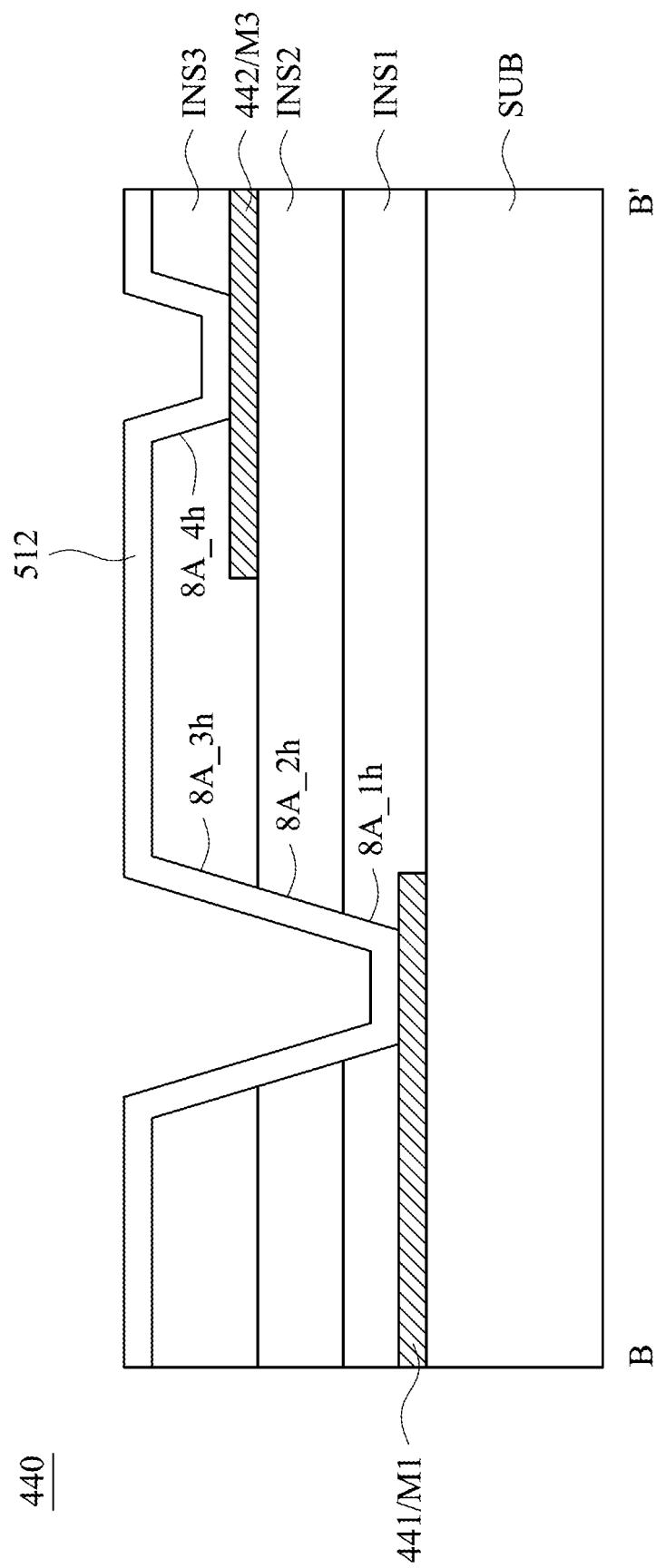
FIG. 8A to FIG. 8C are cross-sectional view of connection structure 440 along a cross-sectional line BB' of FIG. 4A.

FIG. 8A is a diagram illustrating a cross-sectional view of the connection structure 440 along a cross-sectional line BB' of FIG. 4A. The first part 441 is formed in the first metal layer M1 in the embodiment of FIG. 8A. To be specific, the first part 441 is formed on the substrate SUB. The first insulation layer INS1 is formed on the first metal layer M1, and includes a first opening 8A_1h to expose the first part 441. The second insulation layer INS2 is formed on the first insulation layer INS1, and includes a second opening 8A_2h which is corresponding to the first opening 8A_1h. The second part 442 is formed on the second insulation layer INS2. The third insulation layer INS3 is formed on the third metal layer M3 and the second insulation layer INS2, and includes a third opening 8A_3h and a fourth opening 8A_4h. The third opening 8A_3h is corresponding to the second opening 8A_2h, and the fourth opening 8A_4h exposes the second part 442. The second transparent conductive layer 512 is formed on the third insulation layer INS3, and is electrically connected to the second part 442 through the fourth opening 8A_4h, and is electrically connected to the first part 441 through the first opening 8A_1h, the second opening 8A_1h and the third opening 8A_3h. As a result, the first part 441 is electrically connected to the second part 442.

Figure 8B:
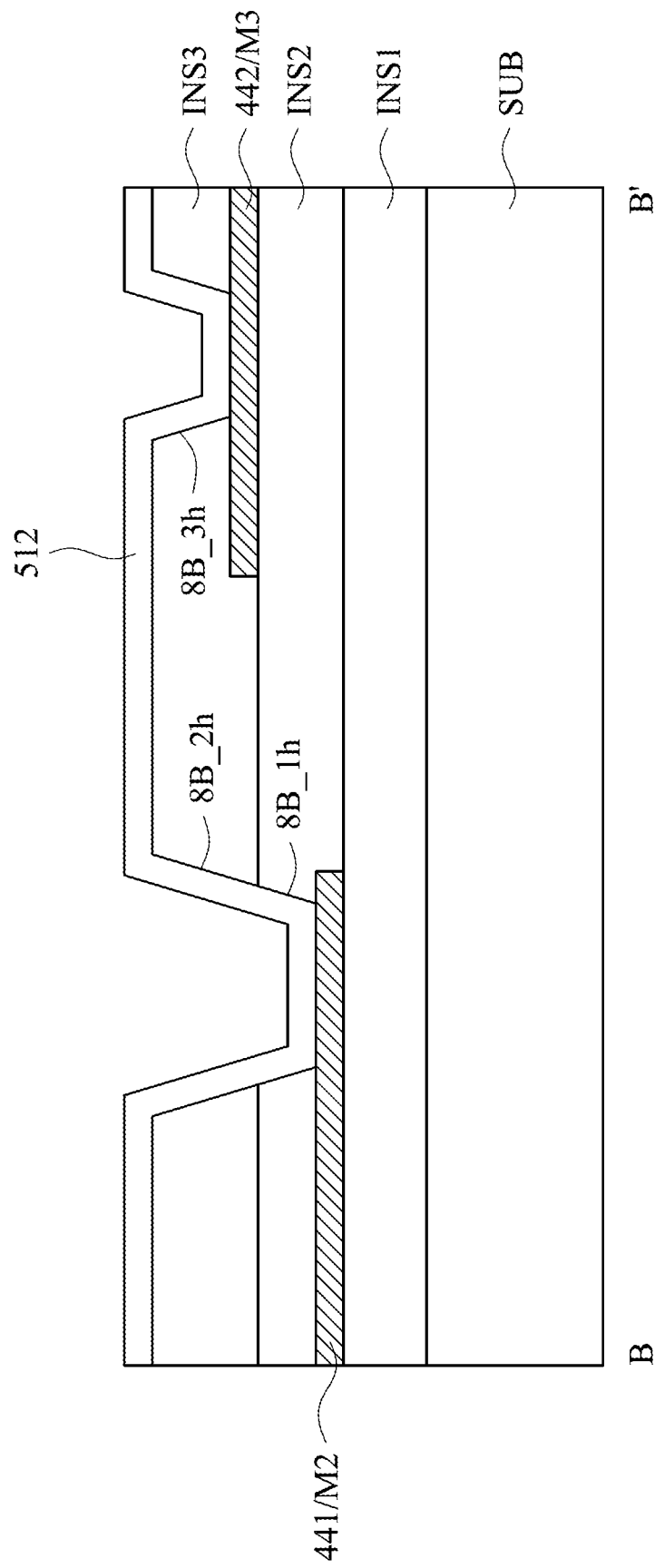

FIG. 8B is a diagram illustrating a cross-sectional view of the connection structure 440 along a cross-sectional line BB' of FIG. 4A. In the embodiment of FIG. 8B, the first part 441 is formed in the second metal layer M2. To be specific, the first insulation layer INS1 is formed on the substrate SUB. The first part 441 is formed on the first insulation layer INS1. The second insulation layer INS2 includes a first opening 8B_1h to expose the first part 441. The second part 442 is formed on the second insulation layer INS2. The third insulation layer INS3 includes a second opening 8B_2h and a third opening 8B_3h. The second opening 8B_2h is corresponding to the first opening 8B_1h. The third opening 8B_3h exposes the second part 442. The second transparent conductive layer 512 is electrically connected to the second part 442 through the third opening 8B_3h, and is electrically connected to the first part 441 through the first opening 8B_1h and the second opening 8B_2h.

Figure 8C:
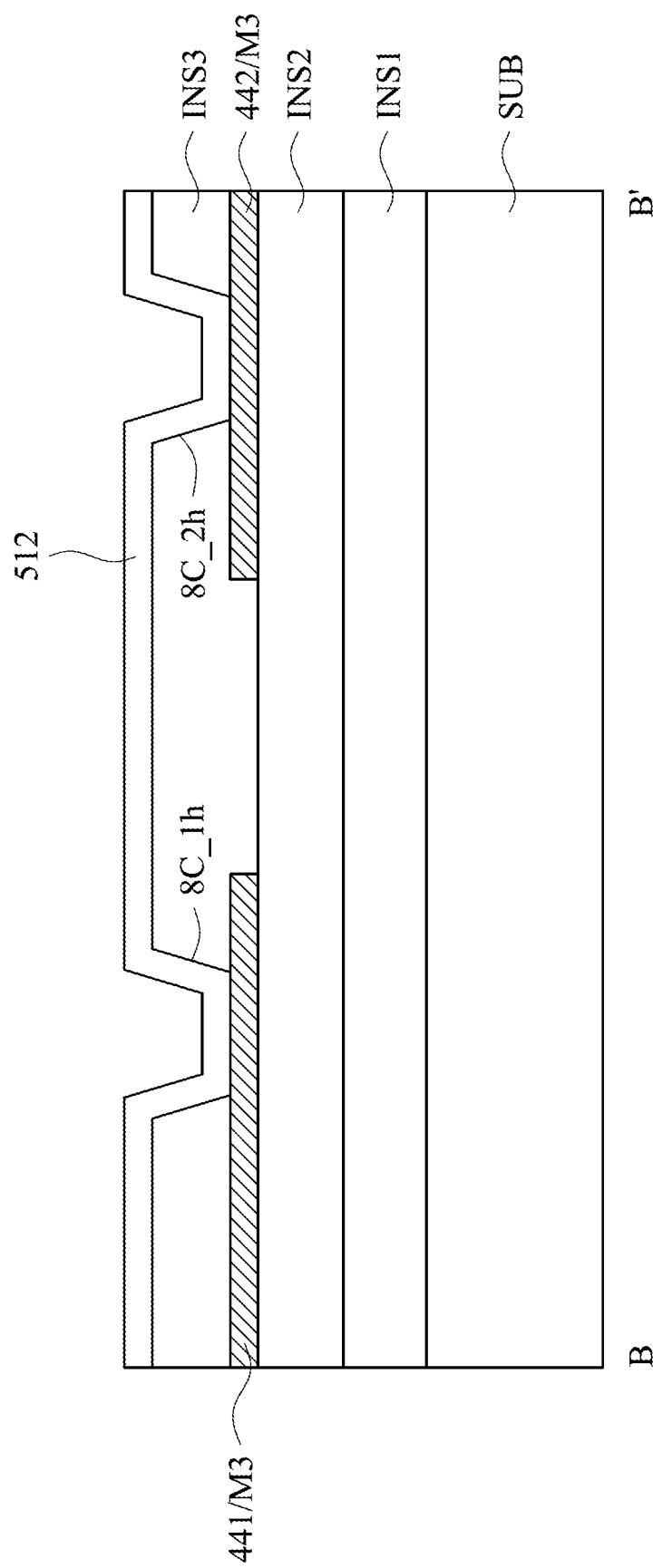

FIG. 8C is a diagram illustrating a cross-sectional view of the connection structure 440 along a cross-sectional line BB' of FIG. 4A. In the embodiment of FIG. 8C, the first part 441 is formed in the third metal layer M3. To be specific, the first part 441 and the second part 442 are formed on the second insulation layer INS2. The third insulation layer INS3 includes a first opening 8C_1h to expose the first part 441, and a second opening 8C_2h to expose the second part 442. The second transparent conductive layer 512 is electrically connected to the first part 441 through the first opening 8C_1h, and is electrically connected to the second part 442 through the second opening 8C_2h.

Referring to FIG. 4A, in some embodiments, the data line 431 is transferred to the first metal layer or the third metal layer, or remains in the second metal layer by a connection structure 450. The connection structure 450 is similar to the connection structure 440, and both of them electrically connect different metal layers through a transparent conductive layer. However, people in the art should be able to implement the connection structure 450 according to the disclosure in FIG. 8A to FIG. 8C. On the other hand, in the embodiment of FIG. 8C, although both of the first part 441 and the second part 442 are formed in the third metal layer M3, the disposition of the connection structure 440 can achieve the impedance matching between the touch sensing line 432 and the data line 431.

Referring to FIG. 4B, the touch sensing line 550 includes a first part 581 and a second part 582. The second part 582 is formed in the second metal layer M2, and the first part 581 may be formed in the first metal layer or the second metal layer. A connection structure 580 is used to couple the second part 582 to the first part 581. For example, referring to FIG. 8D, the first part 581 is formed in the first metal layer M1. In detail, the first part 581 is formed on the first substrate SUB. The first insulation layer INS1 is formed on the first metal layer M1, and includes a first opening 8D_1h to expose the first part 581. The second part 582 is formed on the first insulation layer INS1. The second insulation layer INS2 is formed on the second metal layer M2, and includes a second opening 8D_2h and a third opening 8D_3h. The second opening 8D_2h is corresponding to the first opening 8D_1h, and the third opening 8D_3h exposes the second part 582. The second transparent conductive layer 512 is formed on the second insulation layer INS2, and is electrically connected to the second part 582 through the third opening 8D_3h, and is electrically connected to the first part 581 through the first opening 8D_2h and the second opening 8D_1h.

Figure 8D:
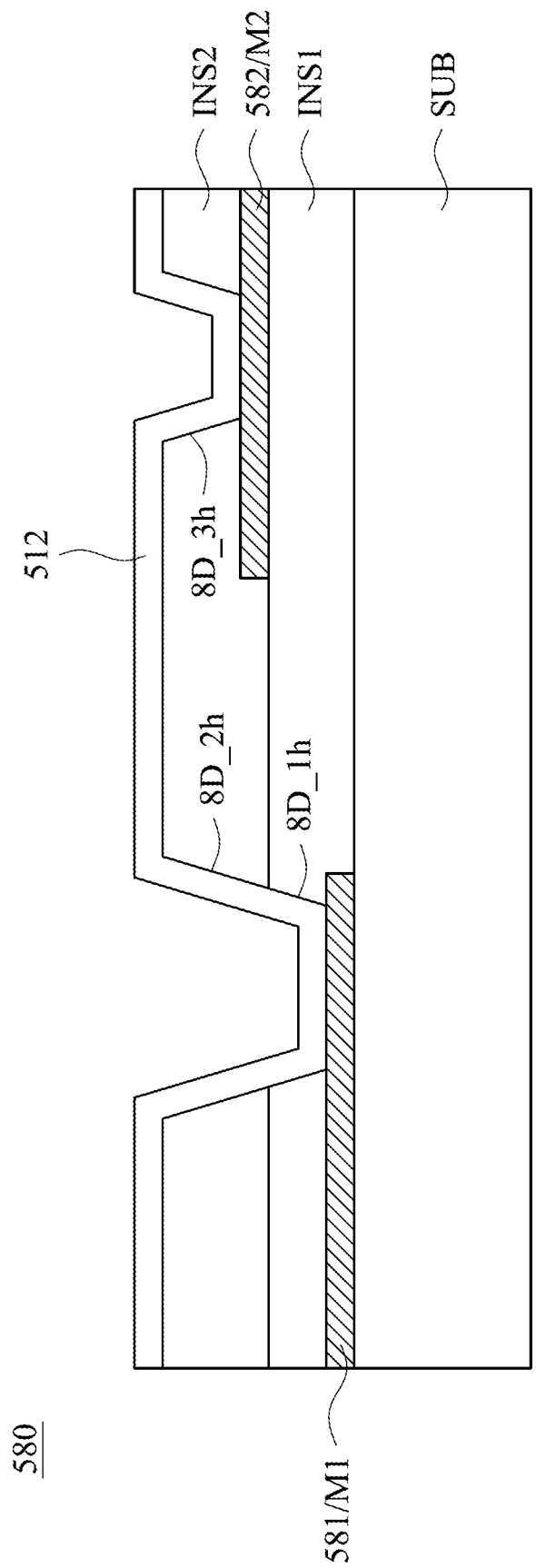
FIG. 8D to FIG. 8I are cross-sectional views of connection structure 580 in accordance with an embodiment.
Figure 8E:
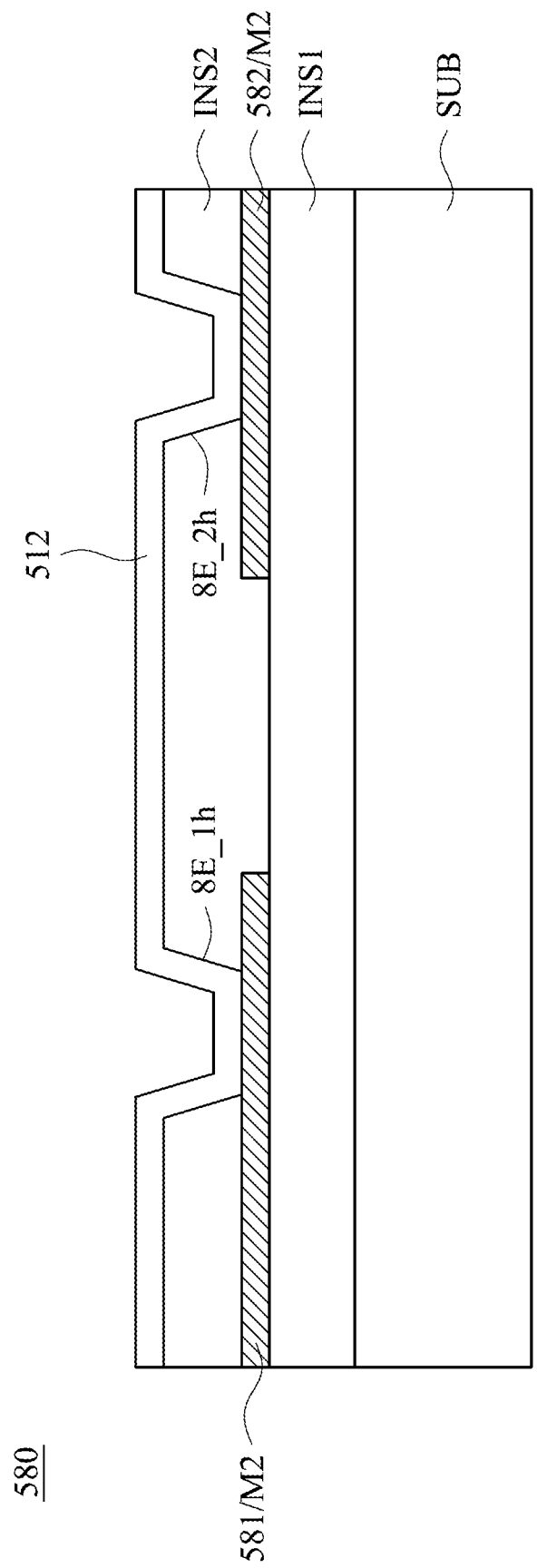

On the other hand, in the embodiment of FIG. 8E, both of the first part 581 and the second part 582 are formed in the second metal layer M2. In detail, the first insulation layer INS1 is formed on the first substrate SUB. The second metal layer M2 is formed on the first insulation layer INS1. The second insulation layer INS2 is formed on the second metal layer M2, and includes a first opening 8E_1h and a second opening 8E_2h. The first opening 8E_1h exposes the first part, and the second opening 8E_2h exposes the second part 582. The second transparent conductive layer 512 is formed on the second insulation layer INS2, and is electrically connected to the first part 581 through the first opening 8E_1h, and is electrically connected to the second part 582 through the second opening 8E_2h.

Figure 8F:
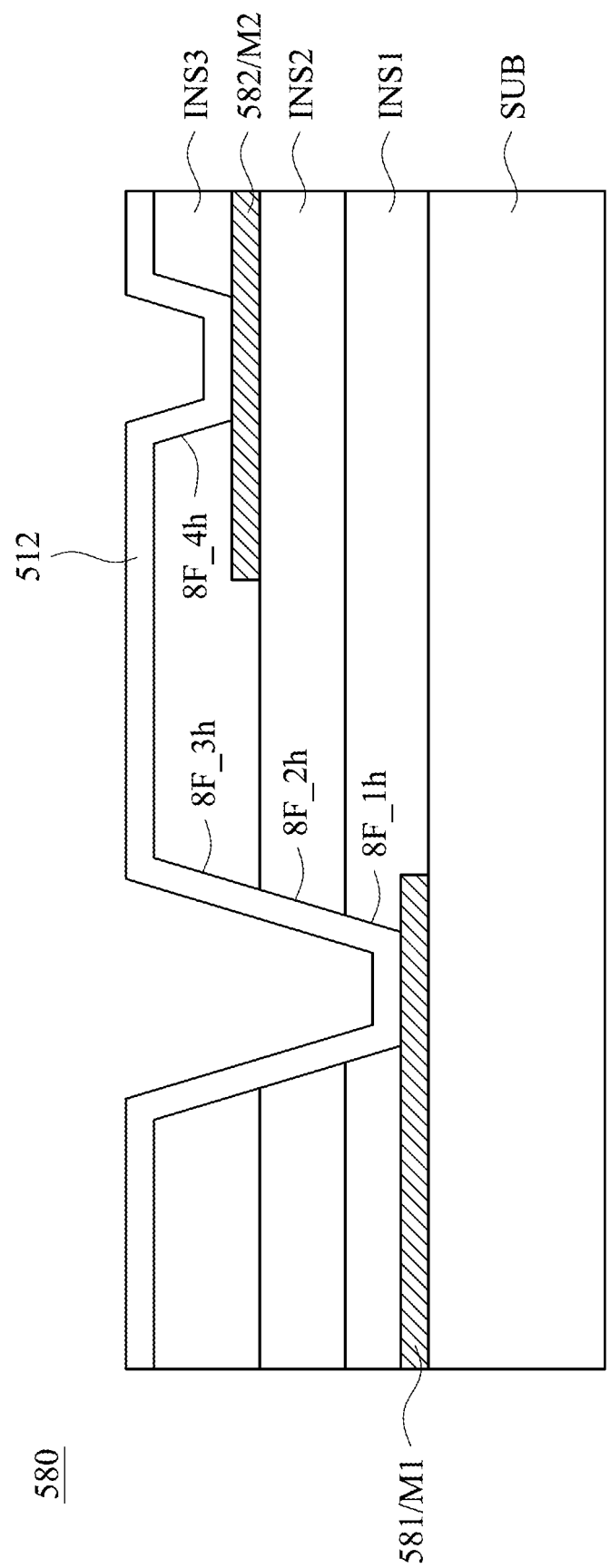

FIG. 8D and FIG. 8E can be applied to the embodiment of FIG. 5J, but FIG. 5K and FIG. 5L may have their respective connection structure. For example, referring to FIG. 8F, a connection structure 580 can be applied to the structure of FIG. 5K. To be specific, the first part 581 is formed on the first substrate SUB. The first insulation layer INS1 is formed on the first metal layer M1, and includes a first opening 8F_1h to expose the first part 581. The second insulation layer INS2 is formed on the first insulation layer INS1, and includes a second opening 8F_2h corresponding to the first opening 8F_1h. The second part 582 is formed on the second insulation layer INS2. The third insulation layer INS3 is formed on the second metal layer M2, and includes a third opening 8F_3h corresponding to the second opening 8F_2h, and a fourth opening 8F_4h exposing the second part 582. The second transparent conductive layer 512 is formed on the third insulation layer INS3, and is electrically connected to the second part 582 through the fourth opening 8F_4h, and is electrically connected to the first part 581 through the third opening 8F_3h, second opening 8F_2h and first opening 8F_1h.

Figure 8G:
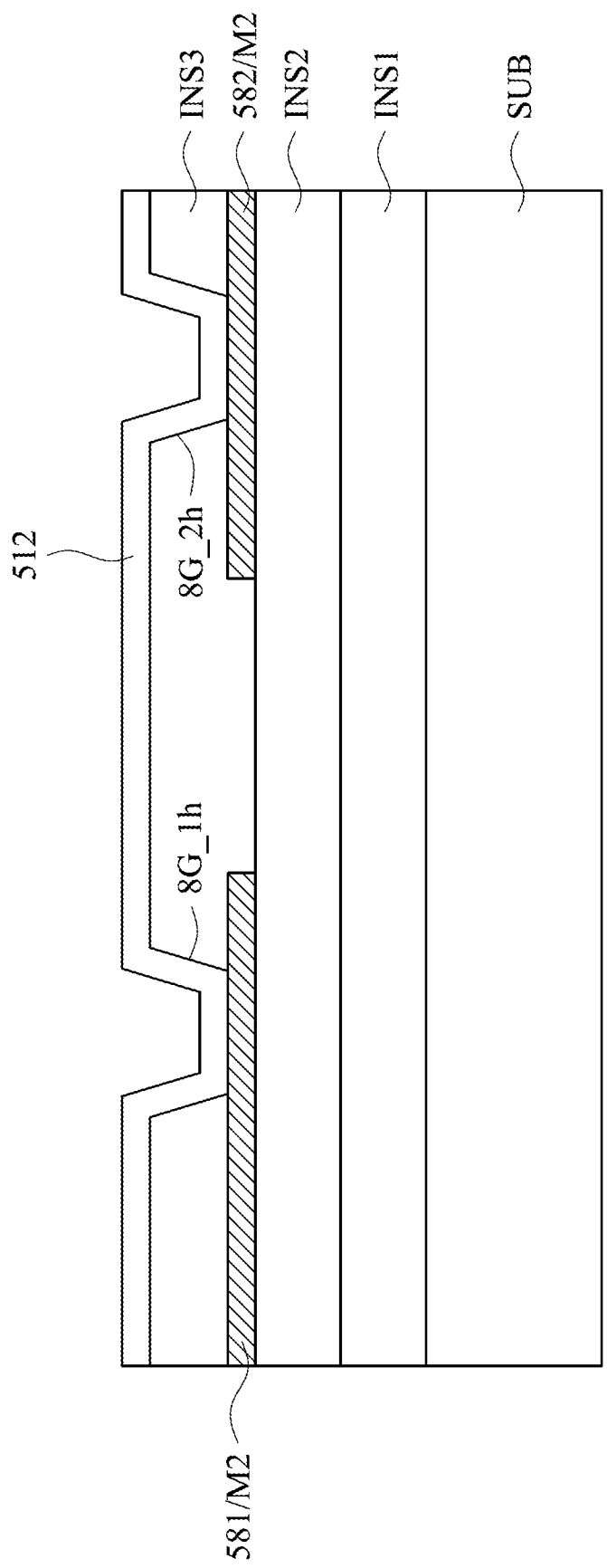

Referring to FIG. 8G which can be also applied to FIG. 5K, in which the first part 581 is formed in the second metal layer. To be specific, the first insulation layer INS1, the second insulation layer INS2 and the second metal layer M2 are sequentially formed on the first substrate SUB. The first opening 8G_1h exposes the first part 581, and the second opening 8G_2h exposes the second part 582. The transparent conductive layer 512 is electrically connected to the first part 581 through the first opening 8G_1h, and is electrically connected to the second part 582 through the second opening 8G_2h.

Figure 8H:
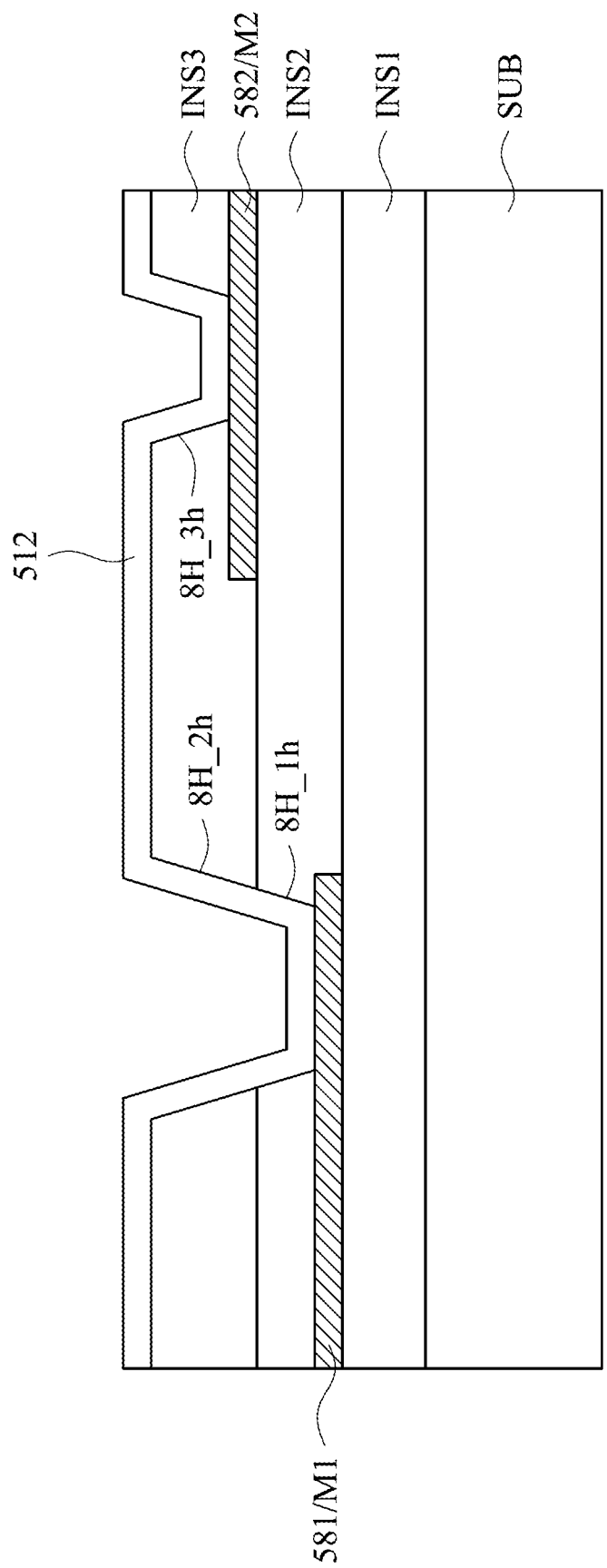
Figure 8I:
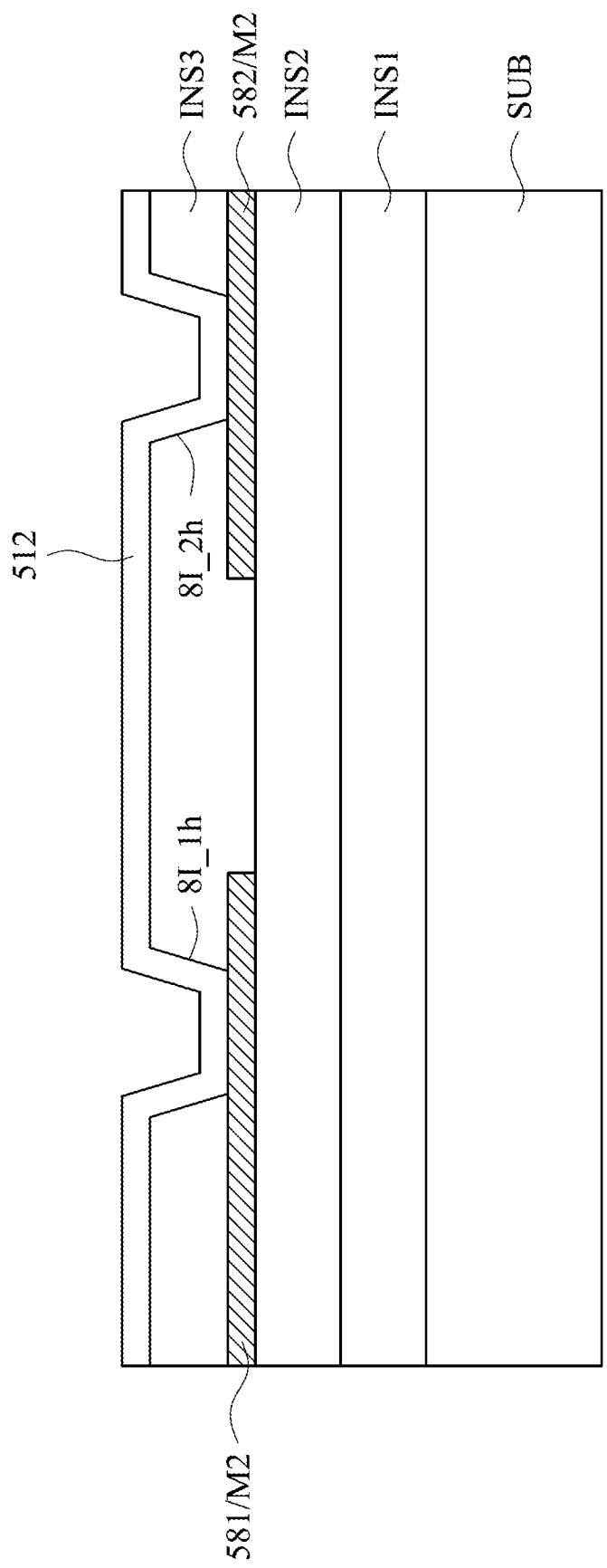

Moreover, FIG. 8H and FIG. 8I can be applied to the structure of FIG. 5L. In FIG. 8H, the first metal layer M1 is formed on the first insulation layer INS1. The second insulation layer INS2 includes a first opening 8H_1h to expose the first part 581. The second insulation layer INS2 includes a second opening 8H_2h corresponding to the first opening 8H_1h, and a third opening 8H_3h to expose the second part 582. The transparent conductive layer 512 is electrically connected to the second part 582 through the third opening 8H_3h, and is electrically connected to the first part 581 through the second opening 8H_2h and the first opening 8H_1h. In FIG. 8I, the first part 581 and the second part 582 are both formed in the second metal layer M2. The third insulation layer INS3 includes a first opening 8I_1h to expose the first part 581, and a second opening 8I_2h to expose the second part 582. The transparent conductive layer 512 is electrically connected to the first part 581 through the first opening 8I_1h, and is electrically connected to the second part 582 through the second opening 8I_2h.

From another aspect, in the embodiments of FIG. 8A to FIG. 8I, the connection structure includes the first part, the second part, more than one insulation layers and a transparent conductive layer. The insulation layers include more than one opening to expose the first part and the second part, and the transparent conductive layer is electrically connected to the first part and the second part through the openings.

Referring to FIG. 6, in the embodiment of FIG. 6, the touch sensing line 432 includes a first part 611 and a second part 612. The second part 612 is formed in the third metal layer, but the first part 611 may be formed in the first metal layer, the second metal layer or the third metal layer. A connection structure 610 is disposed in the non-display area 102 for coupling the first part 611 to the second part 612. Multiple embodiments are provided below to describe the connection structure 610.

Figure 9A:
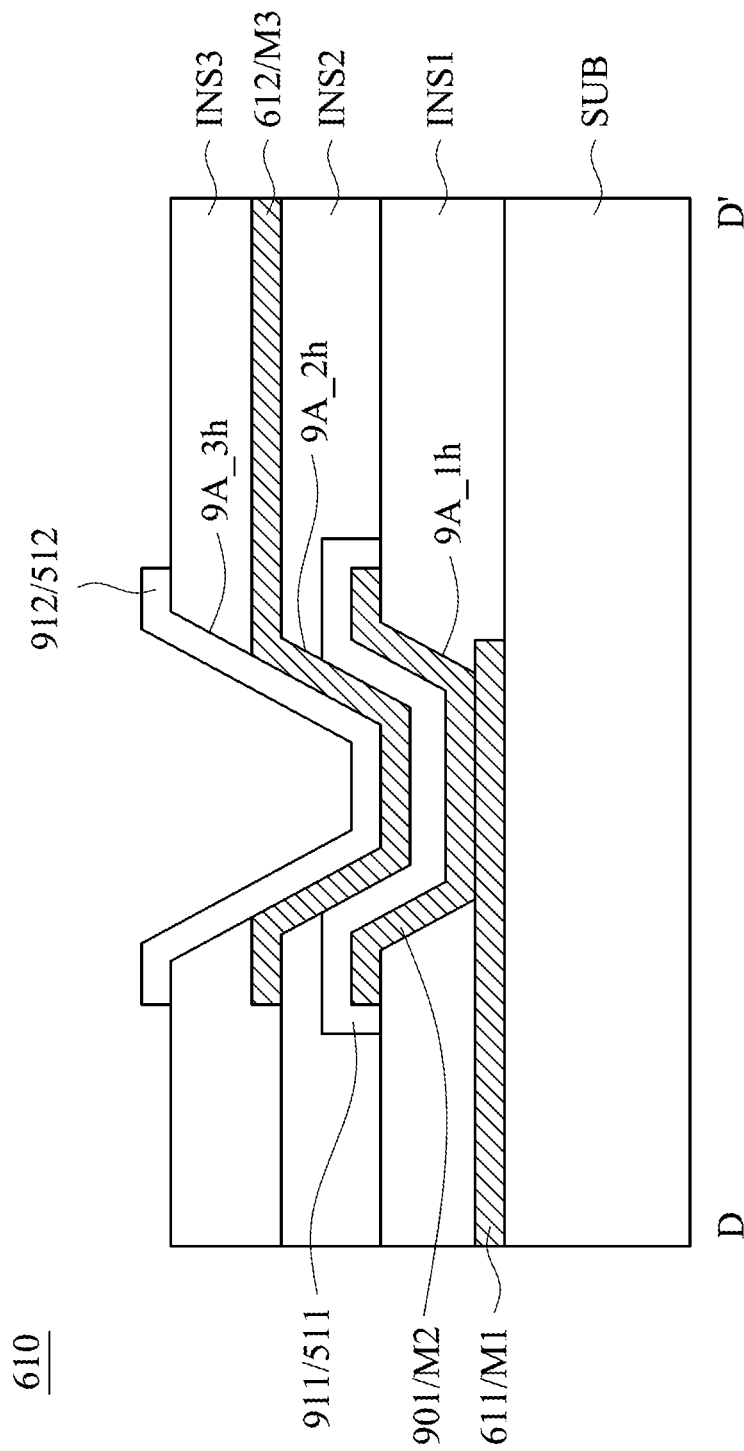
FIG. 9A to FIG. 9C are cross-sectional views of connection structure 610 along a cross-sectional line DD' of FIG. 6.

Referring to FIG. 6 and FIG. 9A, FIG. 9A is a diagram illustrating a cross-sectional view of the connection structure 610 along a cross-sectional line DD' of FIG. 6. In the embodiment of FIG. 9A, the first part 611 is formed in the first metal layer M1. To be specific, the first part 611 of the first metal layer M1 is formed on the substrate SUB. The first insulation layer INS1 is formed on the first metal layer M1 and includes a first opening 9A_1h to expose the first part 611. A metal electrode 901 formed in the second metal layer M2 is electrically connected to the first part 611 through the first opening 9A_1h. The metal electrode 901 is not electrically connected to the data lines, the sources or the drains in the second metal layer M2. A first electrical connection part 911 formed in the first transparent conductive layer 511 is electrically connected to the metal electrode 901. The first electrical connection part 911 is not electrically connected to the pixel electrode or the common electrode in the first transparent conductive layer 511. The second insulation layer INS2 includes a second opening 9A_2h to expose the first electrical connection part 911. The second part 612 of the third metal layer M3 is formed on the second insulation layer INS2, and is electrically connected to the first electrical connection part 911 through the second opening 9A_2h. The third insulation layer INS3 includes a third opening 9A_3h to expose the second part 612. A second electrical connection part 912 formed in the second transparent conductive layer 512 is electrically connected to the second part 612 through the third opening 9A_3h. The second electrical connection part 912 is not electrically connected to the pixel electrode or the common electrode in the second transparent conductive layer 512. As a result, the second part 612 is electrically connected to the first part 611 through the first electrical connection part 911 and the metal electrode 901. The metal electrode 901 and the first electrical connection part 911 are used to avoid deep opening in the connection structure 610, and the second electrical connection part 912 is used to prevent the second part 612 from the erosion of subsequent processes.

Figure 9B:
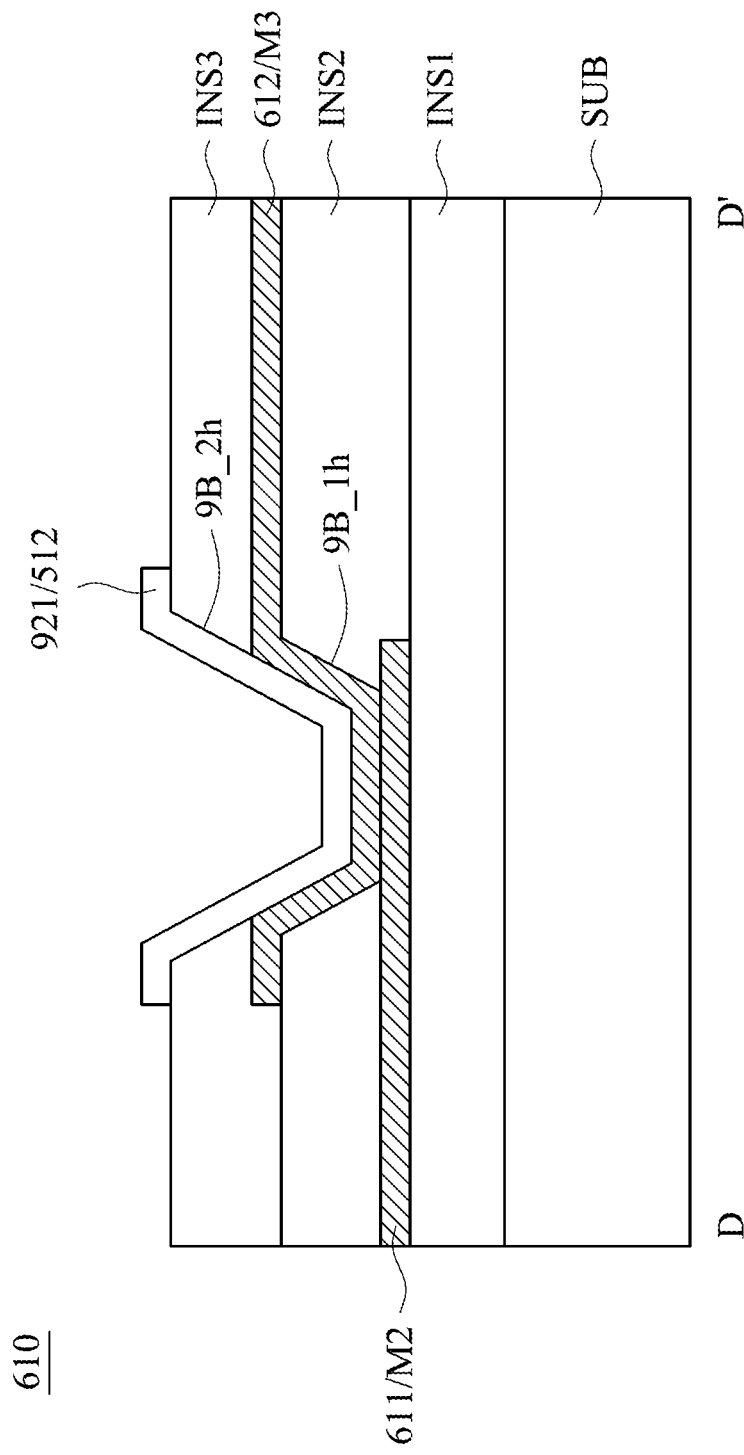

Referring to FIG. 6 and FIG. 9B, in the embodiment of FIG. 9B, the first part 611 is formed in the second metal layer M2. To be specific, the first insulation layer INS1 is formed on the substrate SUB. The first part 611 is formed on the first insulation layer INS1. The second insulation layer INS2 includes a first opening 9B_1h to expose the first part 611. The second part 612 is formed on the second insulation layer INS2, and is electrically connected to the first part 611 through the first opening 9B_1h. The third insulation layer INS3 includes a second opening 9B_2h to expose the second part 612. An electrical connection part 921 formed in the second transparent conductive layer 512 is electrically connected to the second part 612 through the second opening 9B_2h. The electrical connection part 921 is not electrically connected to the pixel electrode or the common electrode in the second transparent conductive layer 512. The electrical connection part 921 is used to prevent the second part 612 from the erosion of subsequent processes.

Figure 9C:
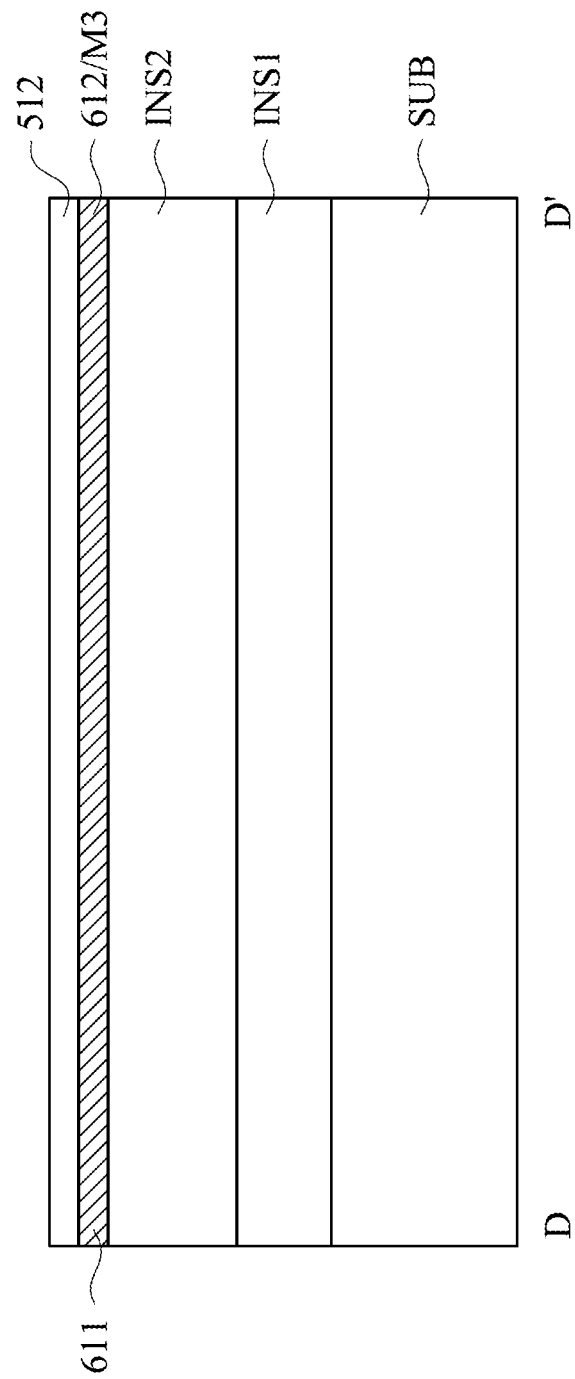

Referring to FIG. 6 and FIG. 9C, in the embodiment of FIG. 9C, the first part 611 and the second part 612 are formed in the third metal layer M3. As shown in FIG. 9C, the first insulation layer INS1, the second insulation layer INS2, the third metal layer M3 and the second transparent conductive layer 512 are sequentially formed on the substrate SUB. The second transparent conductive layer 512 is used to prevent the third metal layer M3 from the erosion of subsequent processes.

In addition, in some embodiments, the touch sensing lines are formed in the second metal layer in the display area, and therefore the connection structure 610 may be used to transfer the second metal layer to the first metal layer. For example, referring to FIG. 9D, the first part 611 is formed in the first metal layer M1 and on the first substrate SUB. The first insulation layer INS1 is formed on the first metal layer M1, and includes a first opening 9D_1h to expose the first part 611. The second part 612 is formed in the second metal layer M2 and on the first insulation layer INS1. The second part 612 is electrically connected to the first part 611 through the first opening 9D_1h.

Figure 9D:
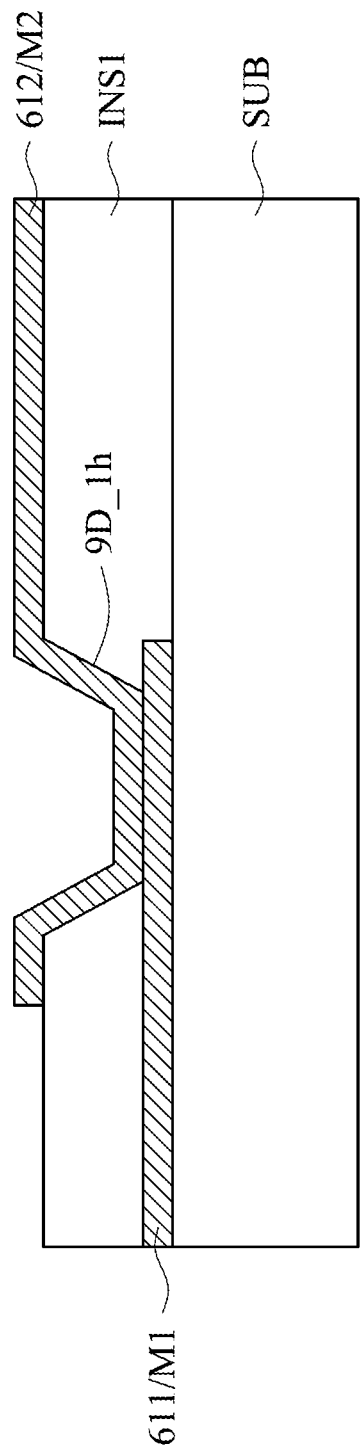
FIG. 9D to FIG. 9G are cross-sectional views of connection structure in accordance with an embodiment.
Figure 9E:
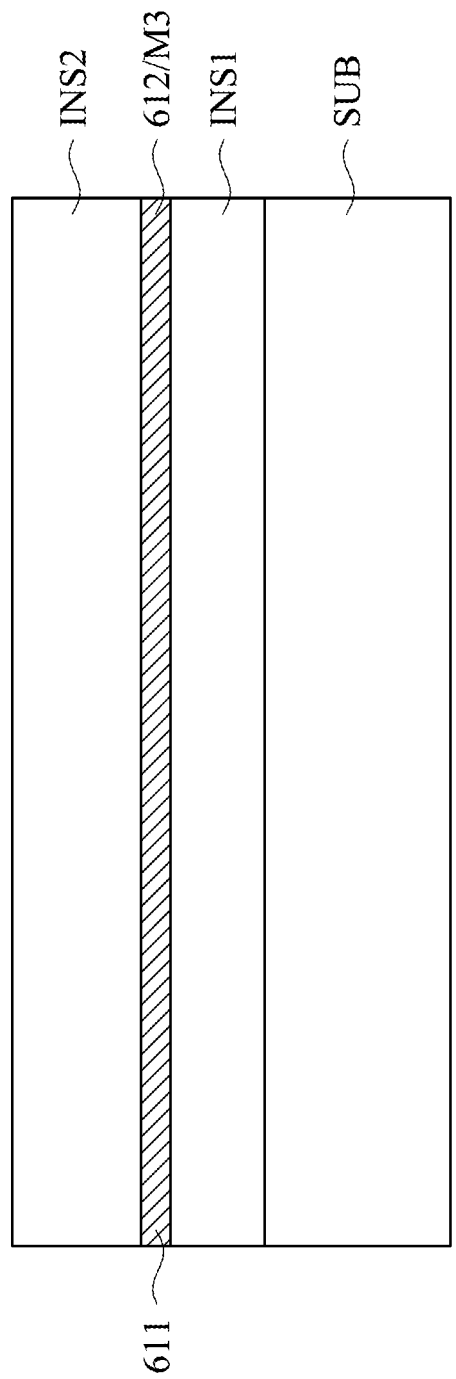

Referring to FIG. 9E, in the embodiment of FIG. 9E, the first part 611 and the second part 612 are both formed in the second metal layer M2. The first insulation layer INS1, second metal layer M2 and the second insulation layer INS2 are sequentially formed on the first substrate SUB.

Figure 9F:
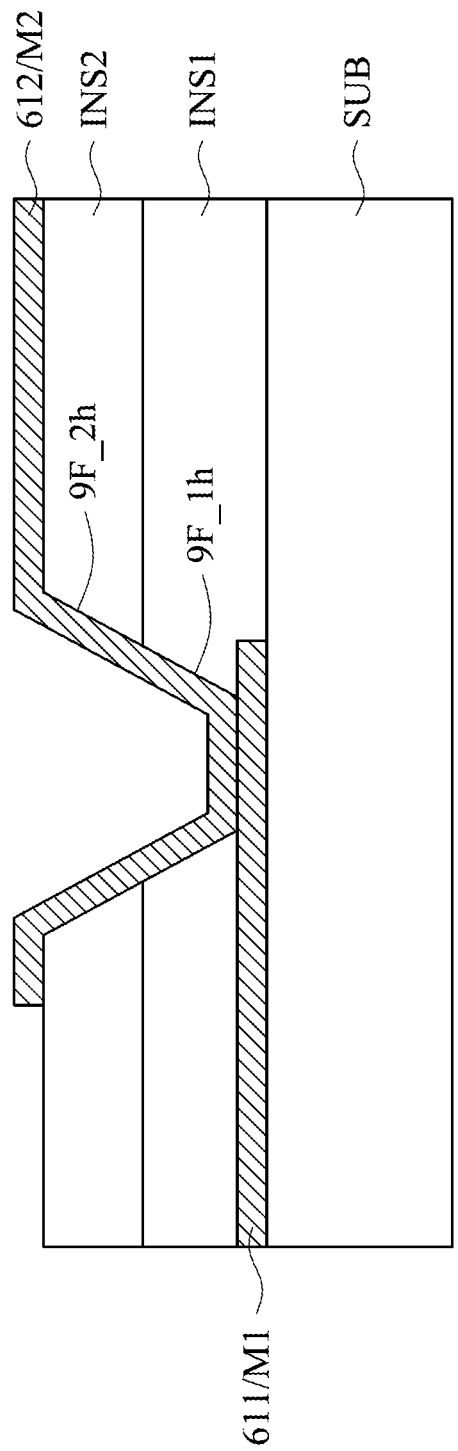
Figure 9G:
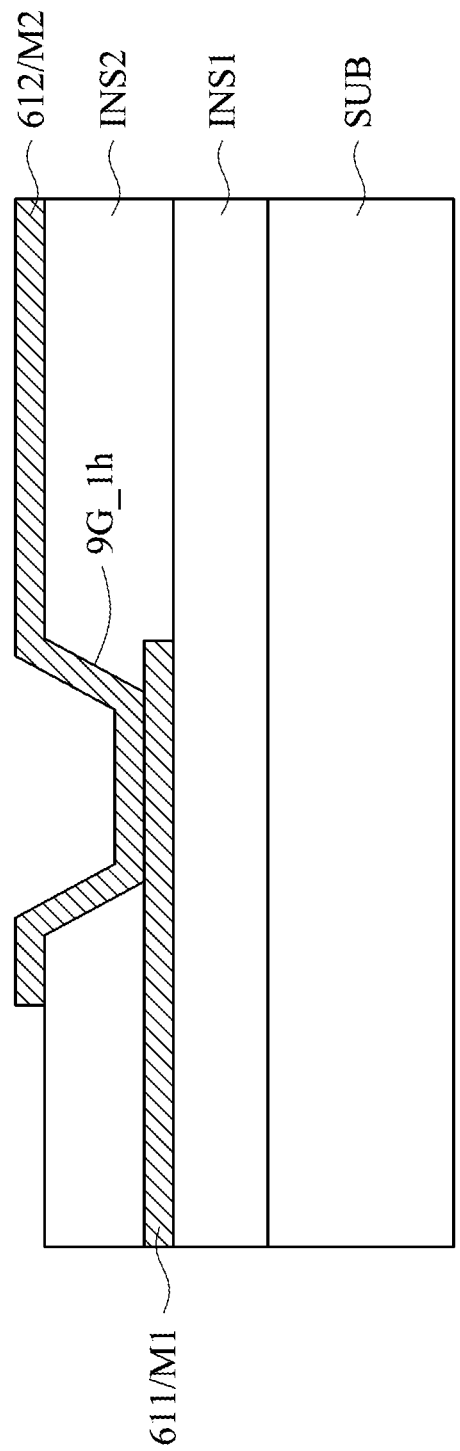

Embodiments of FIG. 9D and FIG. 9E can be applied to the structure of FIG. 5J, but FIG. 5L and FIG. 5K may have respective connection structures. For example, referring to FIG. 9F which can be applied to the structure of FIG. 5L, the first part 611 is formed in the first metal layer M1, and on the first substrate SUB. The first insulation layer INS1 is formed on the first metal layer M1, and includes a first opening 9F_1h to expose the first part 611. The second insulation layer INS2 includes a second opening 9F_2h corresponding to the first opening 9F_1h. The second part 612 is formed in the second metal layer, and is electrically connected to the first part 611 through the second opening 9F_2h and the first opening 9F_1h. On the other hand, FIG. 9G can be applied to the structure of FIG. 5K. In FIG. 9G, the first metal layer M1 is formed on the first insulation layer INS1. The second insulation layer INS2 is formed on the first metal layer M1, includes a first opening 9G_1h to expose the first part 611. The second part 612 is formed in the second metal layer M2, and is electrically connected to the first part 611 through the first opening 9G_1h.

In the embodiment of FIG. 6, a connection structure 620 is disposed on the data line 431. The connection structure 620 is used to transfer the data line 431 to the first metal layer M1 or the third metal layer M3, or keeps the data line 431 in second metal layer M2. People in the art should be able to implement the connection structure 620 according to the disclosure of the connection structure 610. The data line 431 and the touch sensing line 432 may belong to different metal layers due to the connection structures 610 and 620.

Referring to FIG. 4A and FIG. 6, the connection structure 440 is used in FIG. 4A, and the connection structure 610 is used in FIG. 6 in the embodiments described above, but the invention is not limited thereto. The connection structure 440 may also be applied to the embodiment of FIG. 6, and the connection structure 610 may be applied to the embodiment of FIG. 4A. On the other hand, the pixel electrode may be disposed above the common electrode, and vice versa. The touch sensing lines may be formed in the third metal layer or the second metal layer. In other words, there are four options in these embodiments: whether the touch sensing line is formed in the third metal layer or the second metal layer; whether the touch sensing line 432 covers the data line 431; whether the pixel electrode is above the common electrode; and whether the connection structure 440 or the connection structure 610 is used. These four options can be arbitrarily chosen. In addition, whether the data line 431 and the touch sensing line 432 are transferred to the first metal layer M1, the second metal layer M2 or the third metal layer M3 is not limited in the invention. In a preferred embodiment, the data line 431 and the touch sensing line 432 are formed in different metal layers in the non-display area 102, and thus the pitch between them could be reduced.

The signal line transfer area 103 exists in the embodiments above, and the connection structure therein is used to transfer the data lines/touch sensing lines to different metal layers. However, in some embodiments, if the resolution requirement of the panel is relatively lower, then the function of the connection structure may be implemented in the touch pads and/or display pads.

The self-conductive capacitance is used for sensing in the in-cell touch display panel in the specification. That is, a transmitter (TX) sensing signal and a receiver (RC) sensing signal is transmitted to the touch electrodes and the touch pads through the touch sensing lines. The metal layer in the specification may be a single layer of metal including aluminum, copper, titanium, tungsten, etc. or a composite metal layer including molybdenum/aluminum/molybdenum, titanium/aluminum titanium, titanium/copper/titanium, which is not limited in the invention. On the other hand, the insulation layer in the specification may be silicon nitride, silicon oxide, silicon oxynitride or other suitable insulation layer. In addition, a single insulation layer in the figures may include more than one stacked insulation layers with different material. Moreover, some of the contact holes or openings have vertical sidewalls, and some of the contact holes or openings have tapered sidewalls, but it should be appreciated that all contact holes of openings have tapered sidewalls in practice. The figures are just for schematic illustration. When "contact hole to expose" is described, it means to partially expose the component beneath or to completely expose the component beneath, which is not limited in the invention.

Figure 10A:
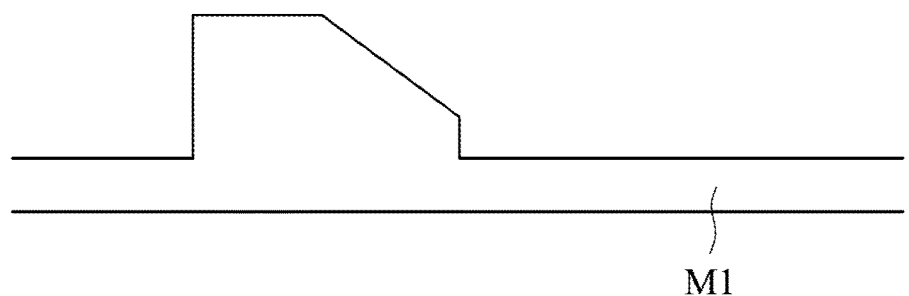
FIG. 10A to FIG. 10G is top views of intermediary stages for manufacturing pixel stricture in accordance with an embodiment.
Figure 10B:
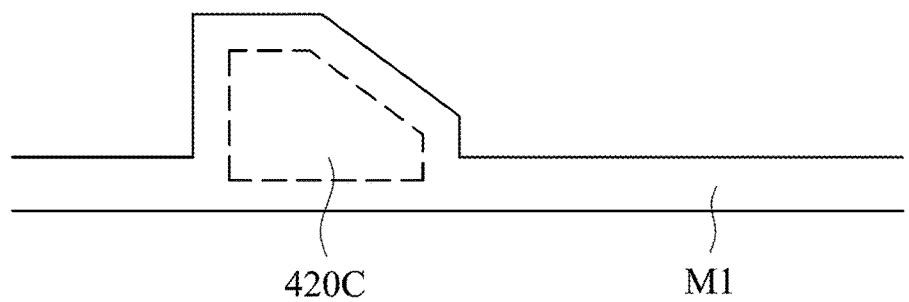

Herein, examples are provided to describe the method for manufacturing the in-cell touch display panel. FIG. 10A to FIG. 10G is top views of intermediary stages for manufacturing pixel stricture in accordance with an embodiment. Referring to FIG. 4A, FIG. 5A and FIG. 10A, the first metal layer M1 is first formed. Referring to FIG. 4A, FIG. 5A and FIG. 10B, the first insulation layer INS1 (not shown in FIG. 4A and FIG. 10B) is formed on the first metal layer M1, and then the semiconductor layer 420C and ohmic contacts (not shown) on the semiconductor layer 420C are formed. The semiconductor layer 420C may be a-si, polysilicon, or metal oxide, which is not limited in the invention. The ohmic contacts may be N-type doped polysilicon or metal oxide with high conductivity for electrically connecting the semiconductor layer 420C and the subsequent second metal layer M2.

Figure 10C:
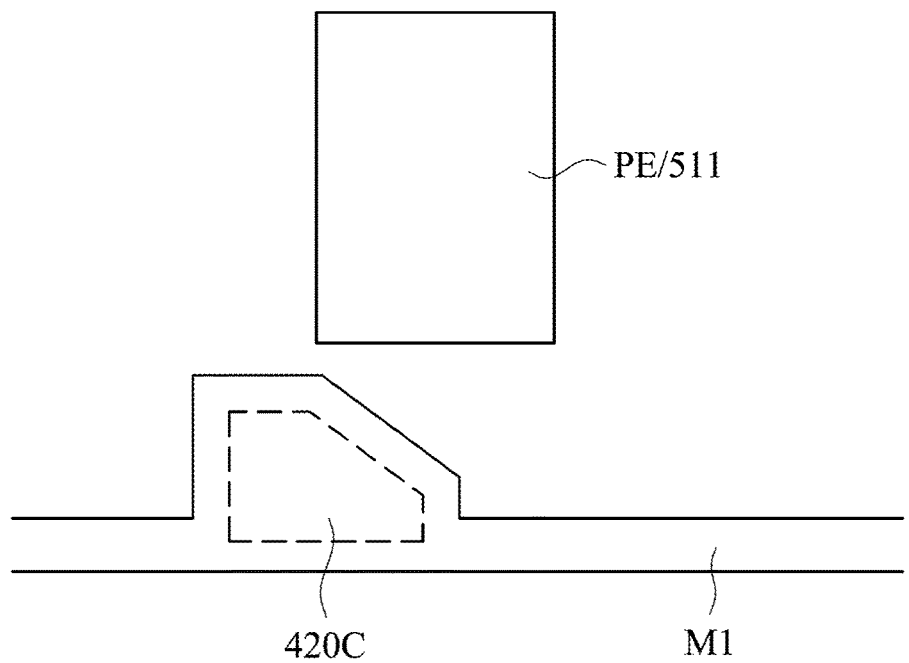

Referring to FIG. 4A, FIG. 5A and FIG. 10C, the first transparent conductive layer 511 is formed. The first transparent conductive layer 511 includes the pixel electrode PE. The first transparent conductive layer 511 may be indium tin oxide (ITO), indium zinc oxide (IZO), antimony tin oxide (ATO), fluorine tin oxide (FTO) or other conductive and transparent material.

Figure 10D:
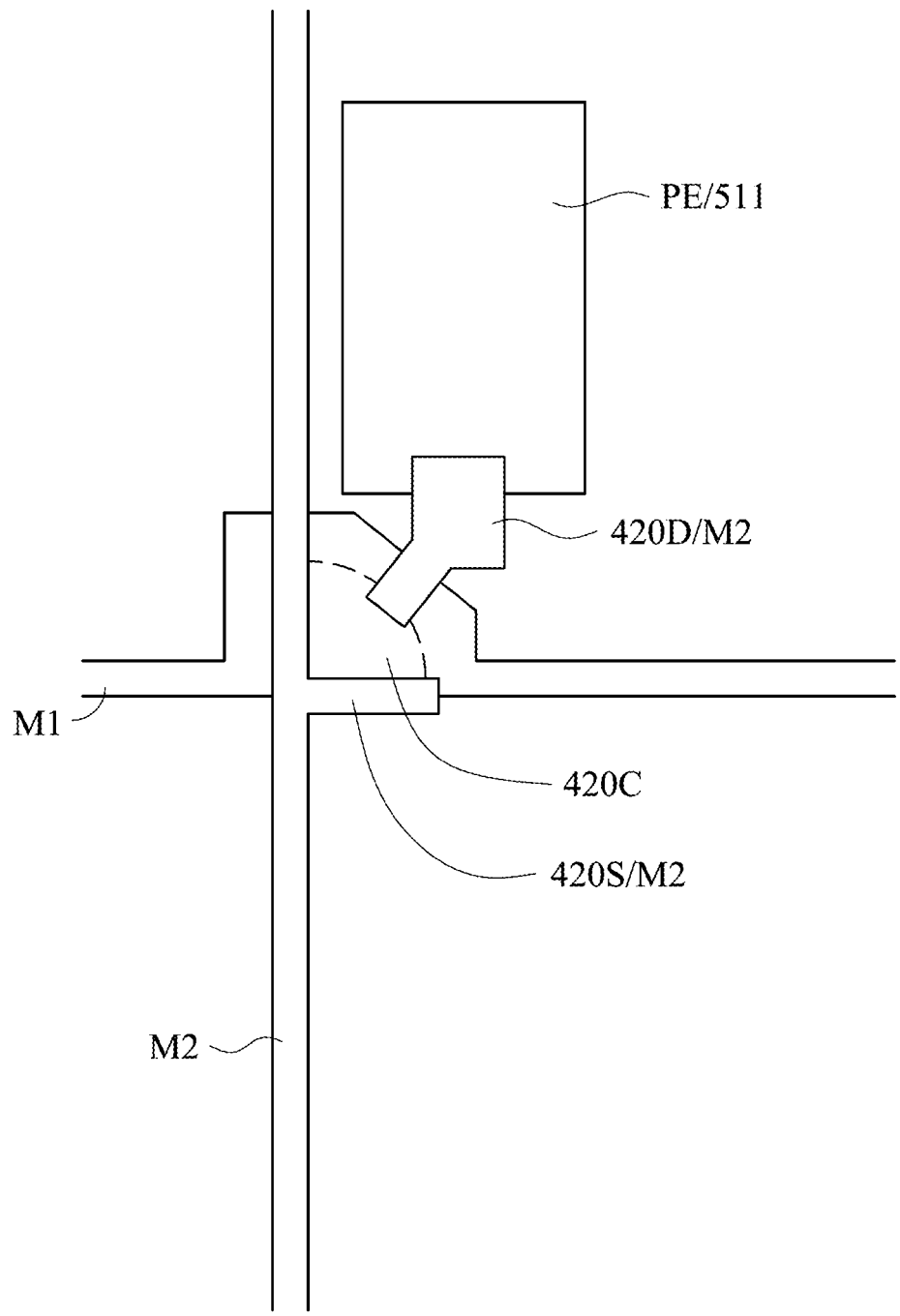

Referring to FIG. 4A, FIG. 5A and FIG. 10D, the second metal layer M2 is formed. The second metal layer M2 includes the drain 420D and the source 420S. Next, the second insulation layer INS2 is formed on the second metal layer M2 and the first transparent conductive layer 511. Because the second insulation layer INS2 covers the whole pixel structure, for simplification, it is not shown in FIG. 10D.

Figure 10E:
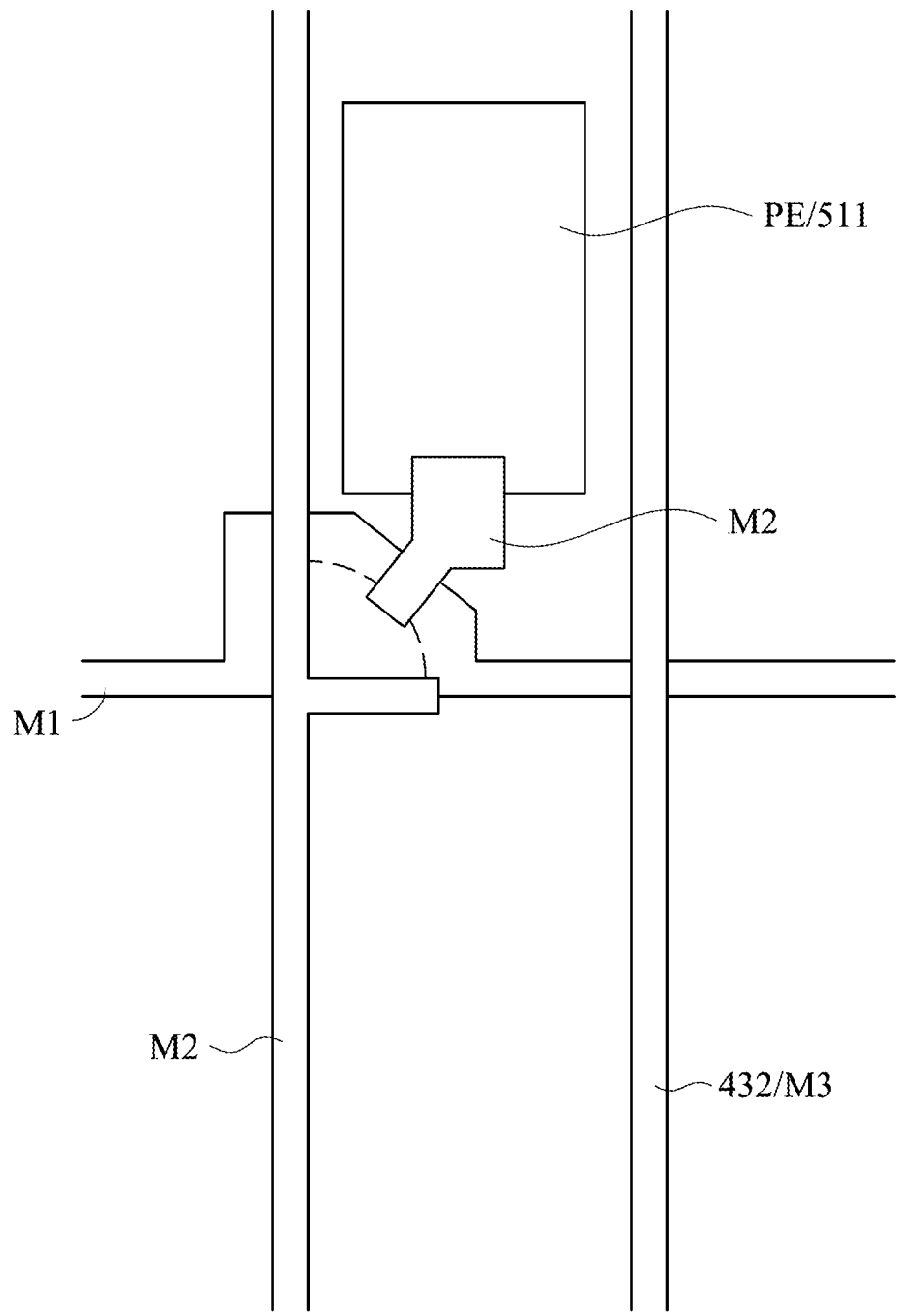

Referring to FIG. 4A, FIG. 5A and FIG. 10E, the third metal layer M3 is formed. The third metal layer M3 includes the touch sensing line 432.

Figure 10F:
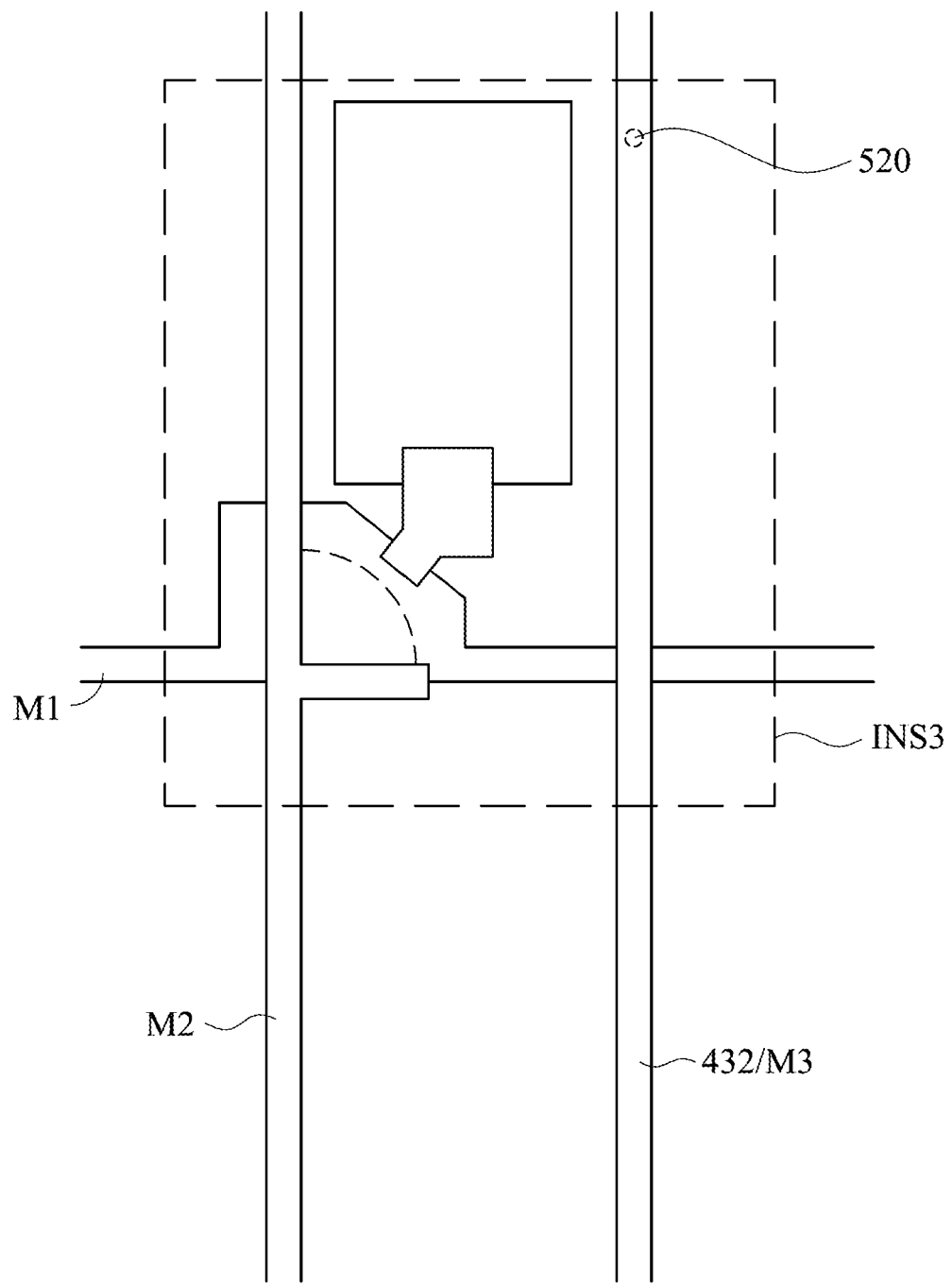

Next, referring to FIG. 4A, FIG. 5A and FIG. 10F, the third insulation layer INS3 is formed on the third metal layer M3. The third insulation layer INS3 includes a contact hole 520 for exposing part of the touch sensing line 432.

Figure 10G:
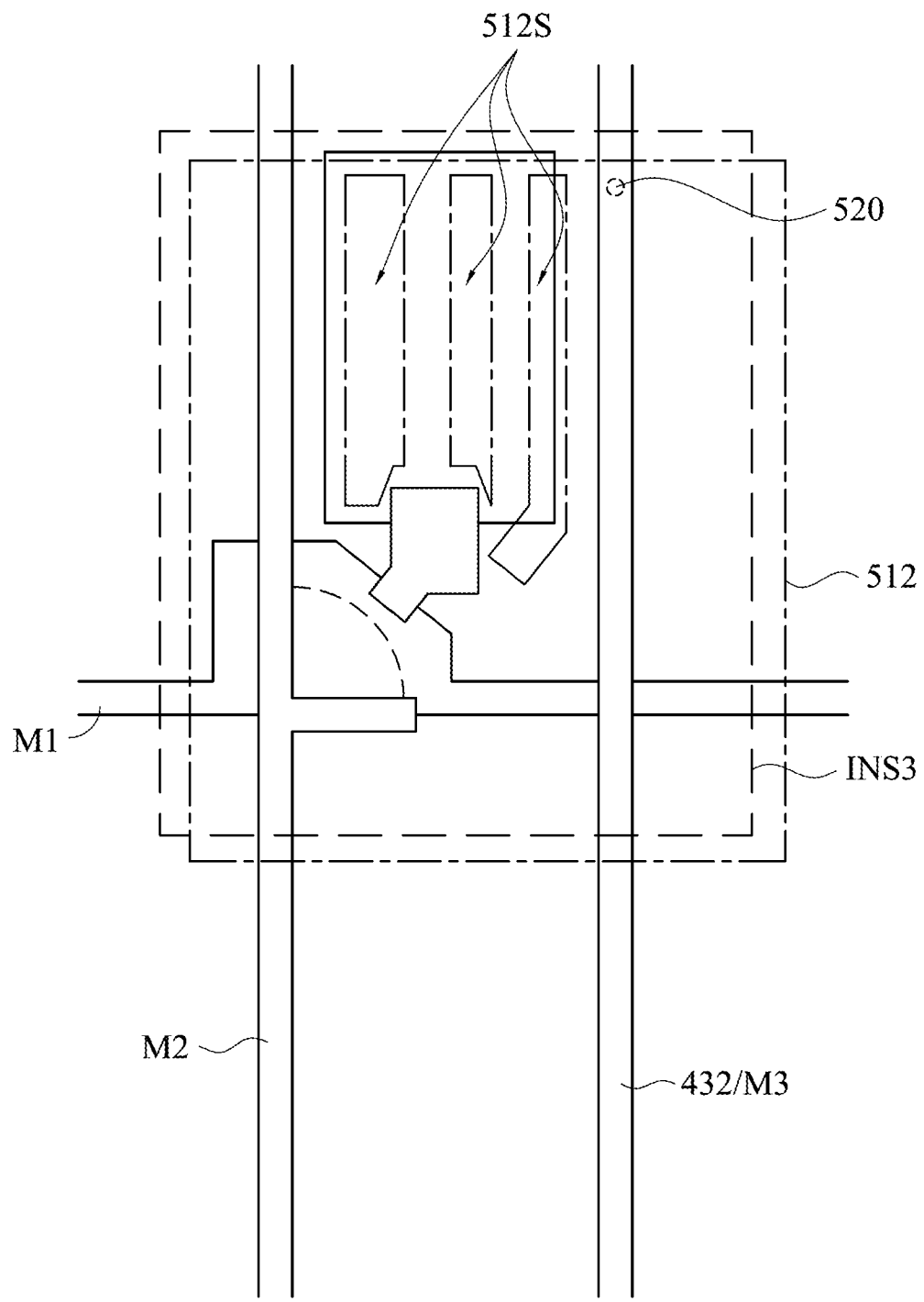

Referring to FIG. 4A, FIG. 5A and FIG. 10G, the second transparent conductive layer 512 is formed on the third insulation layer INS3. The second transparent conductive layer 512 is electrically connected to the touch sensing line 432 through the contact hole 520. The second transparent conductive layer 512 is taken as the sub-common electrode COM in the pixel structure, and it includes slits 512S. The second transparent conductive layer 512 may be indium tin oxide (ITO), indium zinc oxide (IZO), antimony tin oxide (ATO), fluorine tin oxide (FTO) or other conductive and transparent material.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An in-cell touch display panel having a display area and a non-display area, wherein the in-cell touch display panel comprises:
    a first substrate;
    a plurality of data lines disposed on the first substrate along a first direction;
    a plurality of gate lines disposed along a second direction, wherein an angle is formed between the first direction and the second direction;
    a plurality of touch sensing lines disposed on the first substrate and electrically insulated from the data lines and the gate lines, wherein the data lines and the touch sensing lines are formed in different metal layers in the display area;
    a plurality of pixel regions formed in the display area surrounded by the gate lines and the data lines intersecting with each other, wherein each of the pixel regions comprises a pixel structure, and each of the pixel structures comprises a pixel electrode;
    a common electrode comprising a plurality of touch electrodes, wherein each of the touch electrodes corresponds to more than one of the pixel electrodes, and each of the pixel electrodes corresponds to a sub-common electrode which is a part of the touch electrode;
    a plurality of thin film transistors (TFTs) formed in the pixel structures, wherein each of the thin film transistors comprises a gate, a source, a drain and a semiconductor layer;
    a second substrate, wherein a liquid crystal layer is formed between the first substrate and the second substrate; and
    a plurality of display pads and a plurality of touch pads, the display pads and the touch pads being disposed in the non-display area, wherein
    each of the touch electrodes is electrically connected to at least one of the touch sensing lines, and each of the touch sensing lines is electrically connected to one of the touch pads;
    each of the sources is electrically connected to one of the data lines, and each of the data lines is electrically connected to one of the display pads; and
    at least one of the display pads is disposed between two of the touch pads, and at least one of the touch pads is disposed between two of the display pads,
    wherein a number of the touch pads is less than a number of the display pads, the display pads and the touch pads are arranged as a plurality of rows, and one of the rows comprises at least part of the touch pads.

2. The in-cell touch display panel of claim 1, wherein the data lines are partially overlapped with the touch sensing lines along a normal vector of the first substrate in the display area.

3. The in-cell touch display panel of claim 1, further comprising:
    a first metal layer formed on the first substrate, wherein the first metal layer comprises the gates;
    a first insulation layer formed on the first metal layer;
    the semiconductor layer formed on the first insulation layer;
    a second metal layer formed on the semiconductor layer, wherein the second metal layer comprises the sources and the drains;
    a first transparent conductive layer formed on the first insulation layer, wherein the first transparent conductive layer comprises the pixel electrodes;

a second insulation layer formed on the second metal layer and on the first transparent conductive layer;

a third metal layer formed on the second insulation layer and comprising the touch sensing lines in the display area;

a third insulation layer formed on the third metal layer and having a contact hole to expose one of the touch sensing lines; and a second transparent conductive layer formed on the third insulation layer, wherein the second transparent conductive layer comprises the sub-common electrodes, wherein in the display area, one of the sub-common electrodes is electrically connected to the one of the touch sensing lines through the contact hole.

4. The in-cell touch display panel of claim 1, further comprising:

a first metal layer formed on the first substrate, wherein the first metal layer comprises the gates;

a first insulation layer formed on the first metal layer;

the semiconductor layer formed on the first insulation layer;

a second metal layer formed on the semiconductor layer, wherein the second metal layer comprises the sources and the drains;

a first transparent conductive layer formed on the first insulation layer, wherein the first transparent conductive layer comprises the sub-common electrodes;

a second insulation layer formed on the second metal layer and the first transparent conductive layer, and having a contact hole;

a third metal layer formed on the second insulation layer, wherein the touch sensing lines are formed in the third metal layer in the display area, and one of the sub-common electrodes is electrically connected to one of the touch sensing lines through the contact hole;

a third insulation layer formed on the second insulation layer and the third metal layer; and a second transparent conductive layer formed on the third insulation layer, wherein the second transparent conductive layer comprises the pixel electrodes.

5. The in-cell touch display panel of claim 1, further comprising:

a first metal layer formed on the first substrate, wherein the first metal layer comprises the gates;

a first insulation layer formed on the first metal layer;

the semiconductor layer formed on the first insulation layer;

a second metal layer formed on the semiconductor layer, wherein the second metal layer comprises the sources and the drains;

a second insulation layer formed on the second metal layer, wherein the second insulation layer has a first contact hole;

a first transparent conductive layer formed on the second insulation layer, wherein the first transparent conductive layer comprises the sub-common electrodes;

a third insulation layer formed on the first transparent conductive layer, and having a second contact hole and a third contact hole, wherein the second contact hole is corresponding to the first contact hole;

a third metal layer formed on the third insulation layer, wherein the touch sensing lines are formed in the third metal layer in the display area, and one of the touch sensing lines is electrically connected to one of the sub-common electrodes through the third contact hole; and a second transparent conductive layer formed on the third insulation layer, wherein the second transparent conductive layer comprises the pixel electrodes, and one of the pixel electrodes is electrically connected to one of the drains through the second contact hole and the first contact hole, wherein the second transparent conductive layer covers the touch sensing lines, and projections of one of the touch sensing lines and one of the data lines onto the first substrate at least partially overlap with each other.

6. The in-cell touch display panel of claim 1, wherein the non-display area comprises a signal line transfer area and a fan-out area, the signal line transfer area is located between the display area and the fan-out area, the touch pads and the display pads are disposed in the fan-out area, one of the touch sensing lines comprises a first part and a second part, the first part is formed in a first metal layer, the second part is formed in a third metal layer, and the in-cell touch display panel further comprises:

a connection structure disposed in the signal line transfer area and coupled to the first part and the second part, wherein the connection structure comprises:

the first part;

the second part;

a plurality of insulation layers having a plurality of openings to expose the first part and the second part; and a transparent conductive layer electrically connected to the first part and the second part through the openings.

* * * * *